(12) United States Patent
Kawazu et al.

(10) Patent No.: US 12,219,247 B2
(45) Date of Patent: Feb. 4, 2025

(54) IMAGING DEVICE, IMAGING SYSTEM, AND IMAGING METHOD

(71) Applicant: SONY SEMICONDUCTOR SOLUTIONS CORPORATION, Kanagawa (JP)

(72) Inventors: Naoki Kawazu, Kanagawa (JP); Keita Sasaki, Kanagawa (JP); Takumi Oka, Kanagawa (JP); Yuichi Motohashi, Tokyo (JP); Atsushi Suzuki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/337,651

(22) Filed: Jun. 20, 2023

(65) Prior Publication Data

US 2023/0336867 A1 Oct. 19, 2023

Related U.S. Application Data

(63) Continuation of application No. 17/735,612, filed on May 3, 2022, now Pat. No. 11,729,496, which is a
(Continued)

(30) Foreign Application Priority Data

Feb. 22, 2018 (JP) .................................. 2018-029771

(51) Int. Cl.
*H04N 23/65* (2023.01)
*H04N 23/70* (2023.01)
(Continued)

(52) U.S. Cl.
CPC ............ *H04N 23/65* (2023.01); *H04N 23/749* (2023.01); *H04N 25/683* (2023.01); *H04N 25/75* (2023.01); *H04N 25/79* (2023.01)

(58) Field of Classification Search
CPC . H03M 1/00–645; H04N 5/378; H04N 5/335; H04N 5/3745–37455;
(Continued)

(56) References Cited

U.S. PATENT DOCUMENTS 6,343,191 B1 1/2002 Watanabe
11,818,333 B2 * 11/2023 Sasaki .................... H04N 7/183
(Continued)

FOREIGN PATENT DOCUMENTS

CN 104115488 A 10/2014
CN 107078745 A 8/2017
(Continued)

OTHER PUBLICATIONS

International Search Report and Written Opinion of PCT Application No. PCT/JP2019/004036, issued on Apr. 23, 2019, 09 pages of English Translation and 08 pages of ISRWO.
(Continued)

*Primary Examiner* — Xi Wang
(74) *Attorney, Agent, or Firm* — CHIP LAW GROUP

(57) ABSTRACT

Provided is an imaging device that includes an imaging unit that performs an imaging operation, a data generator that generates first power supply voltage data corresponding to a first power supply voltage and a flag generation section that generates a flag signal for the first power supply voltage by comparing the first power supply voltage data and first reference data. The first power supply voltage is supplied to the imaging unit.

14 Claims, 36 Drawing Sheets

Related U.S. Application Data continuation of application No. 16/970,066, filed as application No. PCT/JP2019/004036 on Feb. 5, 2019, now Pat. No. 11,343,427.

(51) Int. Cl.
*H04N 25/683* (2023.01)
*H04N 25/75* (2023.01)
*H04N 25/79* (2023.01)

(58) Field of Classification Search
CPC ...... H04N 25/78; H04N 25/772; H04N 25/69; H04N 25/683; H04N 25/79; H04N 25/75; H04N 23/65
USPC .................................................. 341/155–172
See application file for complete search history.

(56) References Cited

U.S. PATENT DOCUMENTS

| | | |
|---|---|---|
| 2007/0035431 A1 | 2/2007 | Hurrell et al. |
| 2008/0197269 A1 | 8/2008 | Hagihara |
| 2011/0204461 A1* | 8/2011 | Lee .................. H01L 27/14647 257/E31.127 |
| 2014/0094993 A1 | 4/2014 | Johnson |
| 2016/0191069 A1 | 6/2016 | Gou et al. |
| 2019/0124284 A1* | 4/2019 | Kim ........................ H04N 25/76 |
| 2019/0297287 A1 | 9/2019 | Oka et al. |

FOREIGN PATENT DOCUMENTS

| | | |
|---|---|---|
| CN | 109155829 A | 1/2019 |
| EP | 3468169 A1 | 4/2019 |
| JP | 2000-122119 A | 4/2000 |
| JP | 2002-027196 A | 1/2002 |
| WO | 2017/209221 A1 | 12/2017 |

OTHER PUBLICATIONS

International Preliminary Report on Patentability of PCT Application No. PCT/JP2019/004036, issued on Sep. 3, 2020, 10 pages of English Translation and 06 pages of IPRP.
Notice of Allowance for U.S. Appl. No. 16/970,066, issued on Feb. 1, 2022, 17 pages.
Non-Final Office Action for U.S. Appl. No. 16/970,066, issued on Jul. 23, 2021, 18 pages.
Non-Final Office Action for U.S. Appl. No. 17/735,612, issued on Dec. 20, 2022, 18 pages.
Notice of Allowance for U.S. Appl. No. 17/735,612, issued on Mar. 29, 2023, 12 pages.

* cited by examiner

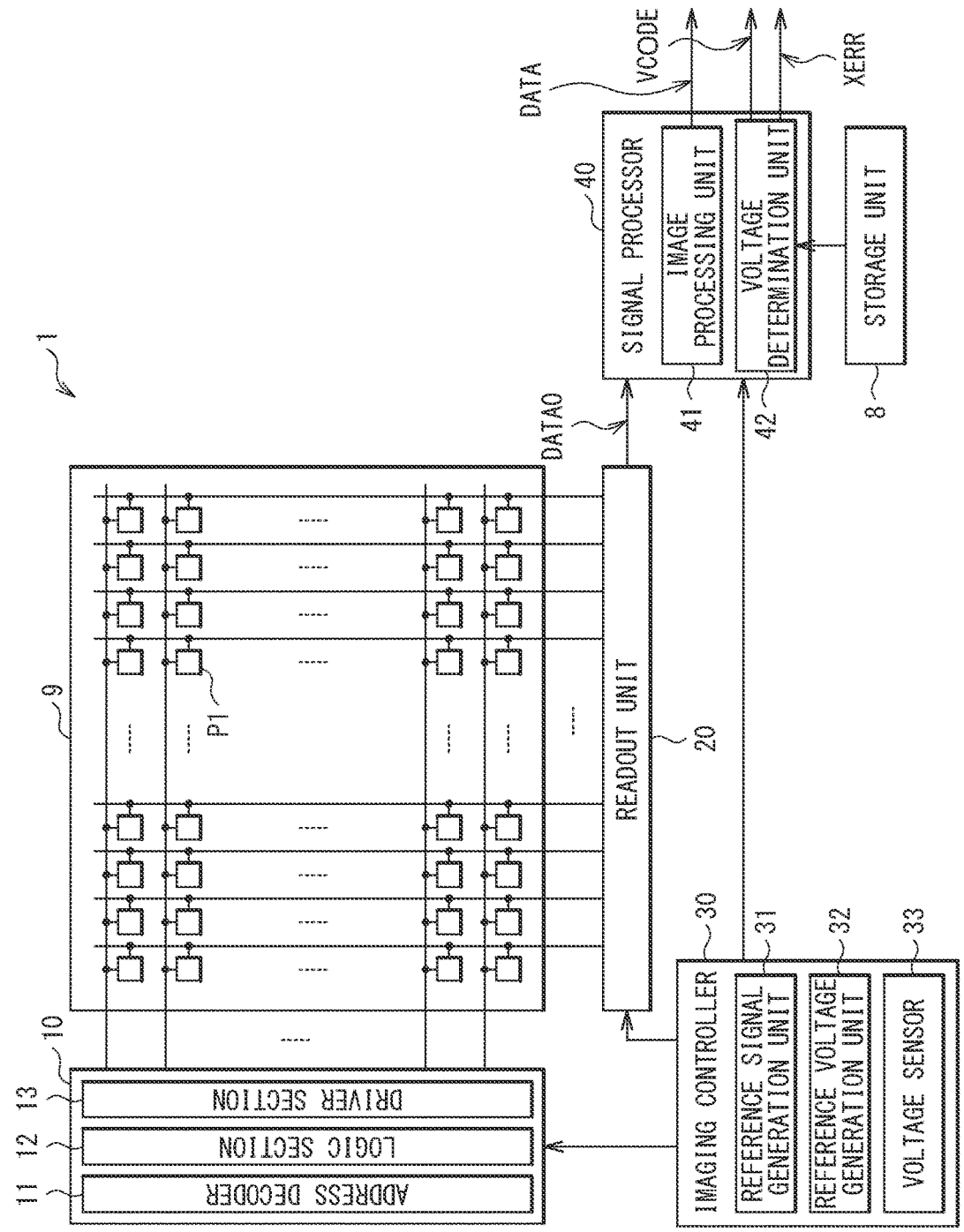
[FIG. 1]

[FIG. 2]
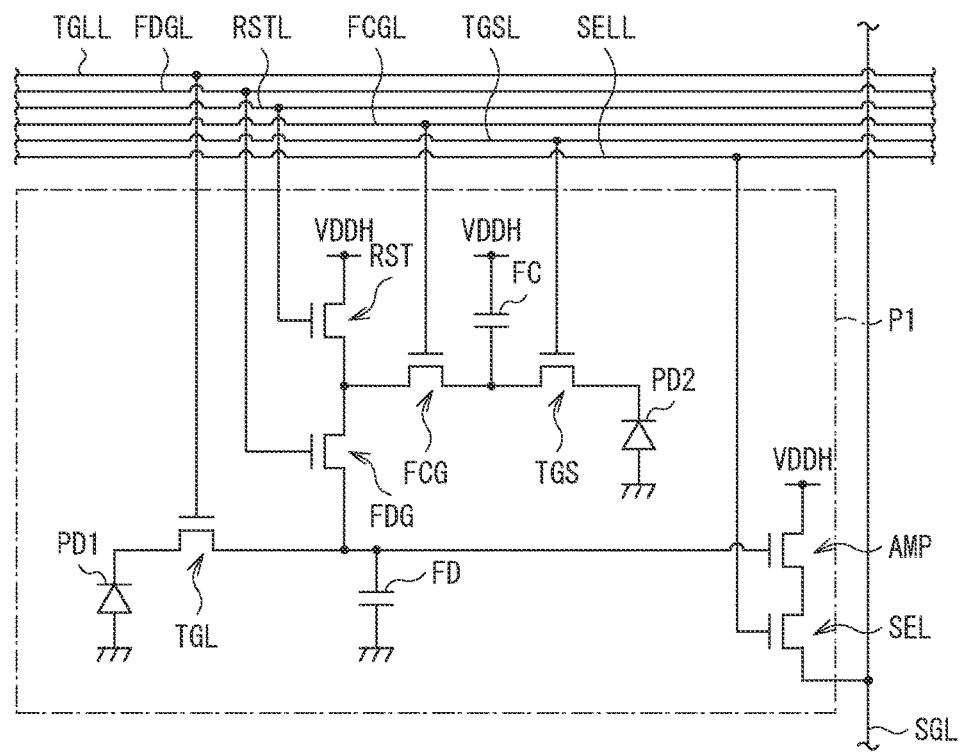
[FIG. 3]
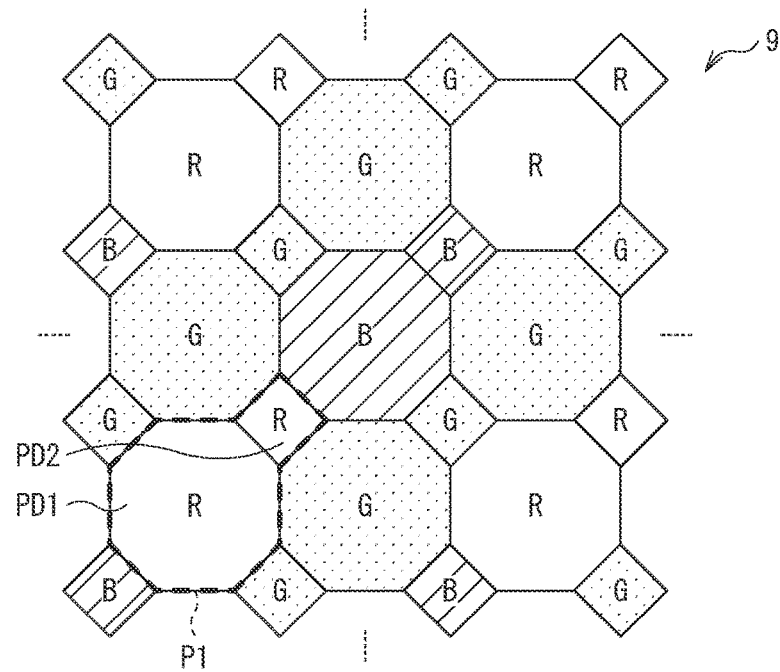

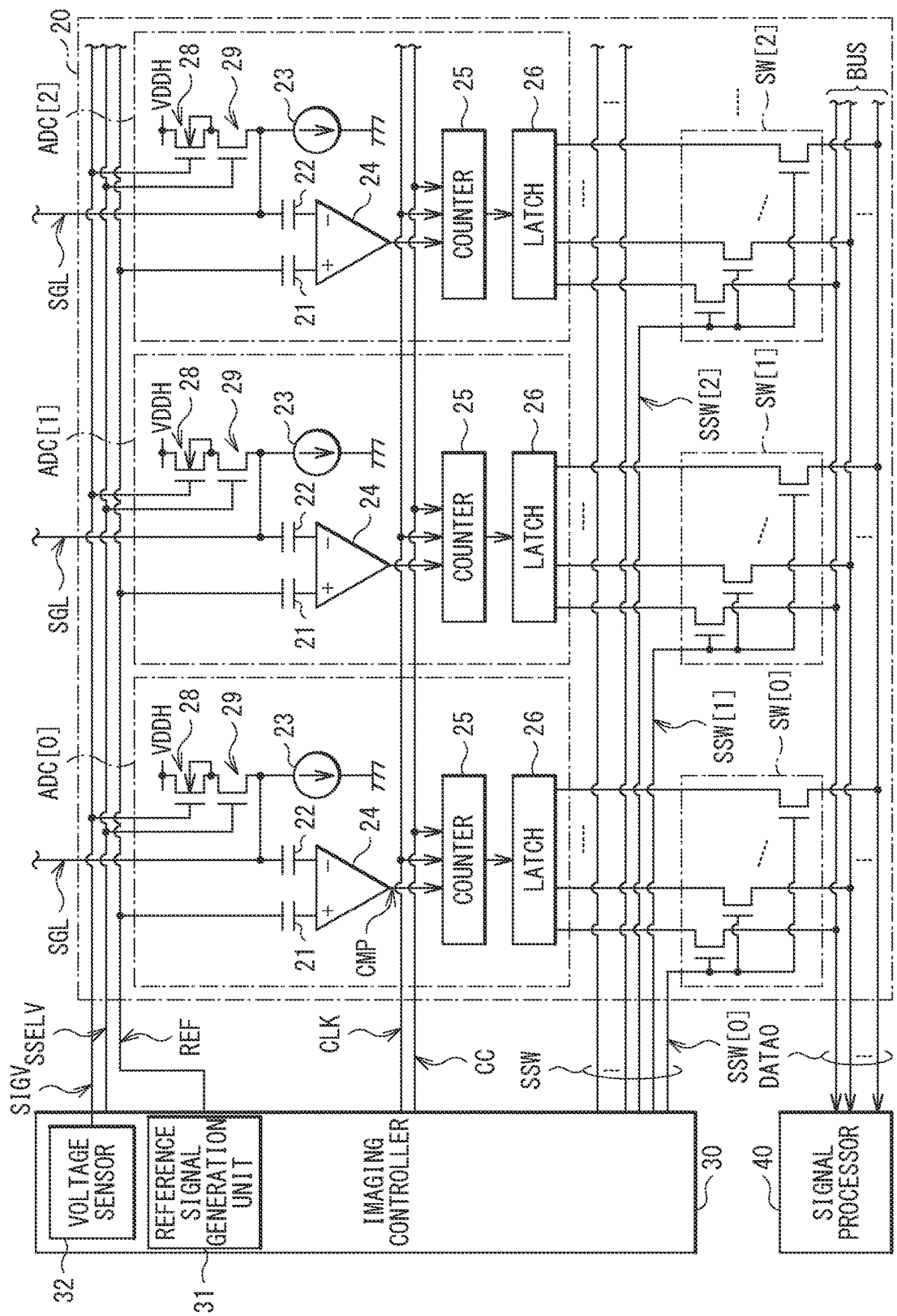
[FIG. 4]

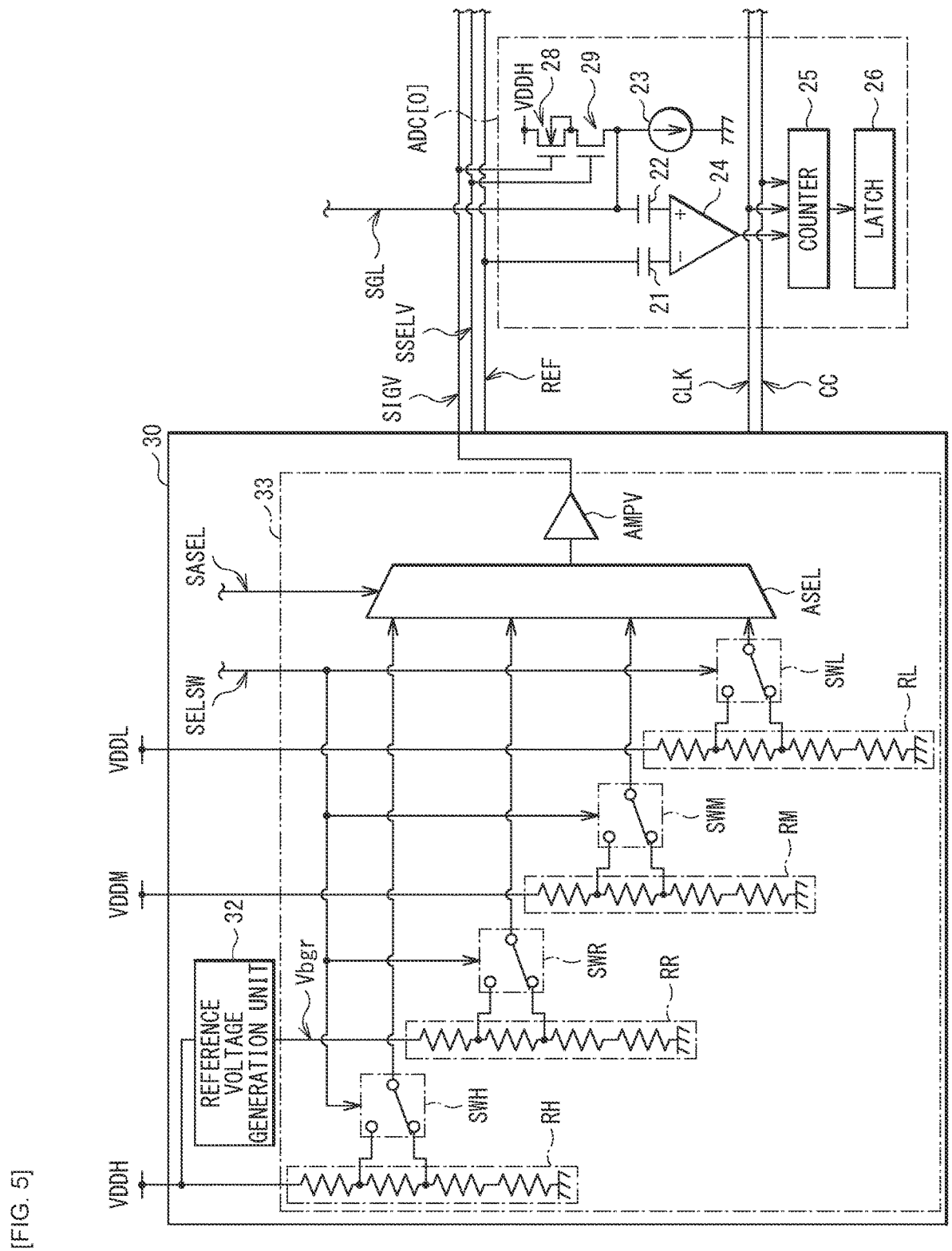
[FIG. 5]

[FIG. 6]
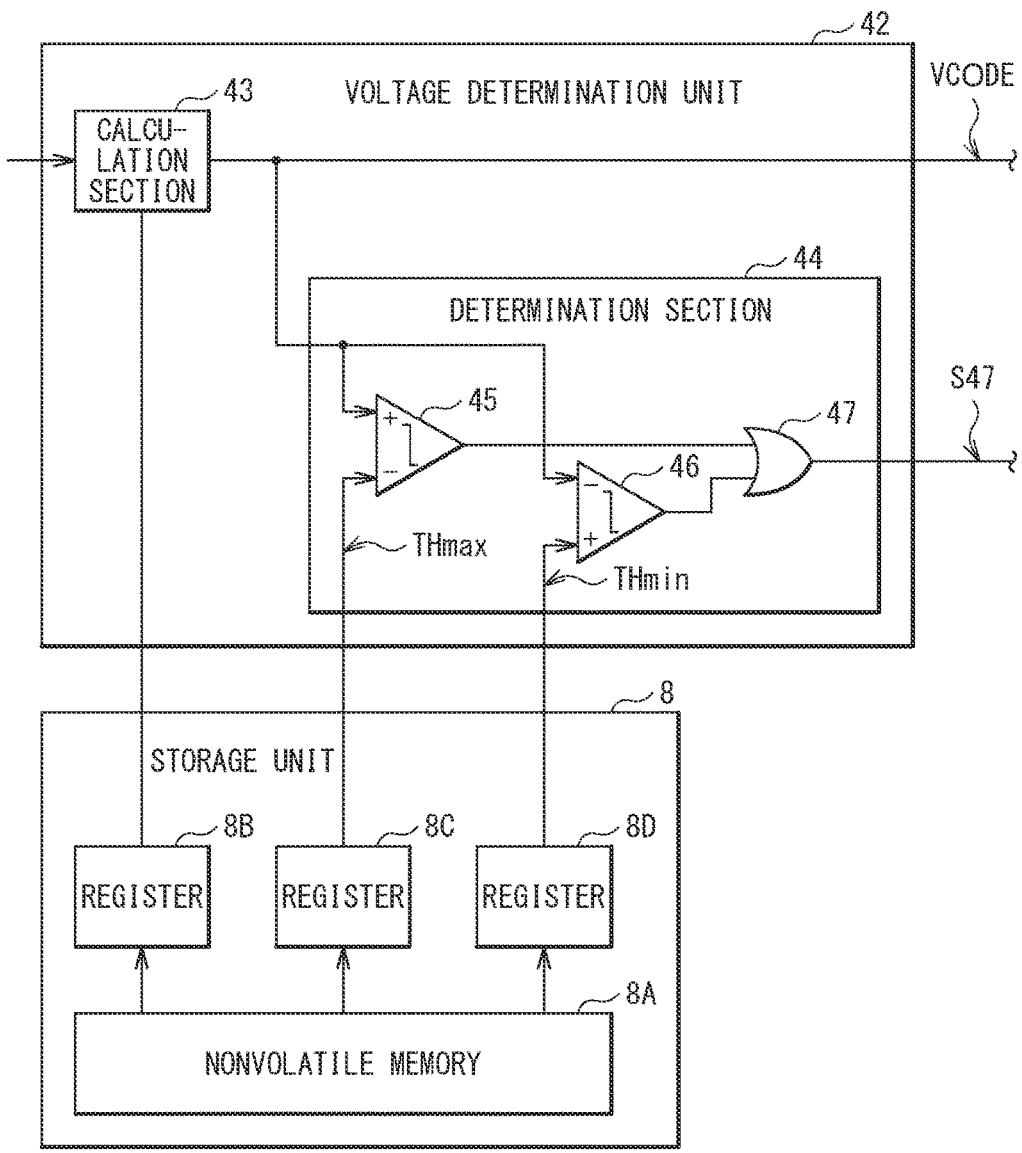

[FIG. 7]
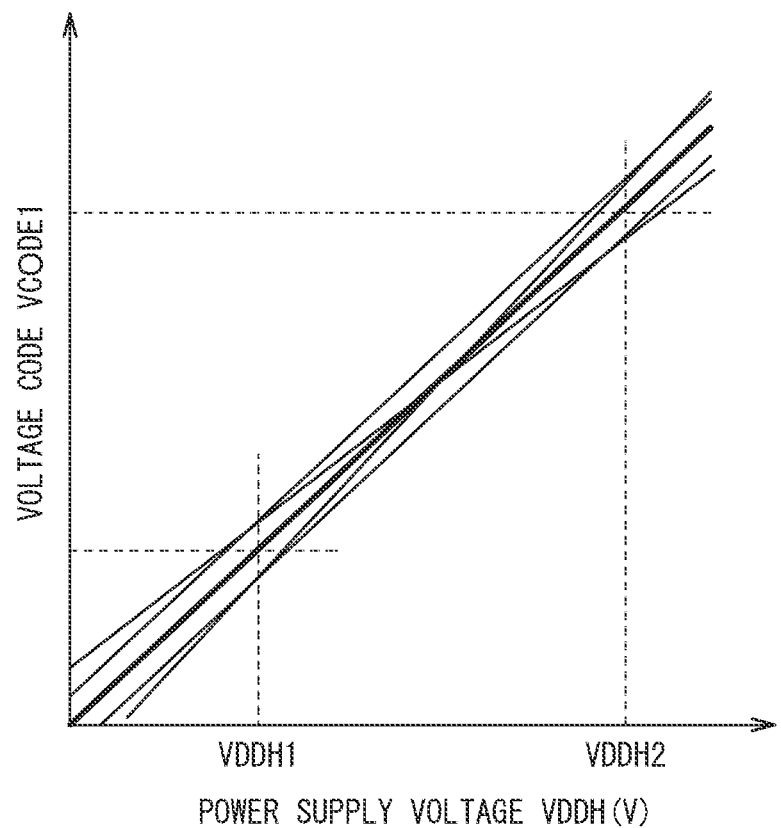
[FIG. 8A]
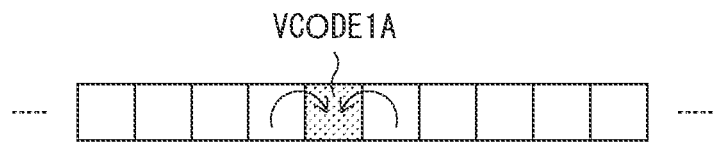
[FIG. 8B]
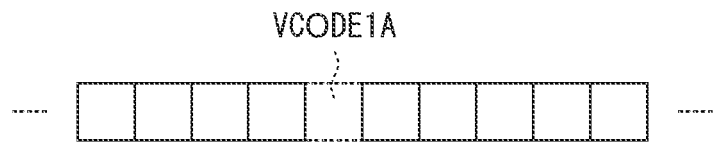

[FIG. 9]
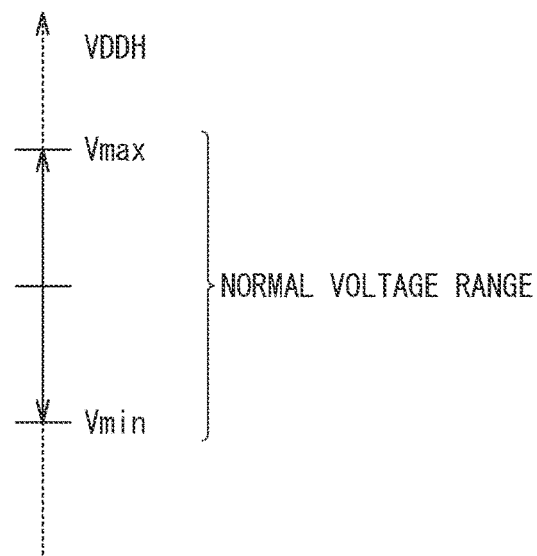
[FIG. 10]
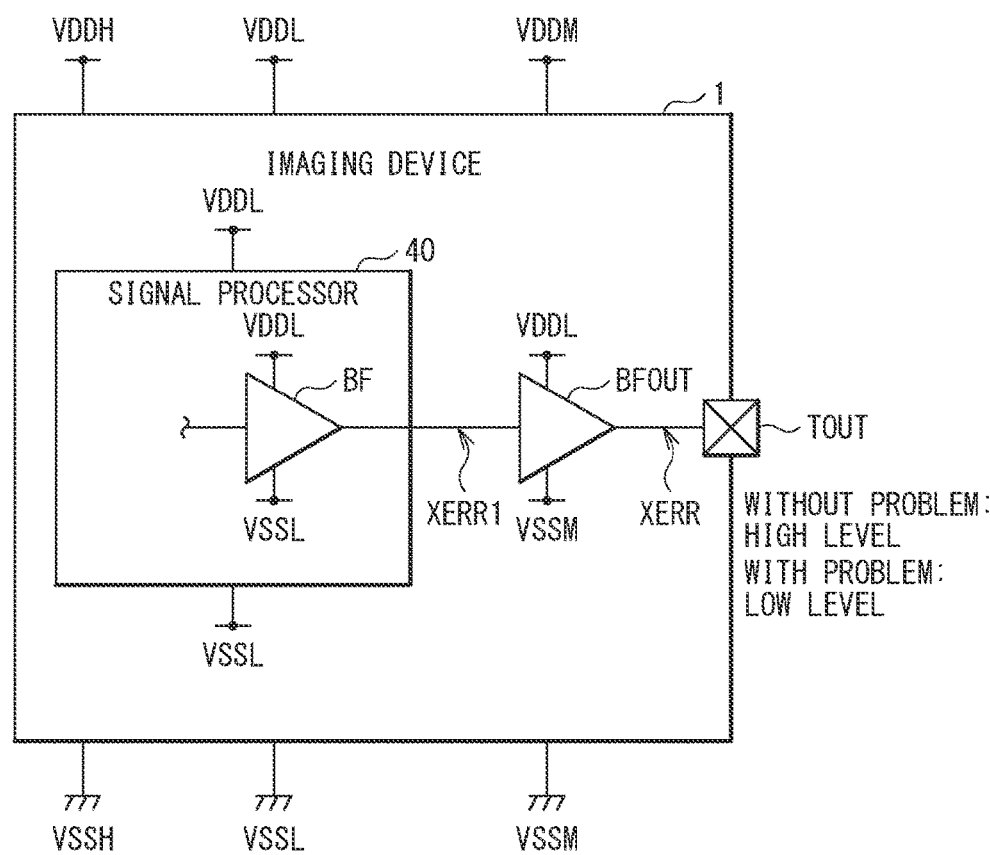

[FIG. 11]
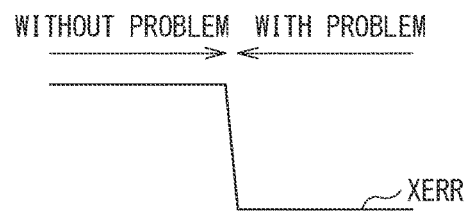
[FIG. 12]
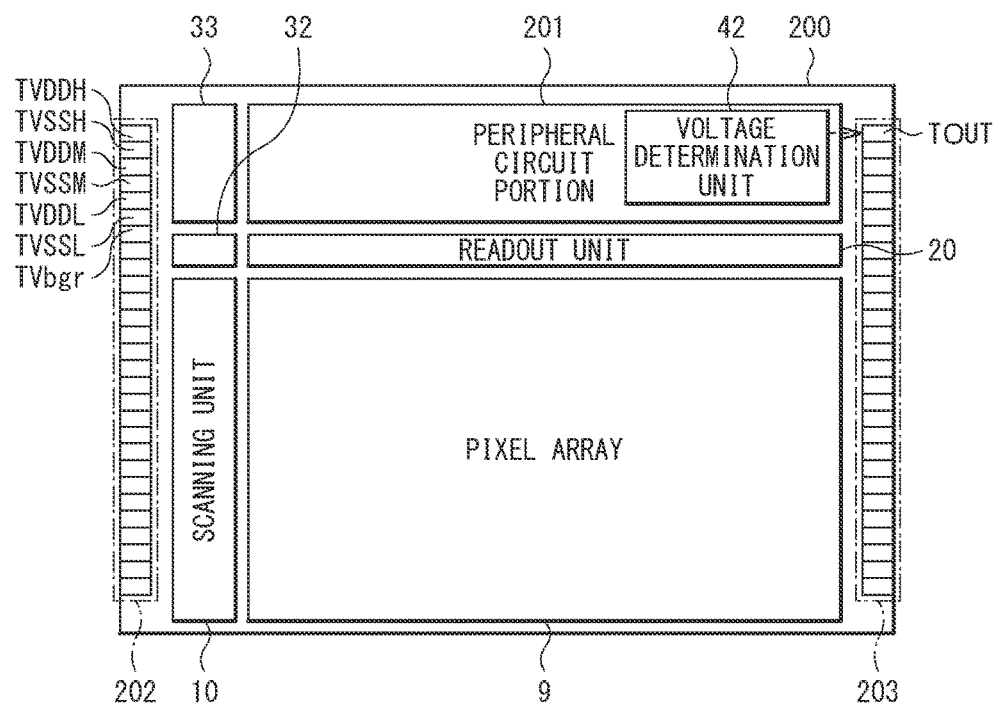

[FIG. 13]
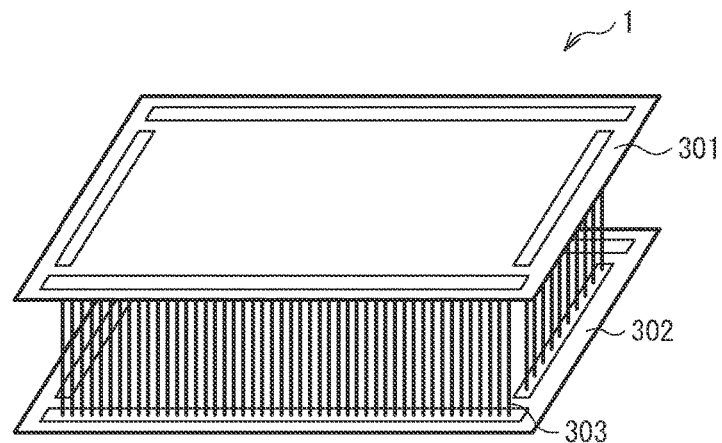
[FIG. 14]
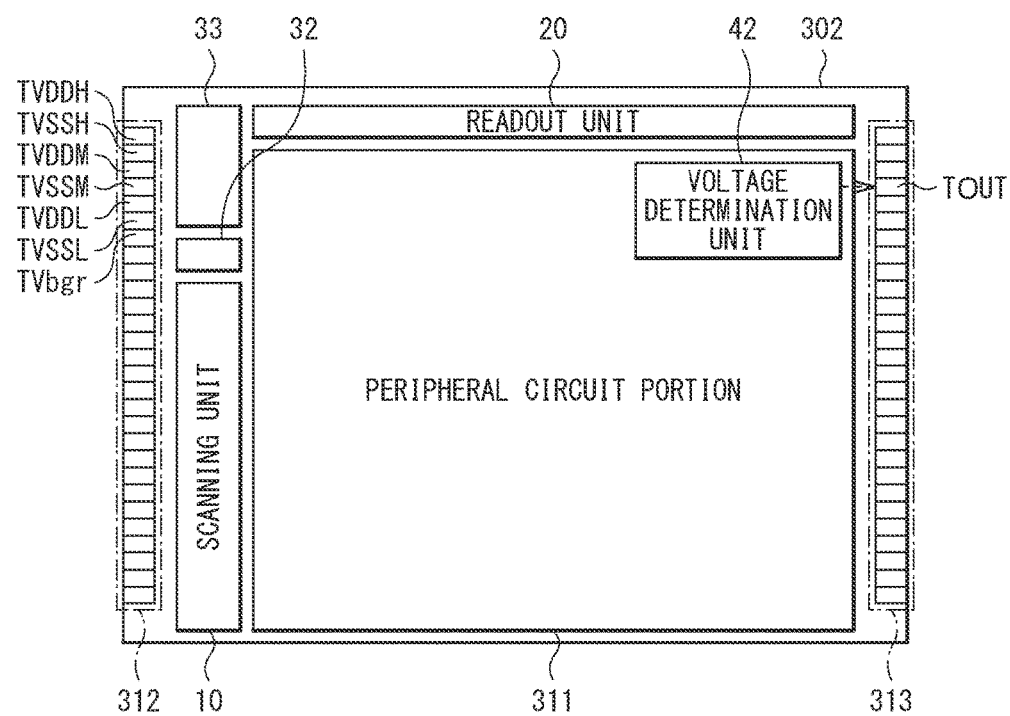

[FIG. 15]
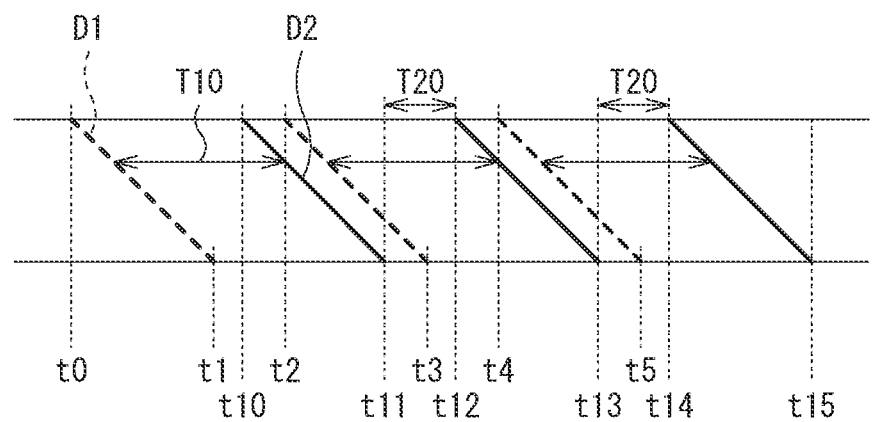

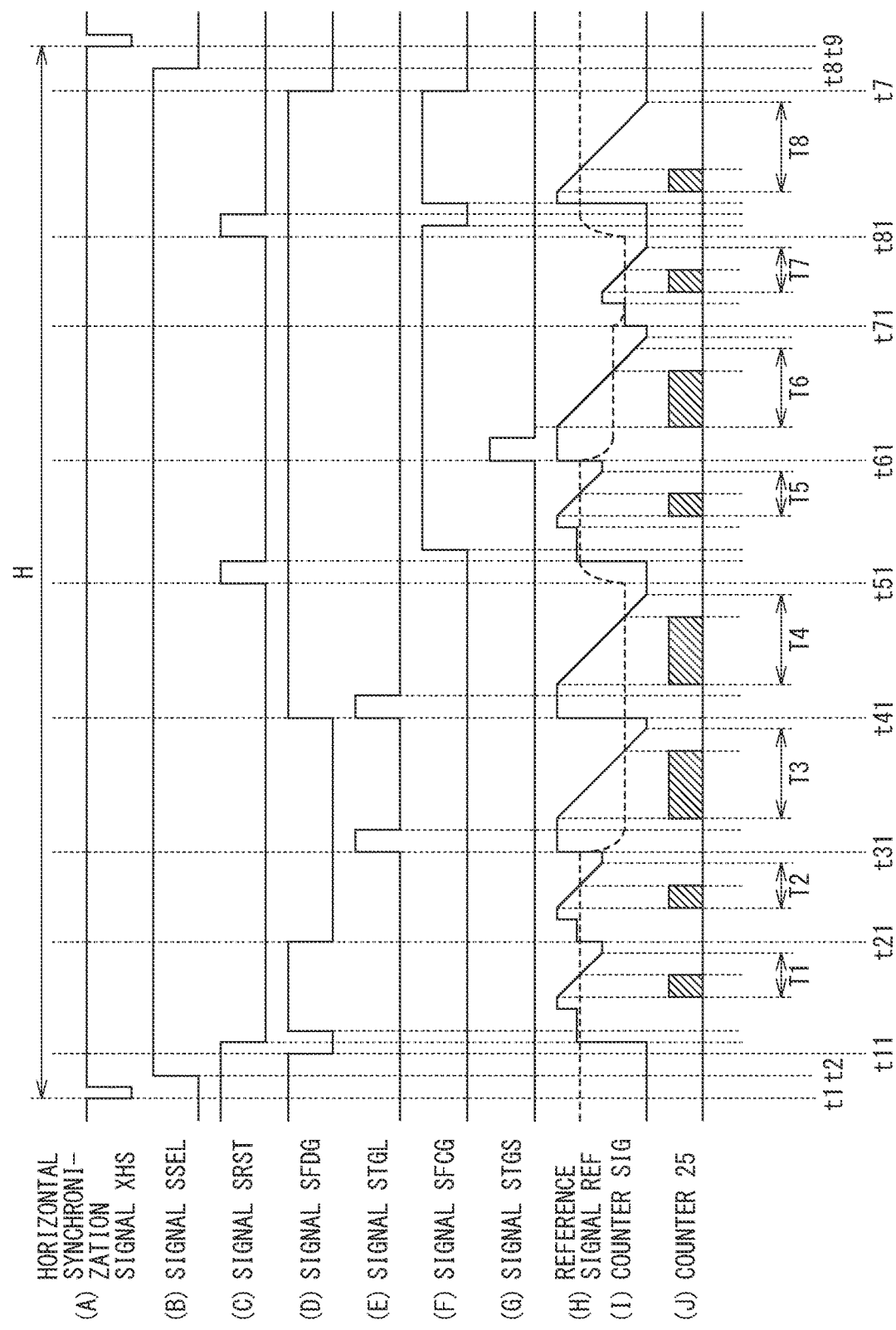

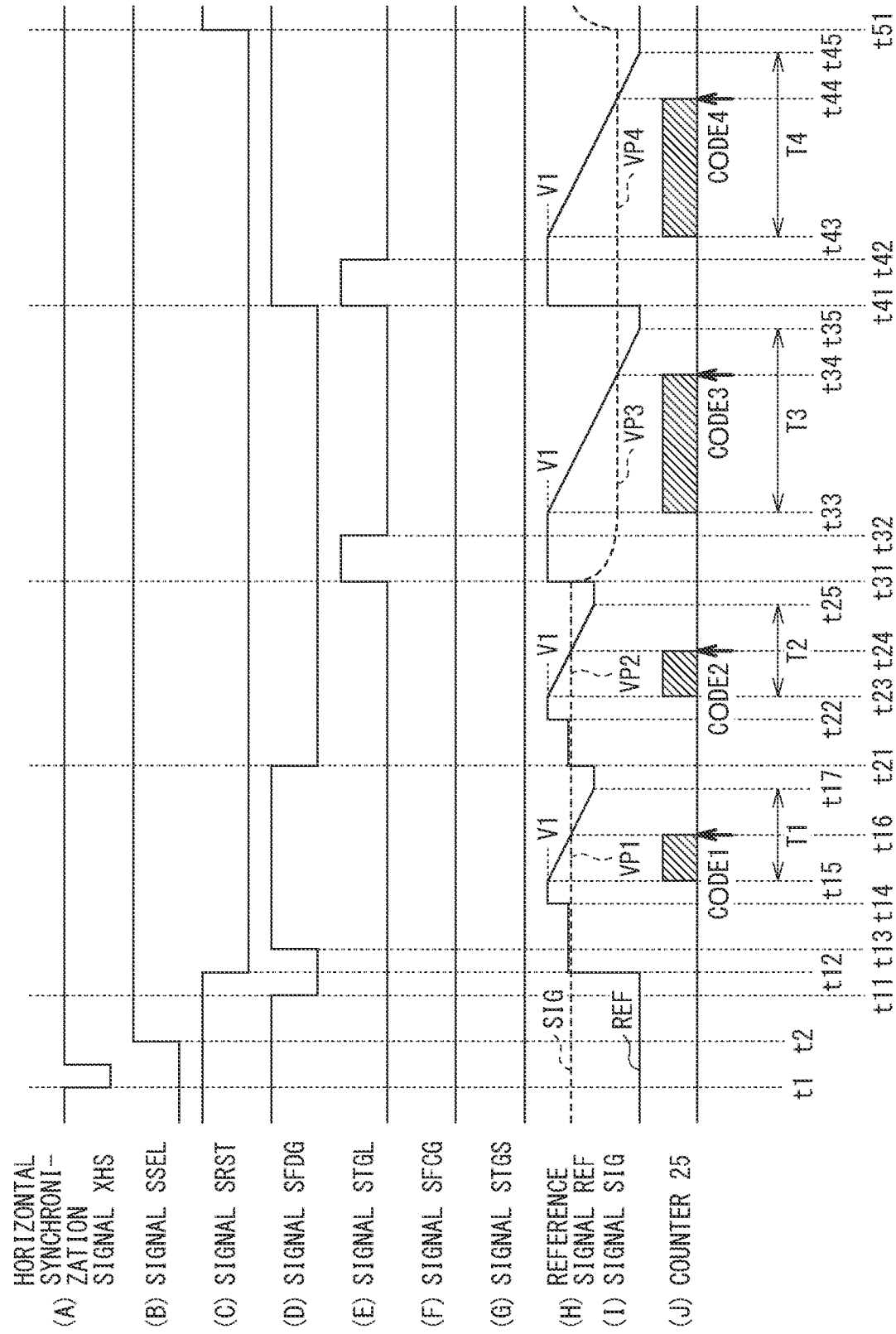

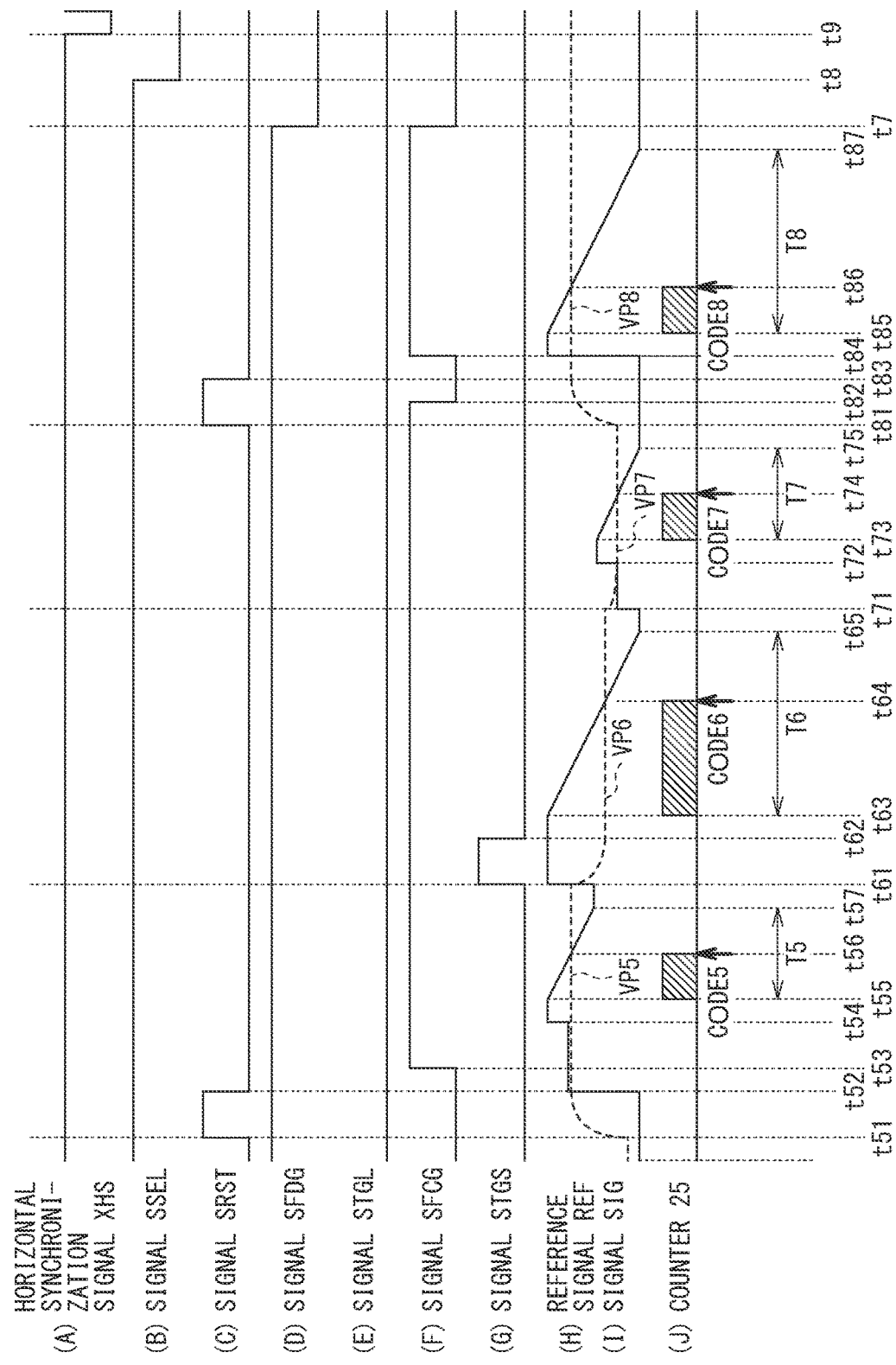
[FIG. 17B]

[FIG. 18A]
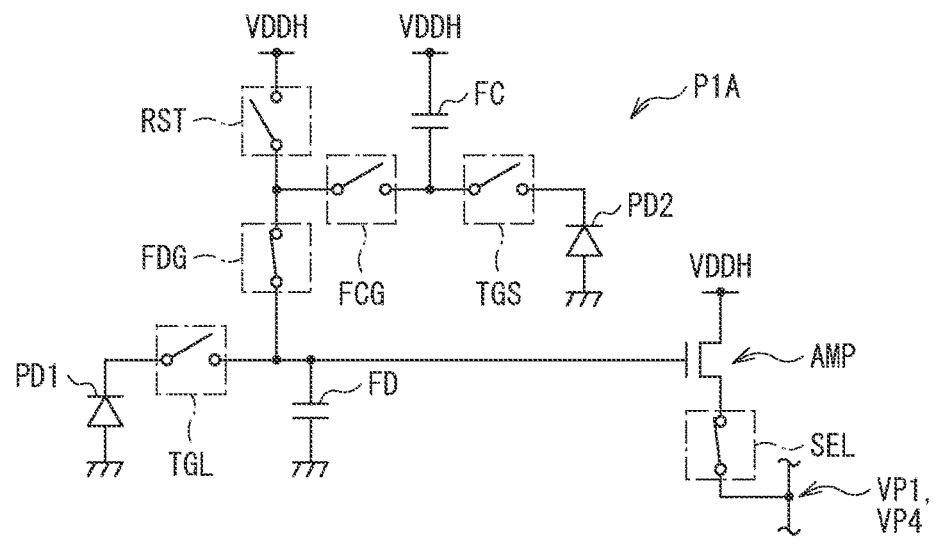
[FIG. 18B]
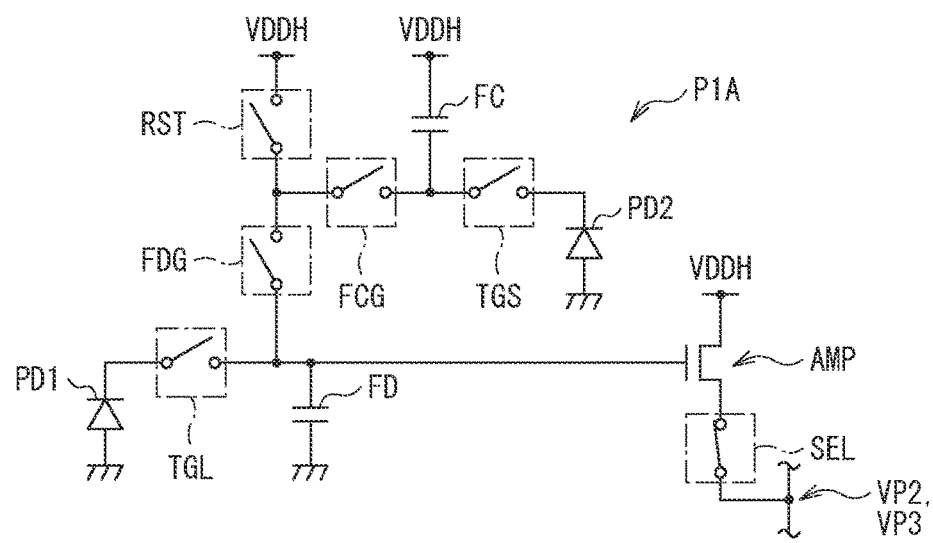

[FIG. 18C]
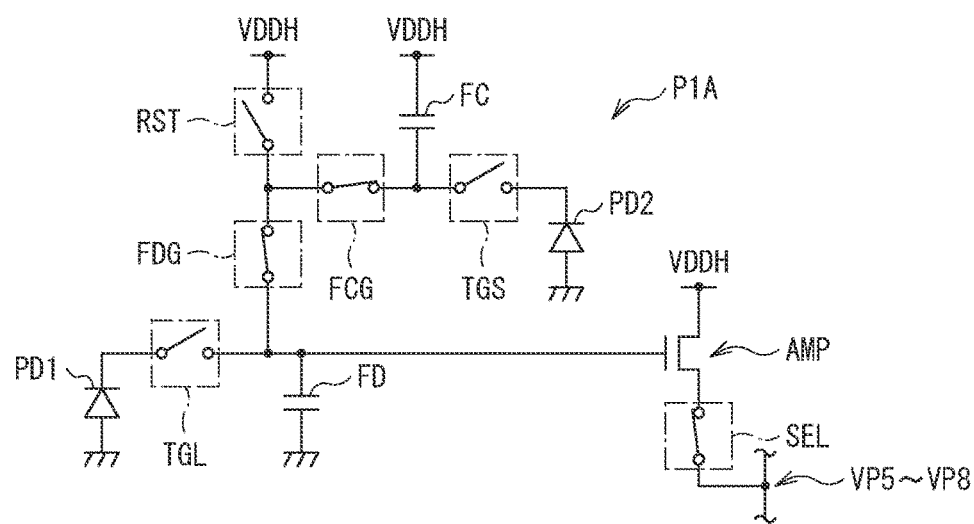

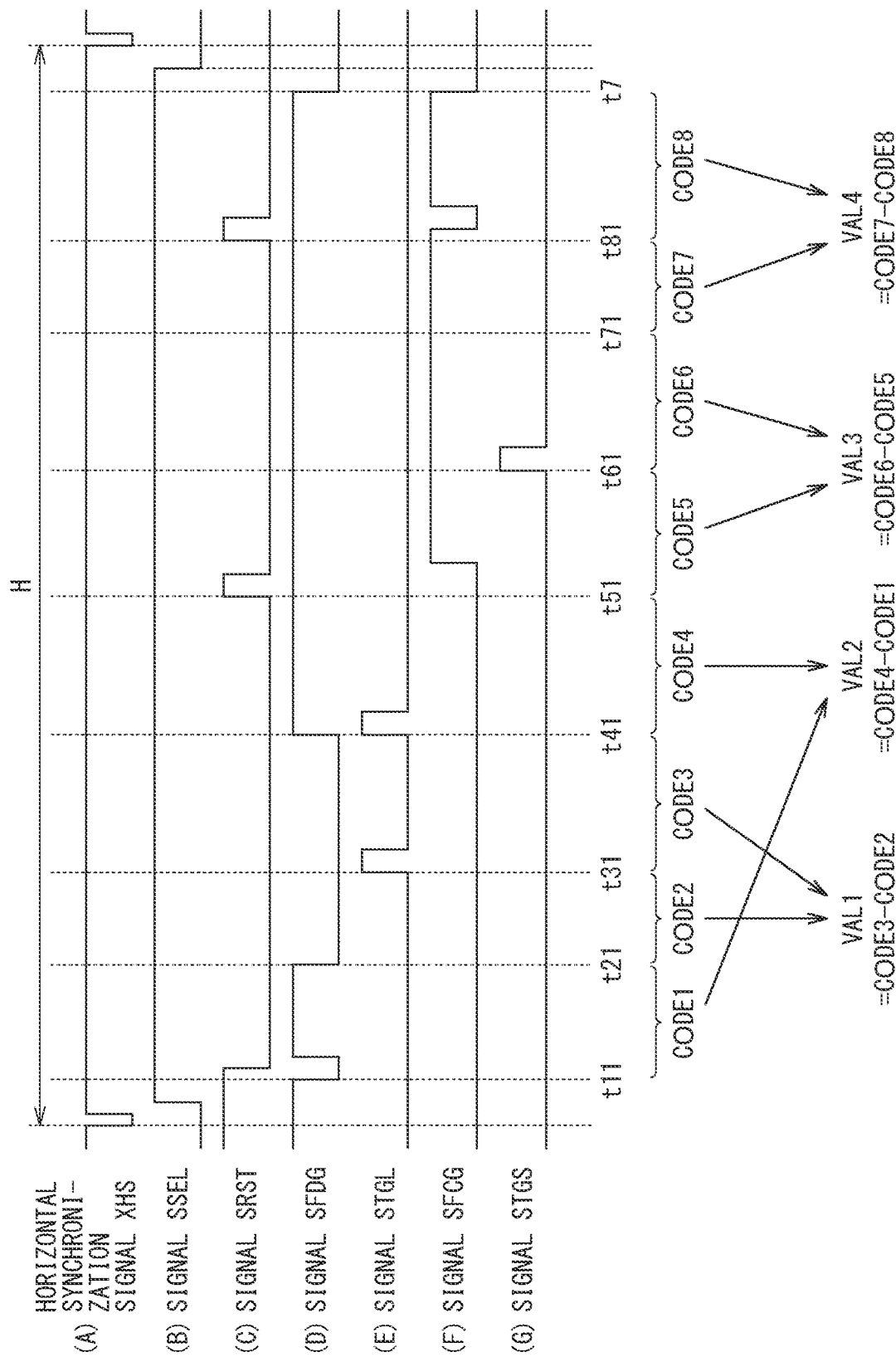

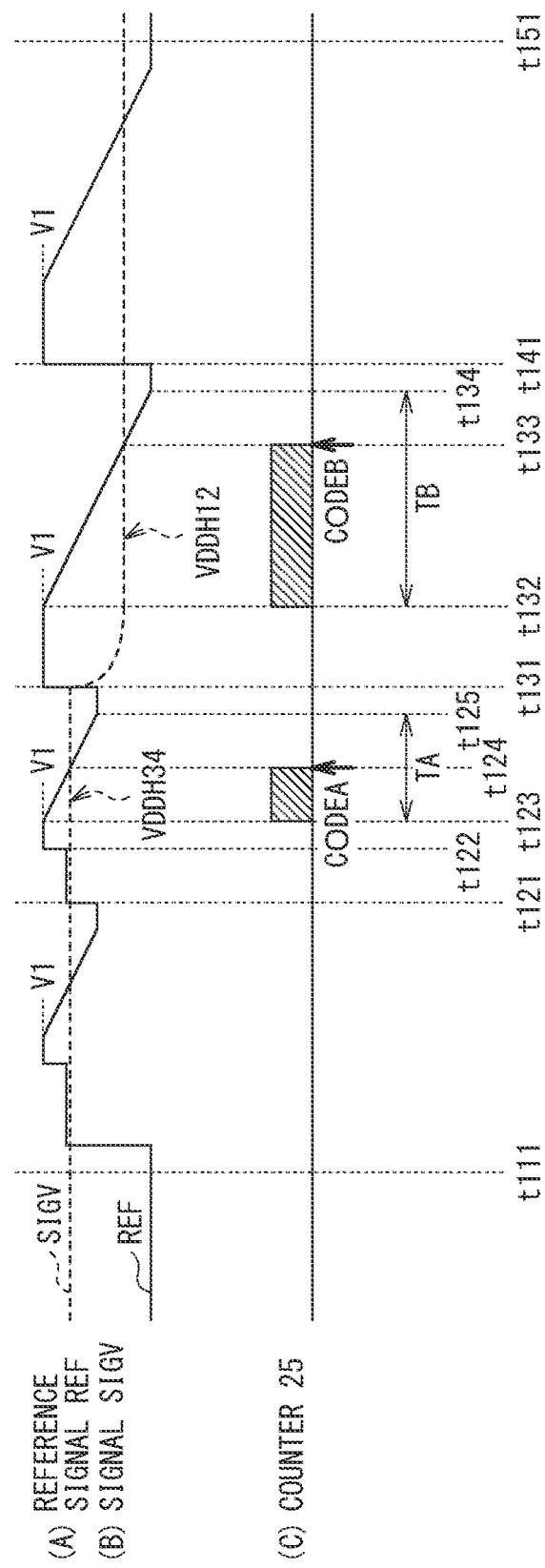
[FIG. 20]

[FIG. 21A]
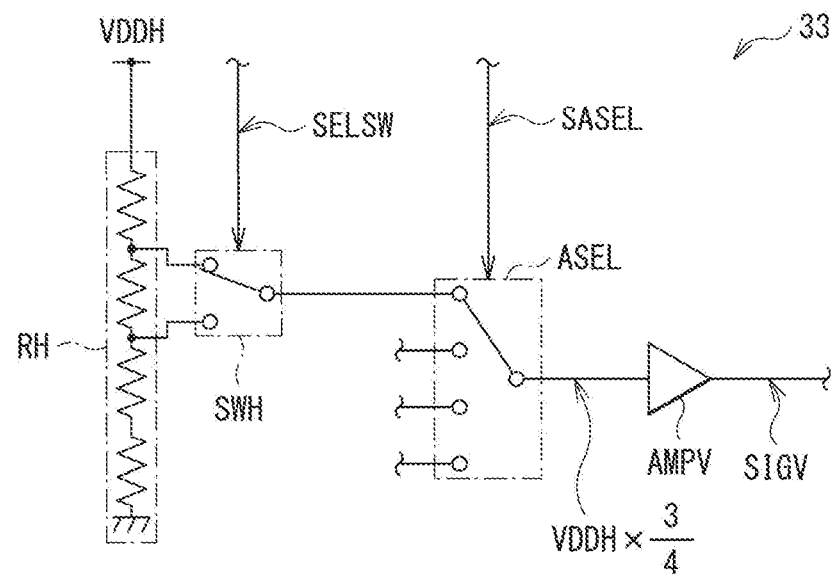
[FIG. 21B]
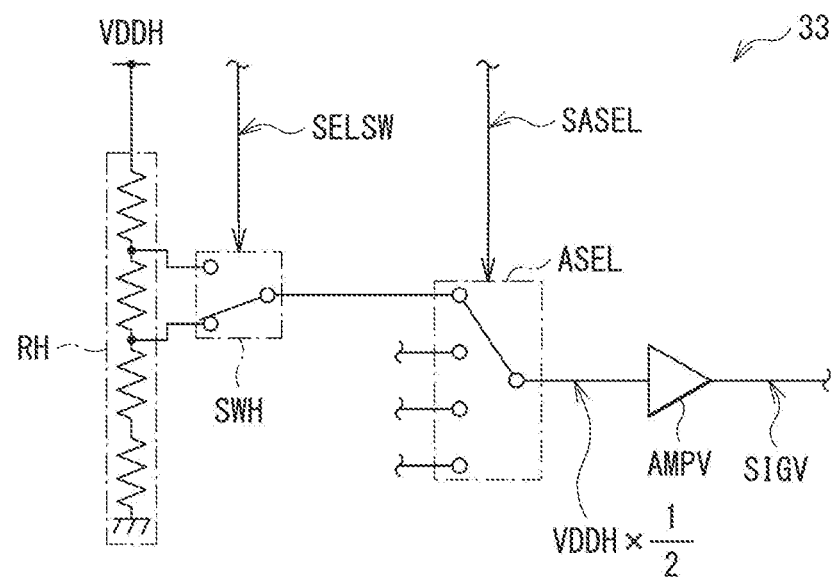

[FIG. 22]
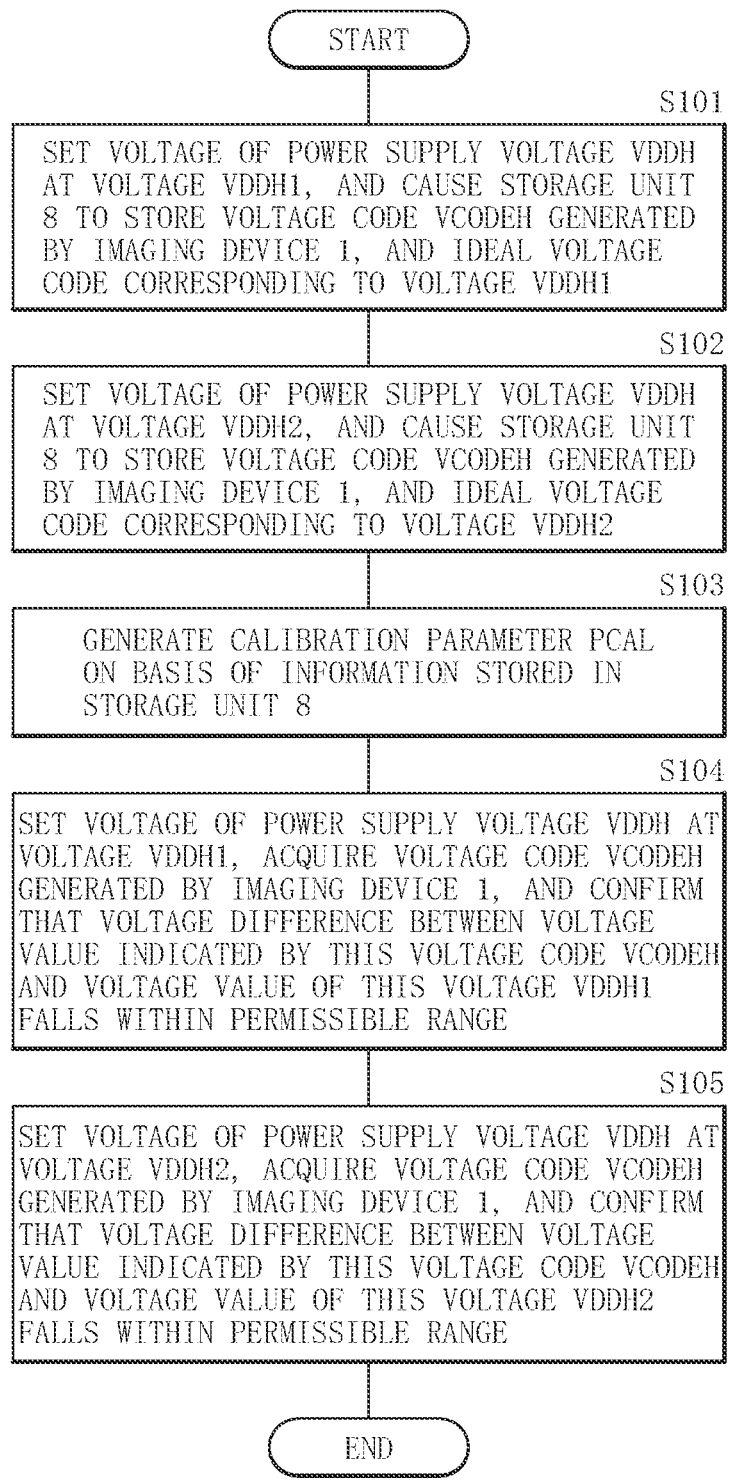

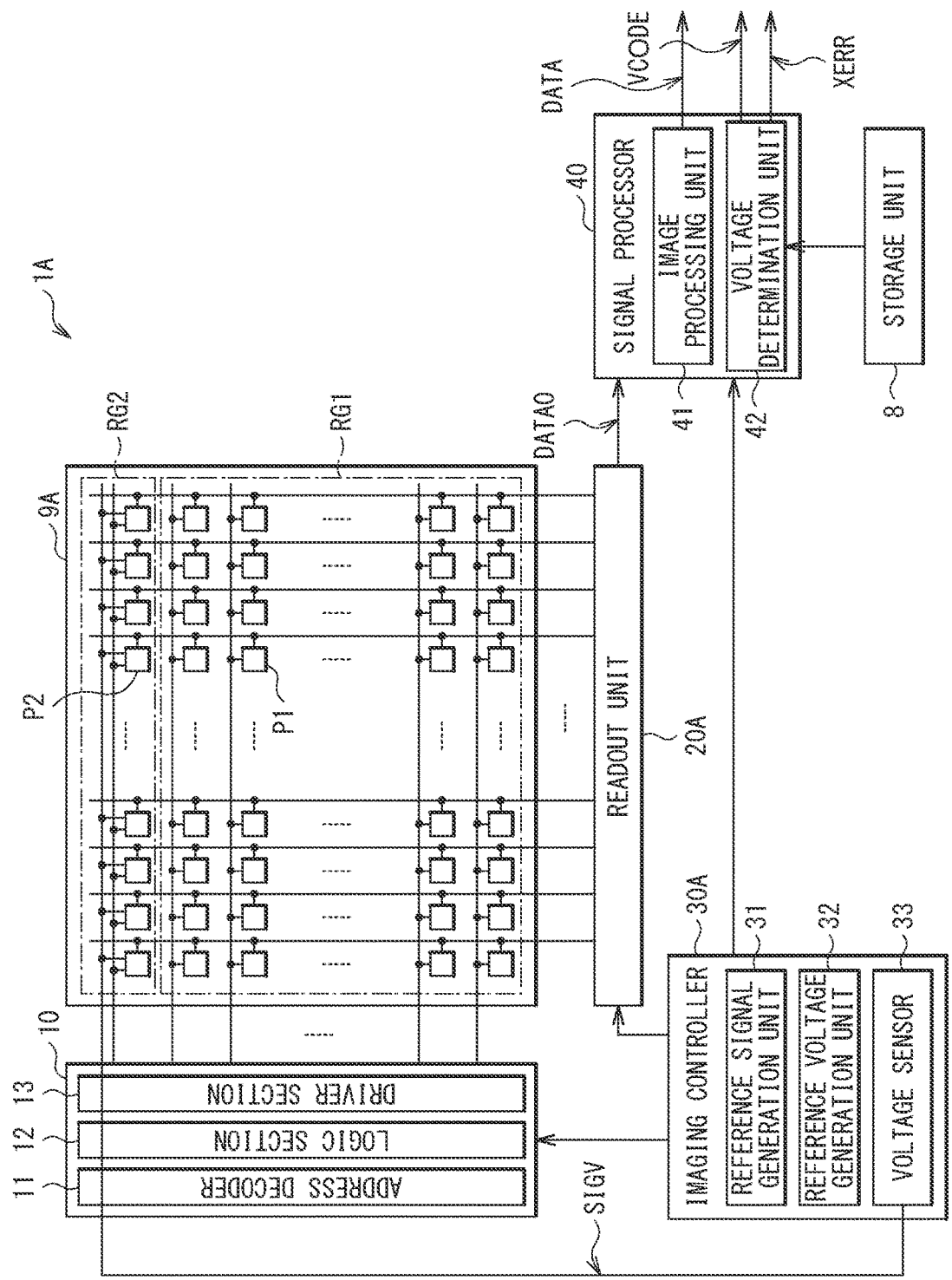

[FIG. 24]
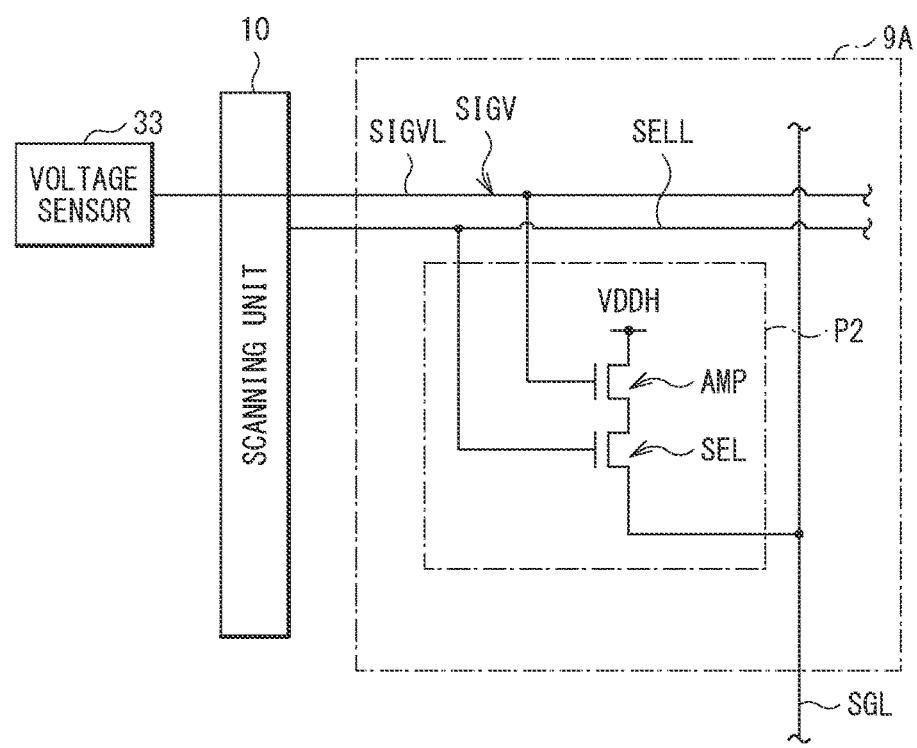

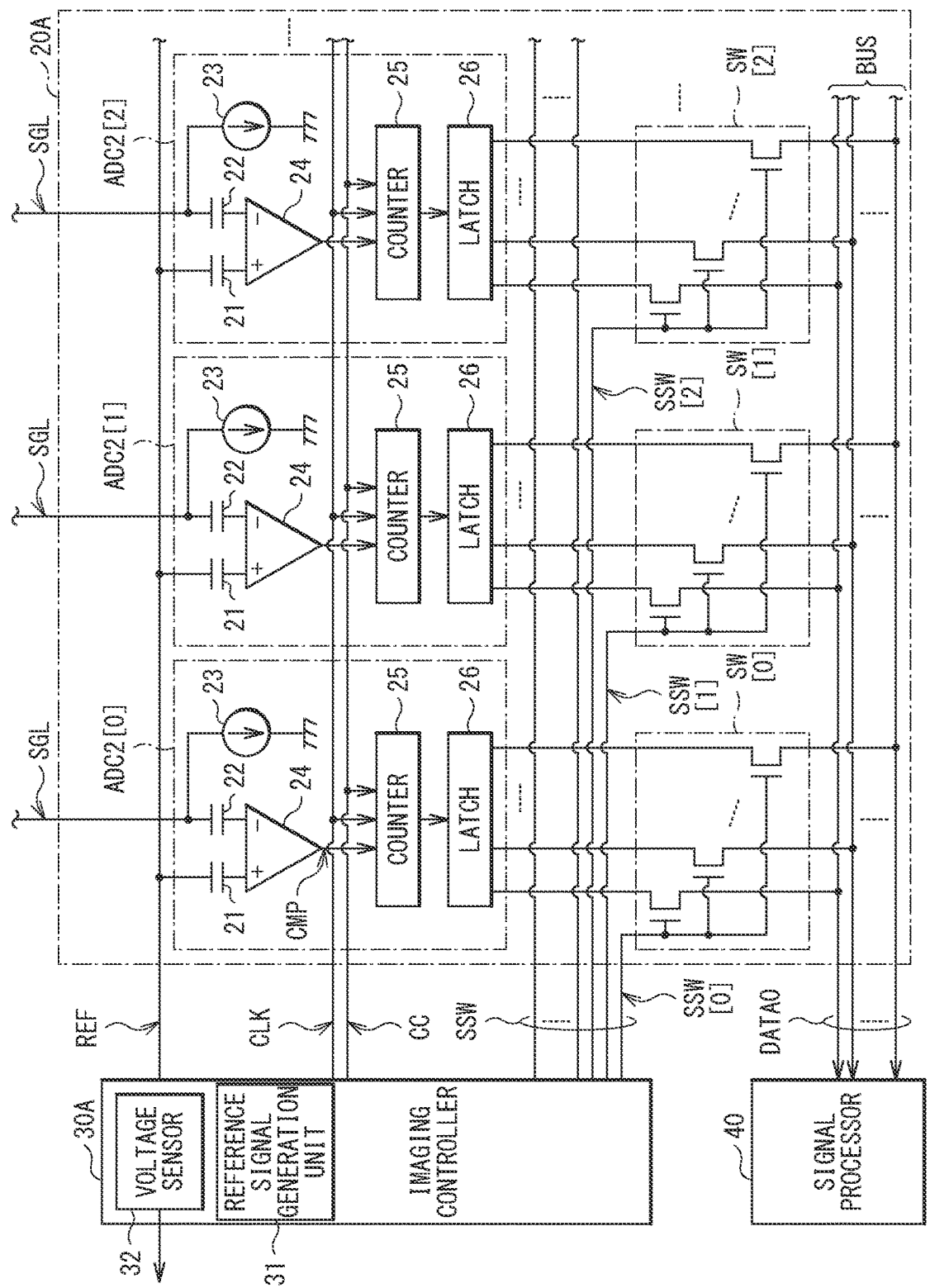
[FIG. 25]

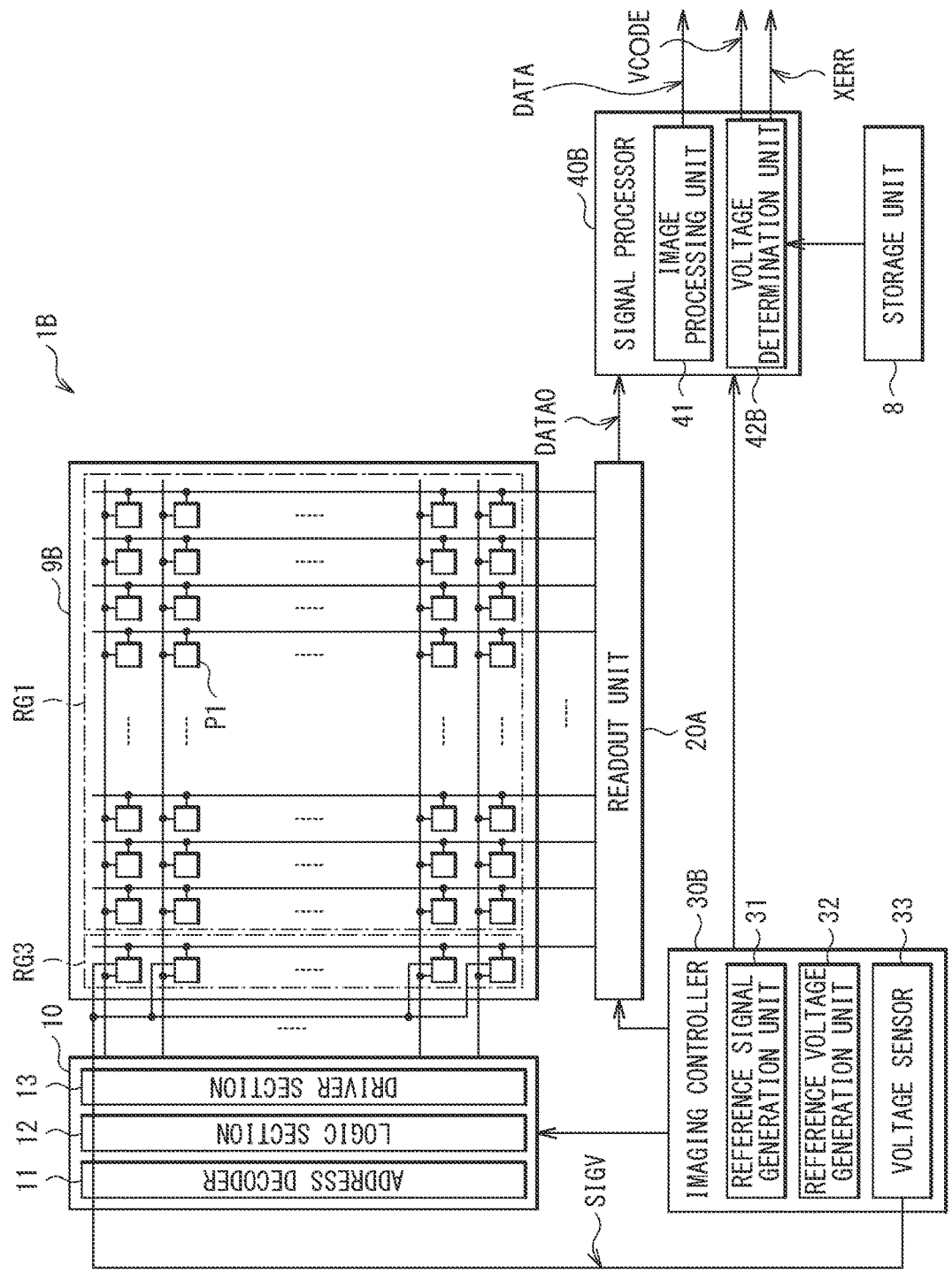
[FIG. 26]

[FIG. 27]
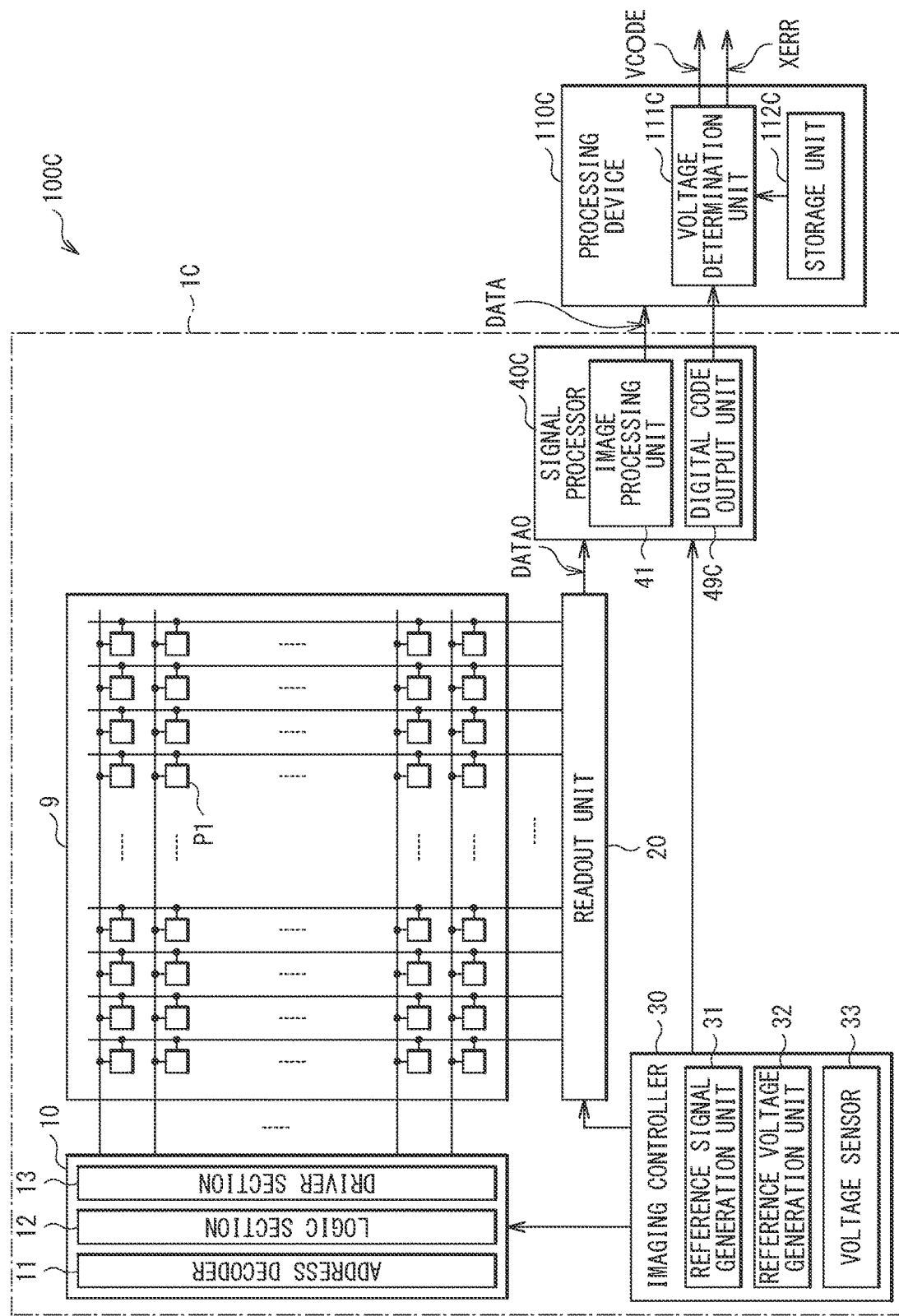

[FIG. 28]
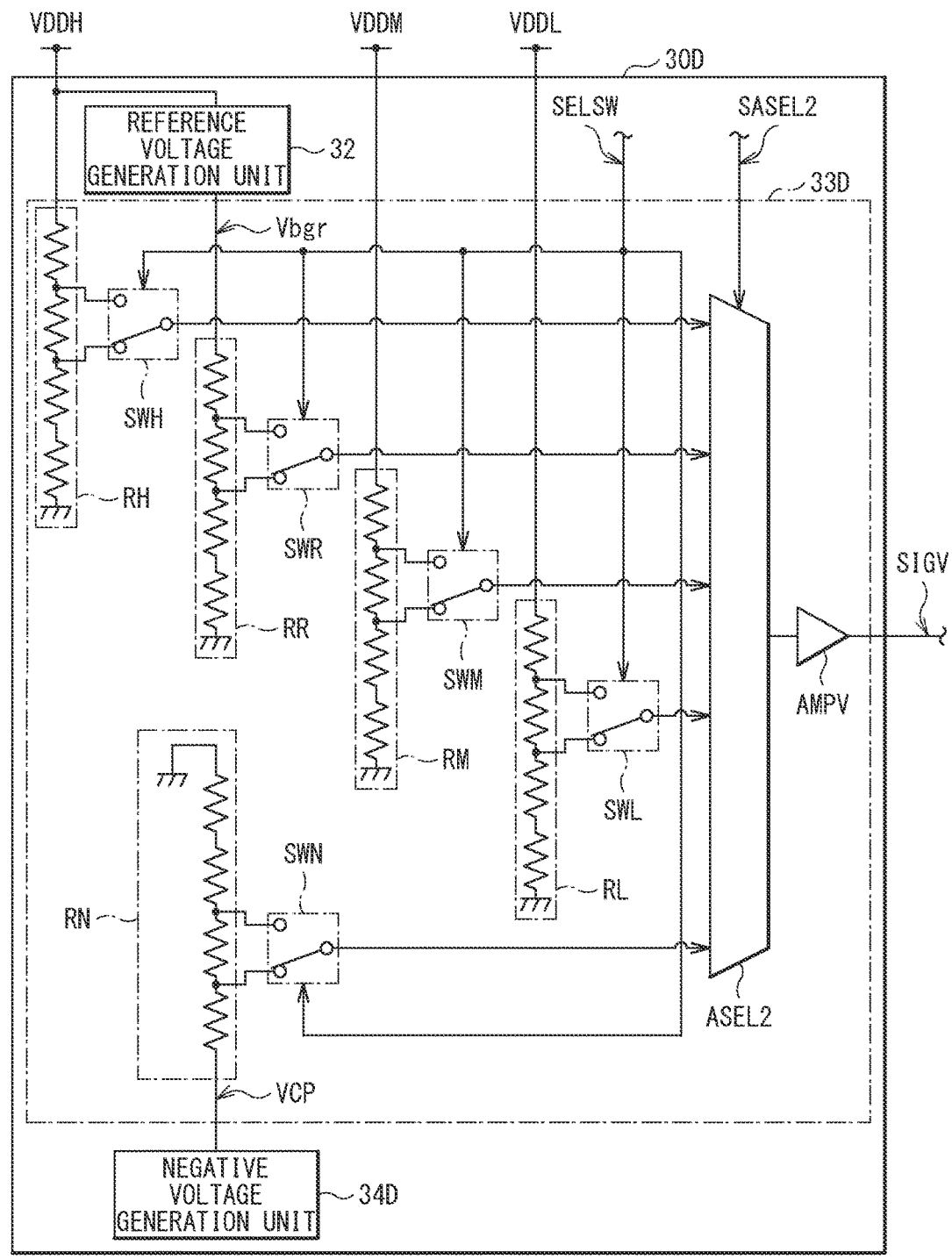

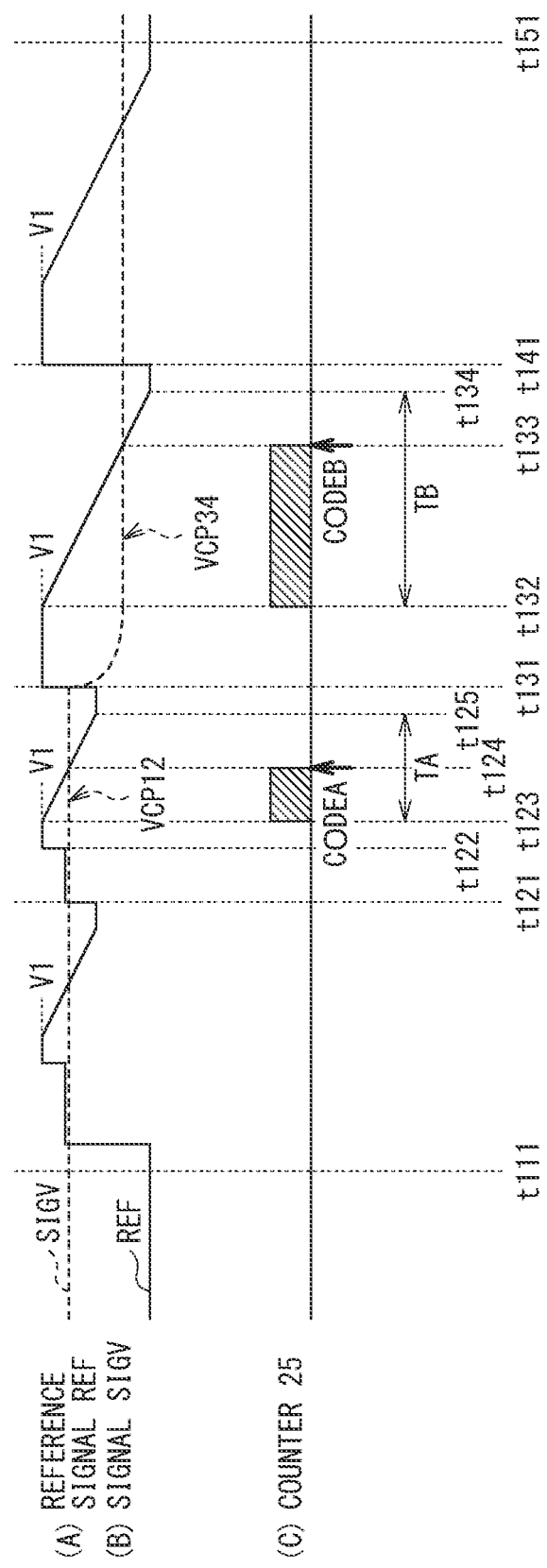

[FIG. 30A]
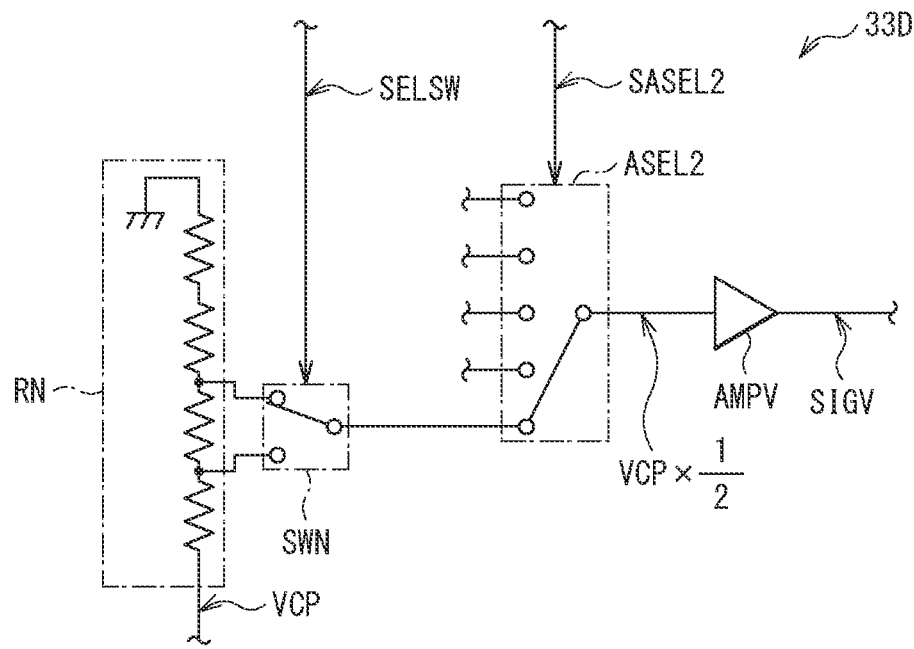
[FIG. 30B]
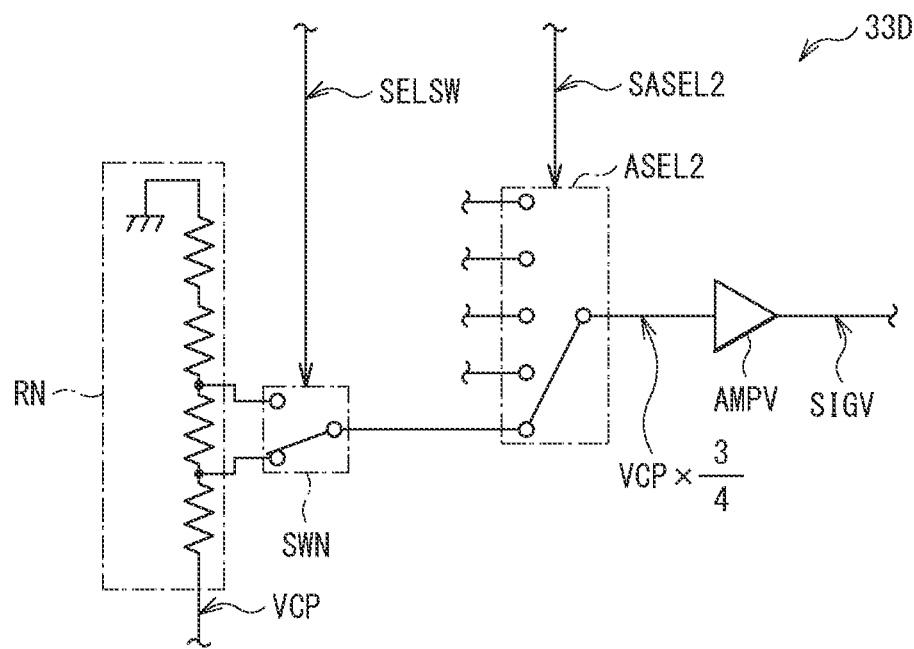

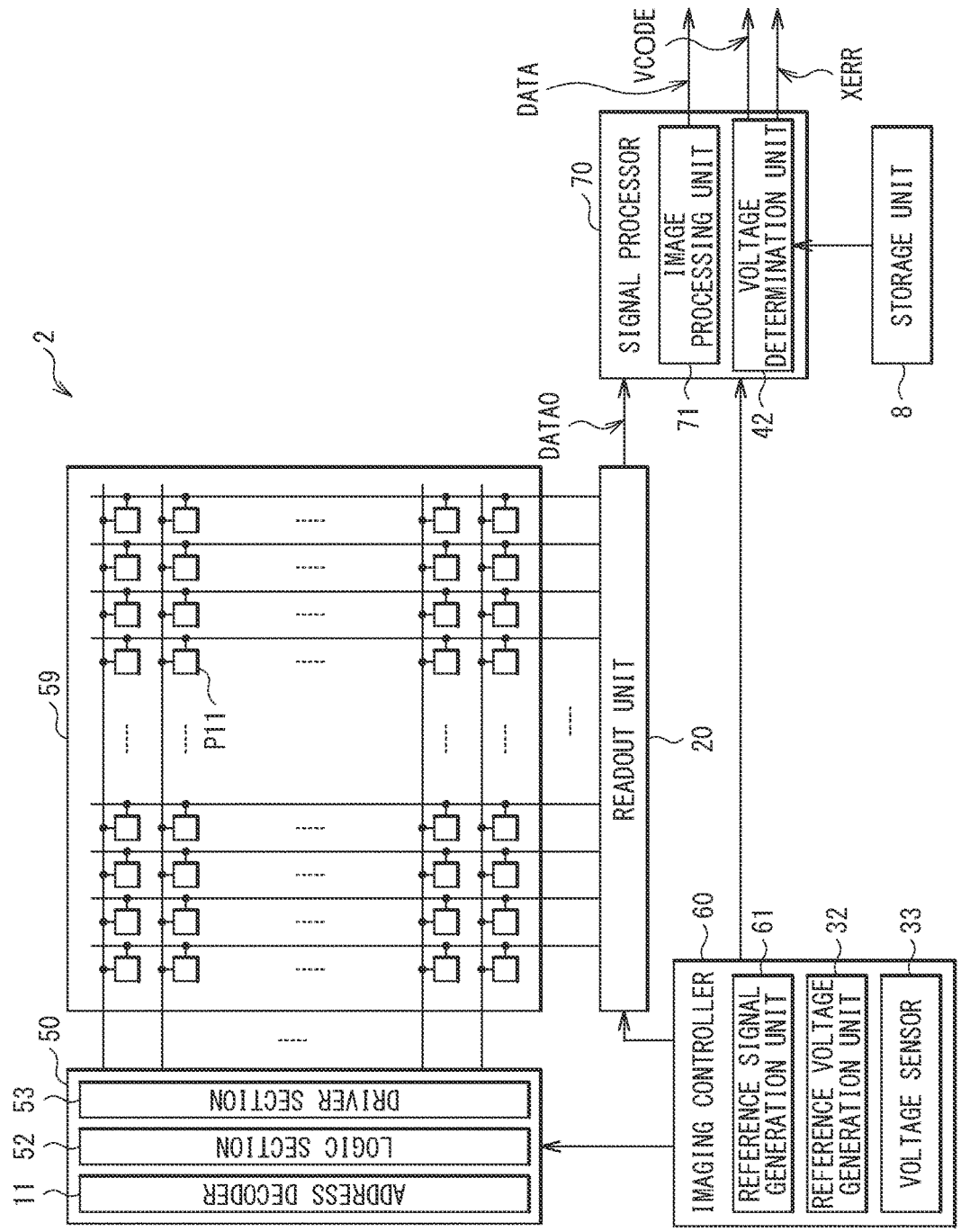
[FIG. 31]

[FIG. 32]
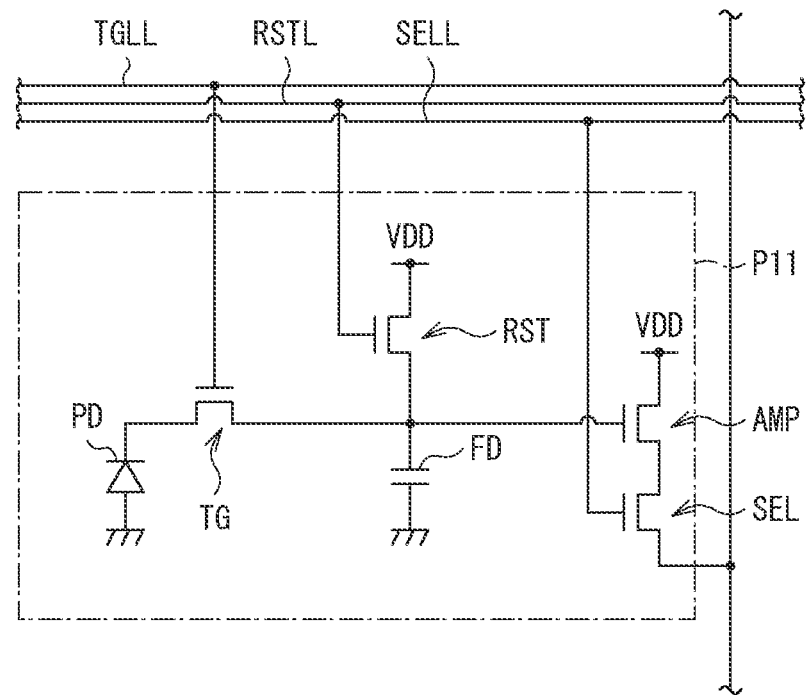
[FIG. 33]
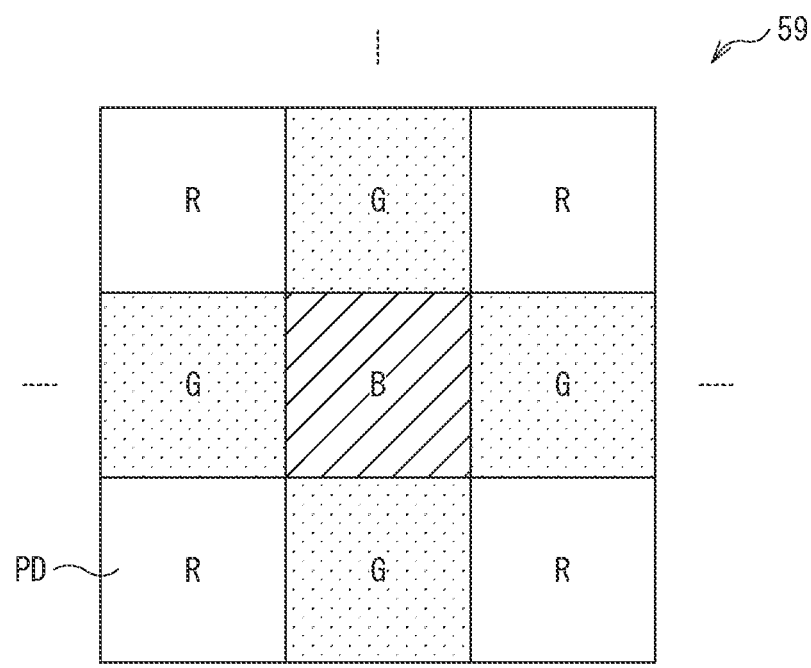

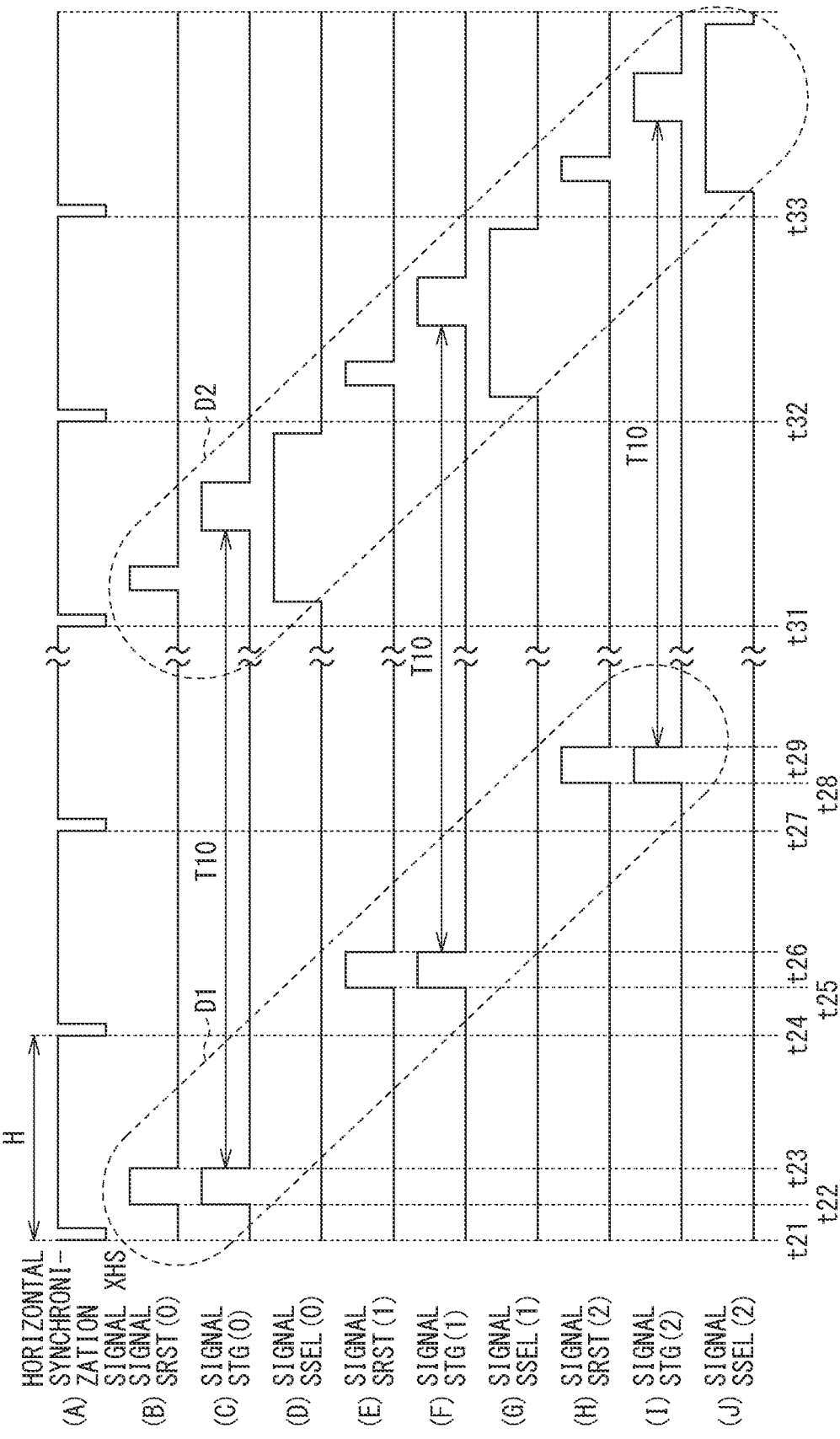

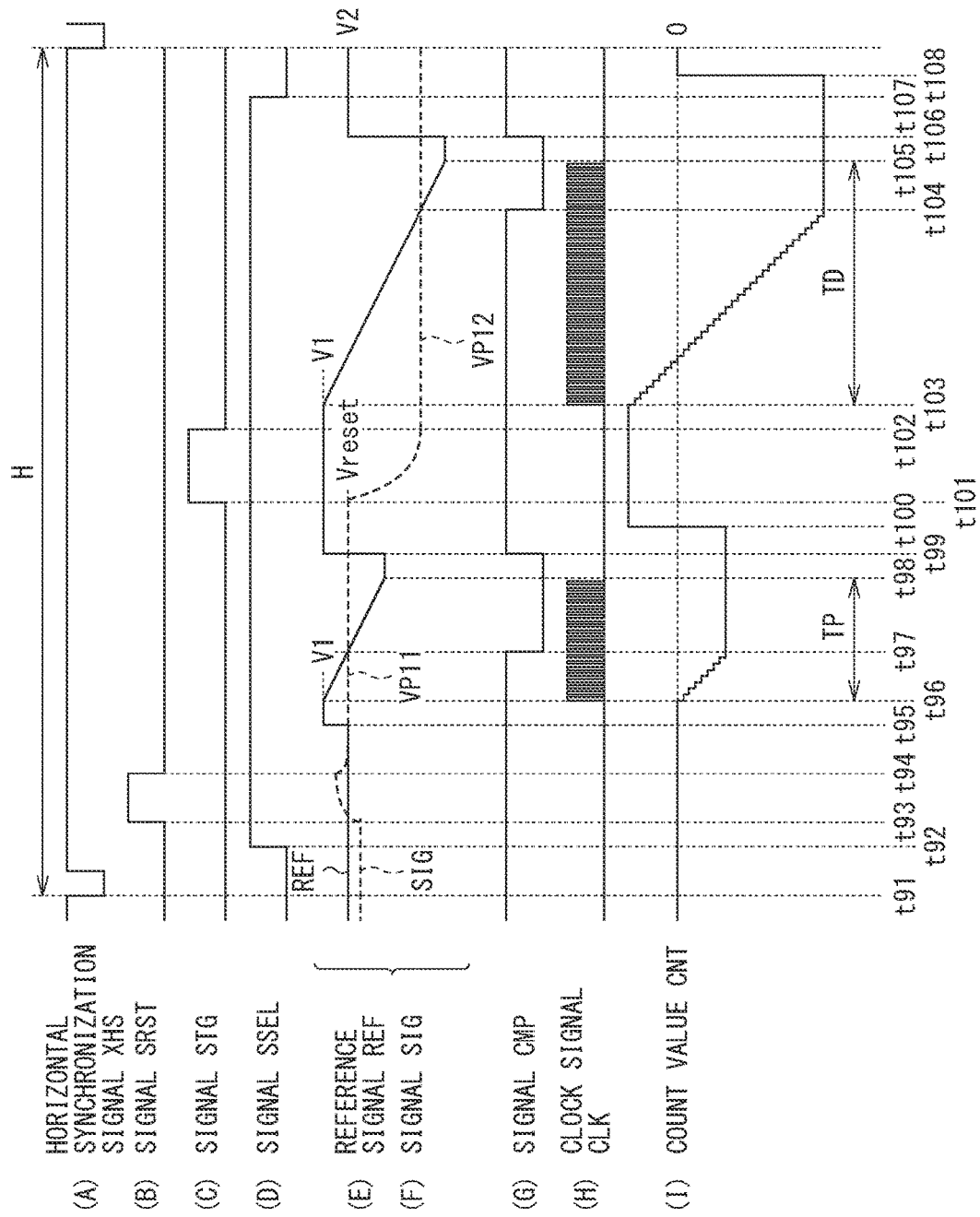
[FIG. 35]

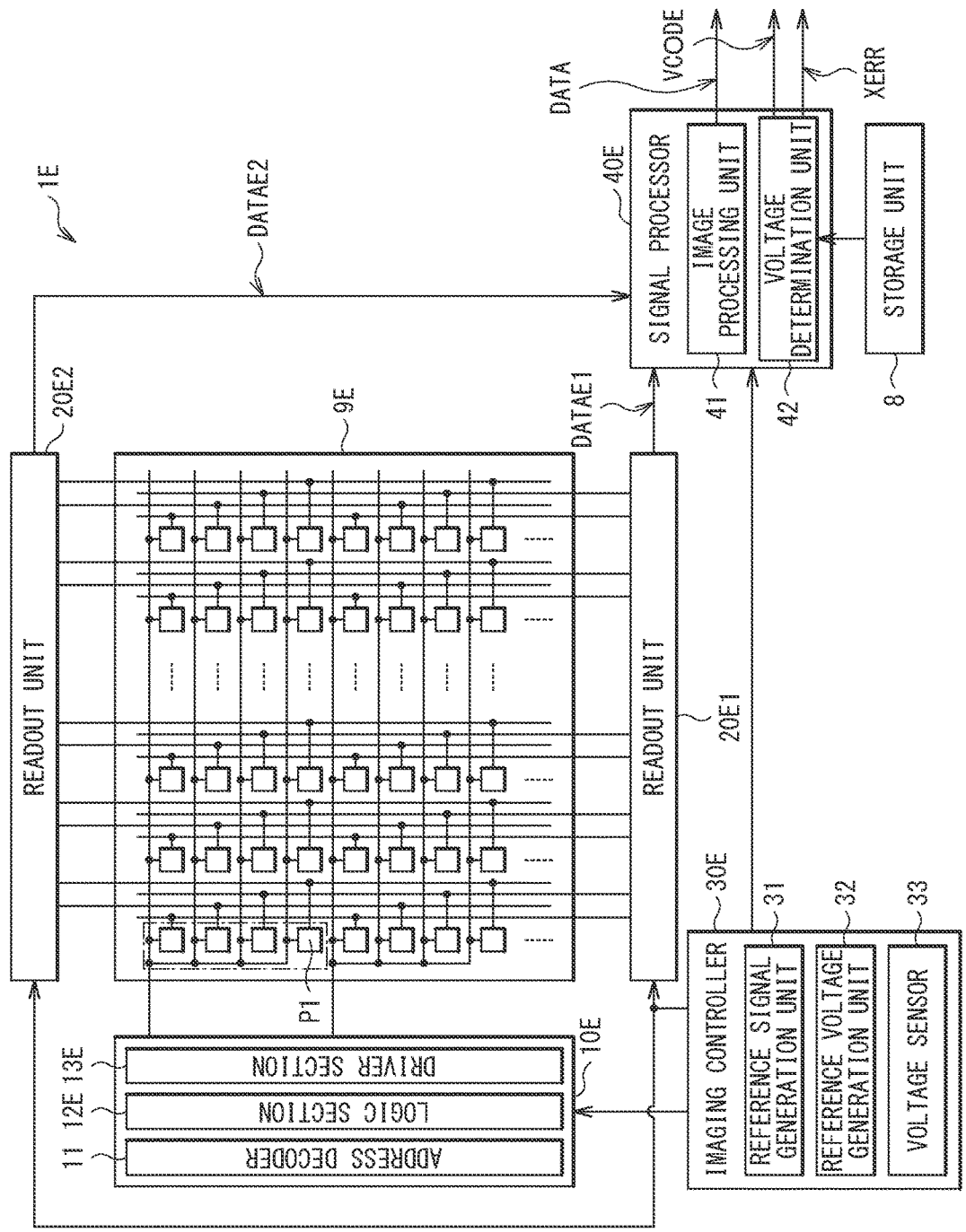
[FIG. 36]

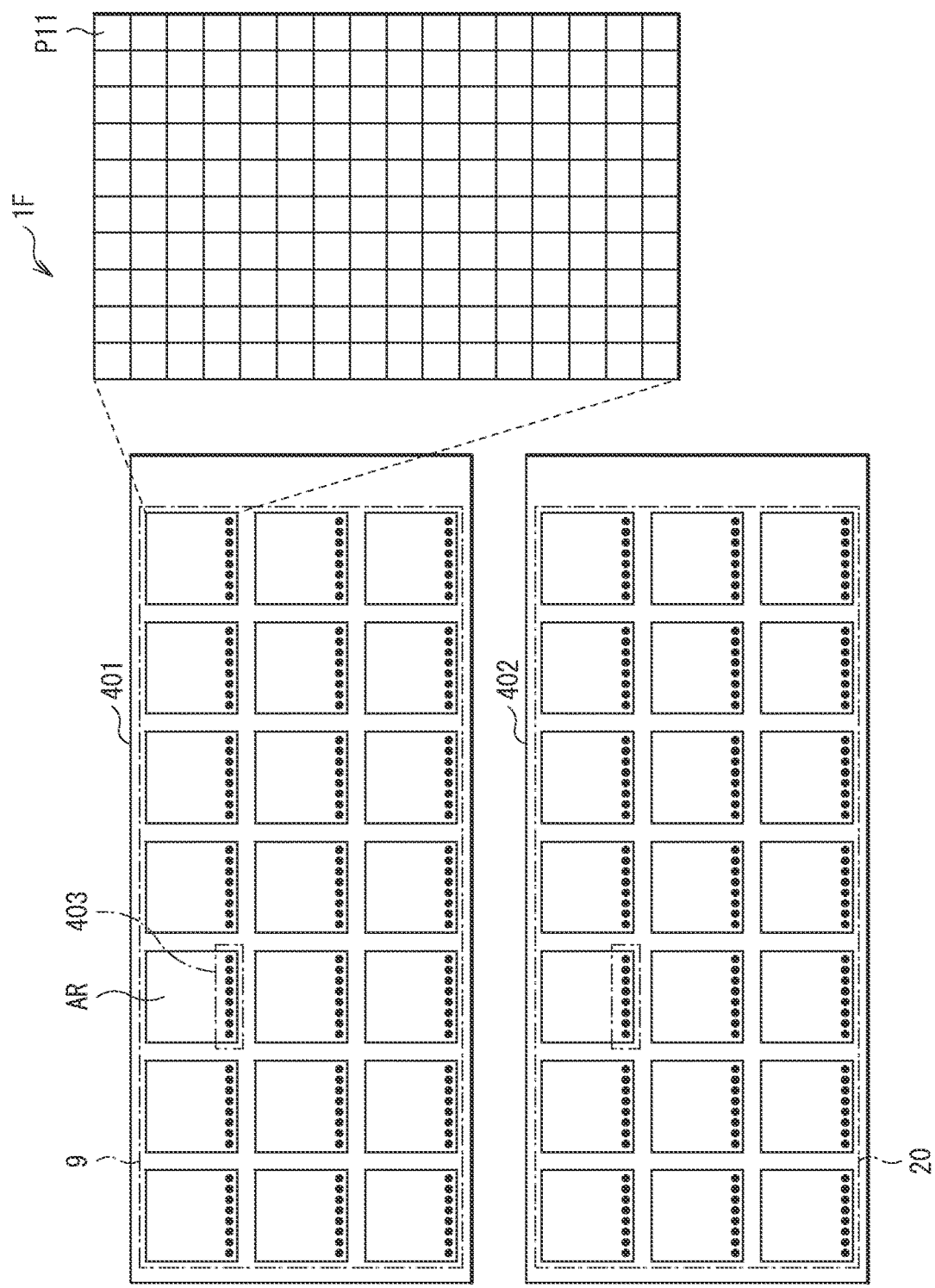
[FIG. 37]

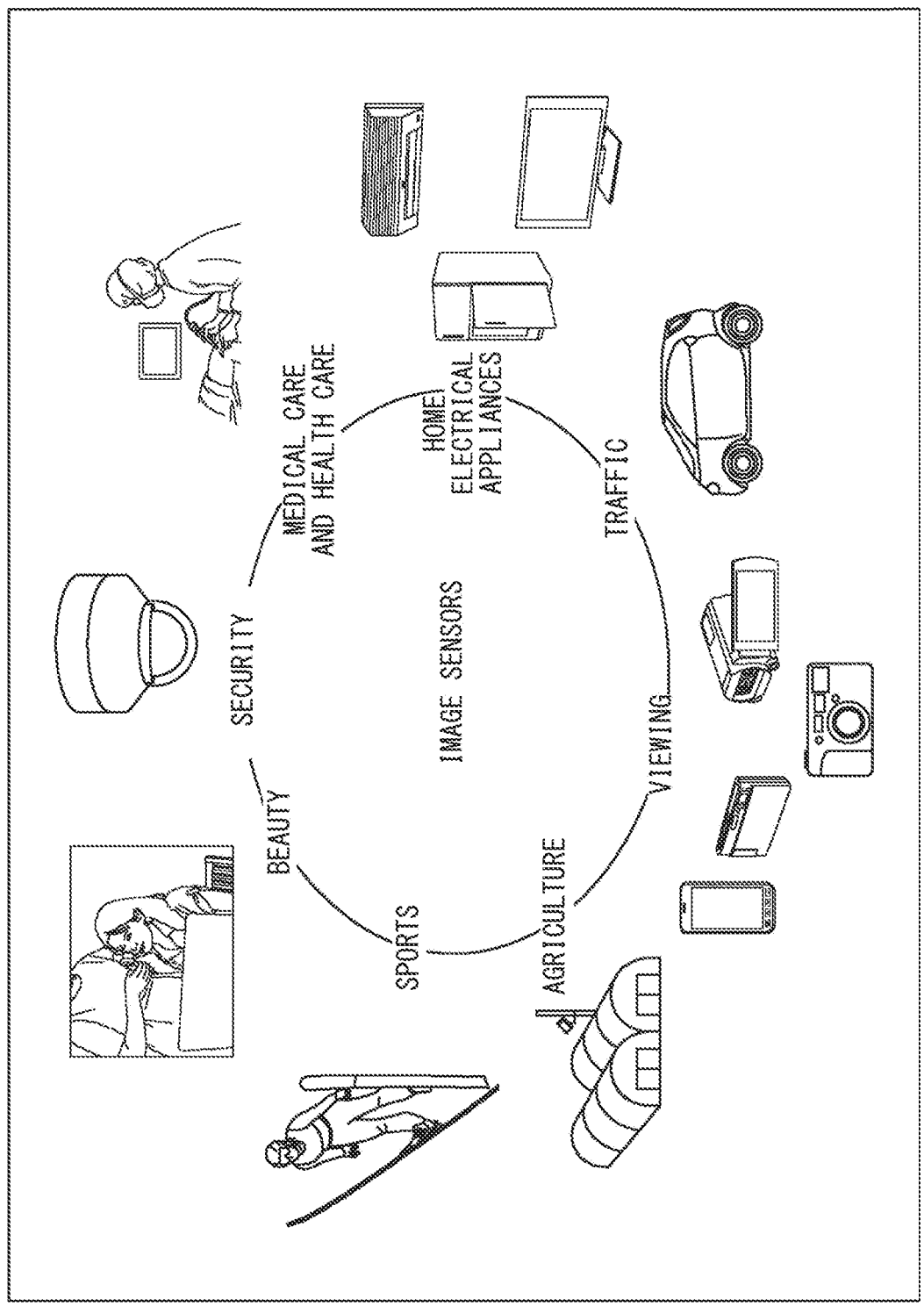
[FIG. 38]

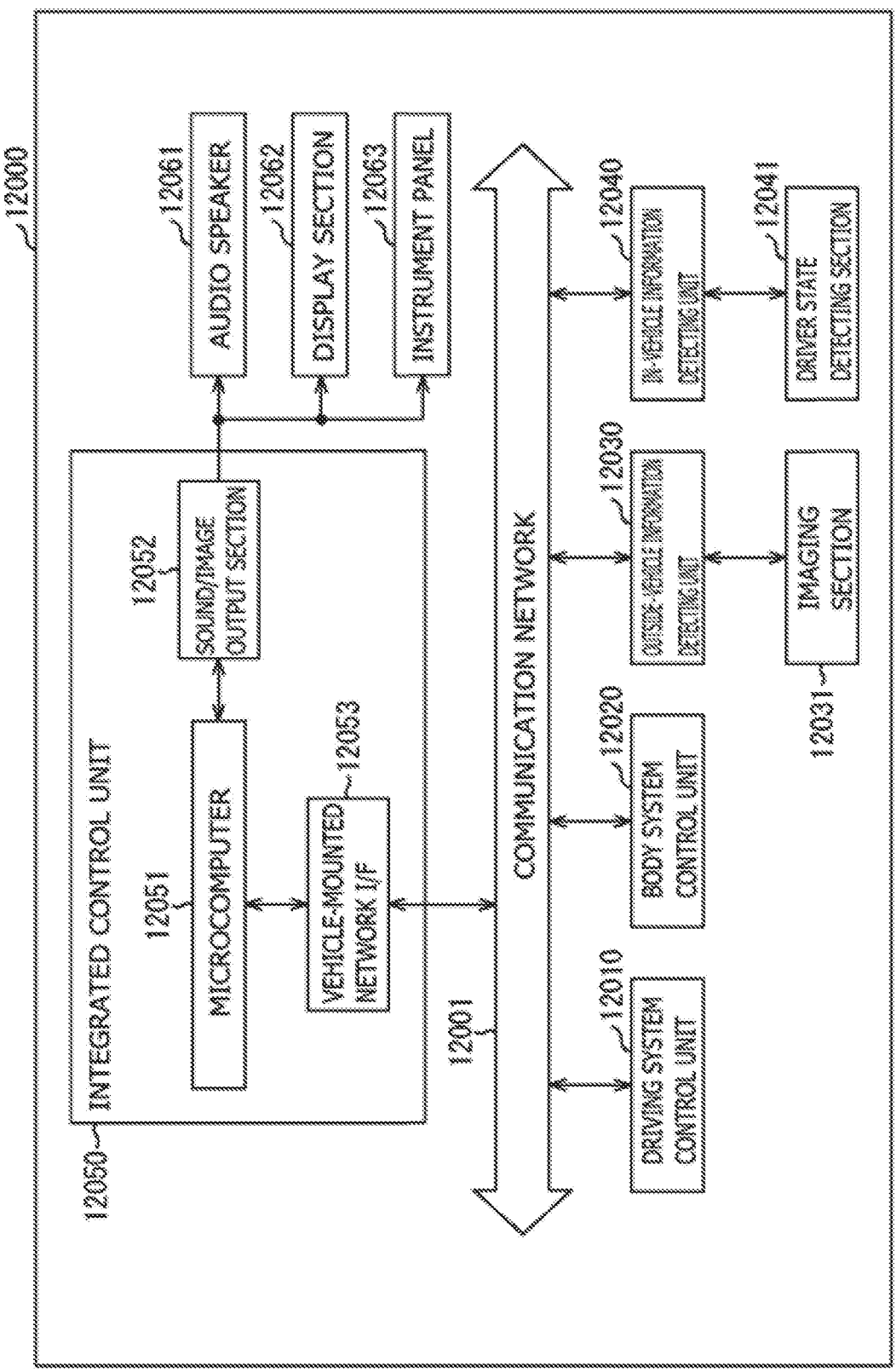
[FIG. 39]

[FIG. 40]
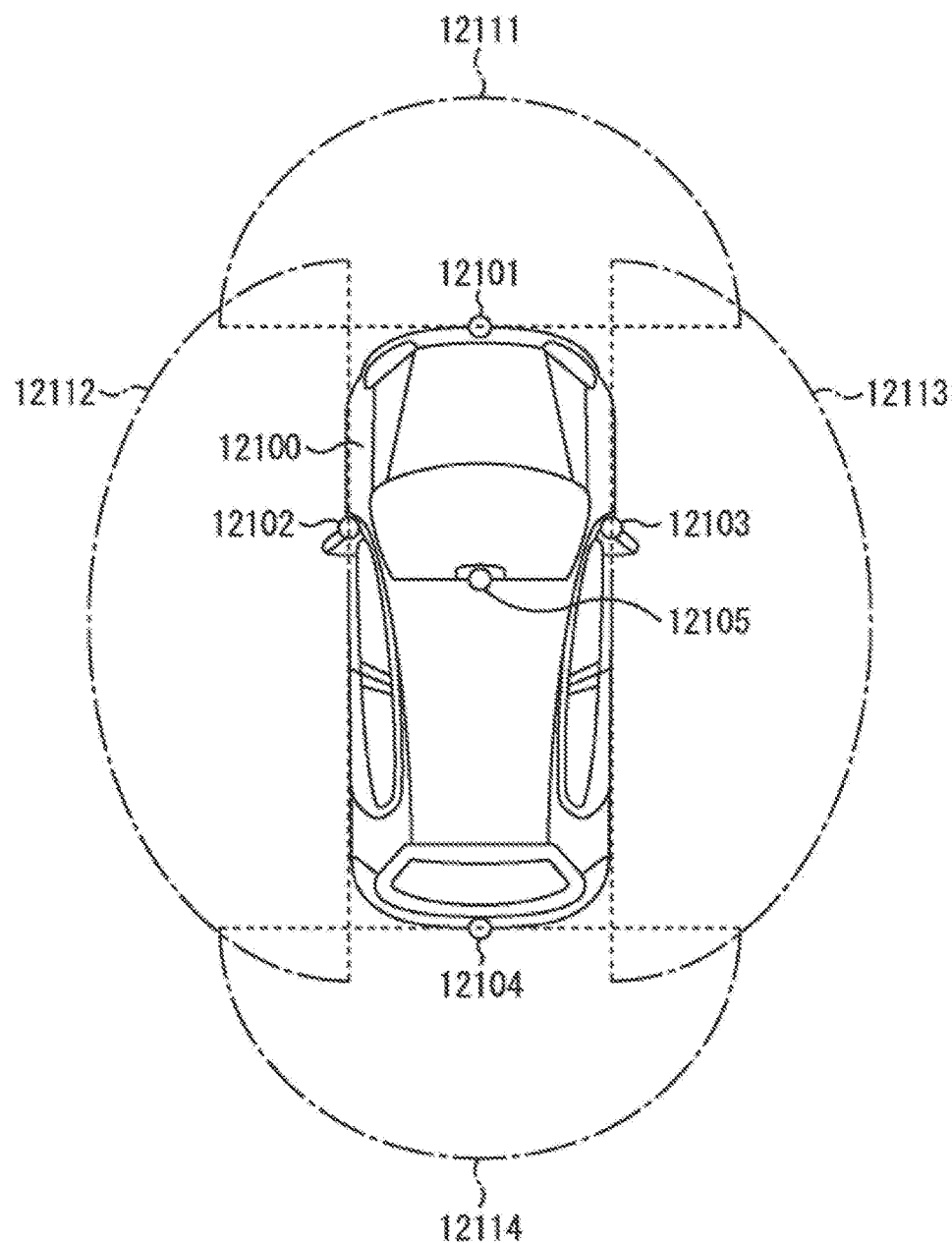

IMAGING DEVICE, IMAGING SYSTEM, AND IMAGING METHOD

This application is a continuation application of U.S. patent application Ser. No. 17/735,612, filed on May 3, 2022, which is a continuation application of U.S. patent application Ser. No. 16/970,066, filed on Aug. 14, 2020, now U.S. Pat. No. 11,343,427, which is a U.S. National Phase of International Patent Application No. PCT/JP2019/004036 filed on Feb. 5, 2019, which claims priority benefit of Japanese Patent Application No. JP 2018-029771 filed in the Japan Patent Office on Feb. 22, 2018. Each of the above-referenced applications is hereby incorporated herein by reference in its entirety.

TECHNICAL FIELD

The present disclosure relates to an imaging device, imaging system, and imaging method for an imaging operation.

BACKGROUND ART

For example, in a case where there is a problem, some imaging devices detect the problem (e.g., PTL 1).

CITATION LIST

Patent Literature

PTL 1: Japanese Unexamined Patent Application Publication No. 2002-027196

SUMMARY OF THE INVENTION

In this way, in a case where there is a problem, an imaging device is desirably able to detect the problem.

It is desirable to provide an imaging device, imaging system, and imaging method each of which, in a case where there is a problem, is able to detect the problem.

An imaging device according to an embodiment of the present disclosure includes: an imaging unit; a data generator; and a flag generation section. The imaging unit is configured to perform an imaging operation. The data generator is configured to generate first power supply voltage data corresponding to a first power supply voltage. The first power supply voltage is supplied to the imaging unit. The flag generation section is configured to generate a flag signal for the first power supply voltage by comparing the first power supply voltage data and first reference data.

Here, the "imaging device" is not limited to a so-called image sensor alone, but includes an electronic apparatus such as a digital camera or a smartphone having an imaging function.

An imaging system according to an embodiment of the present disclosure includes: an imaging device; and a processing device. The imaging device is mounted on a vehicle, and is configured to generate an image by imaging a region around the vehicle. The processing device is mounted on the vehicle, and is configured to execute a process regarding a function of controlling the vehicle on the basis of the image. The imaging device includes an imaging unit, a data generator, and a flag generation section. The imaging unit is configured to perform an imaging operation. The data generator is configured to generate first power supply voltage data corresponding to a first power supply voltage. The first power supply voltage is supplied to the imaging unit. The flag generation section is configured to generate a flag signal for the first power supply voltage by comparing the first power supply voltage data and first reference data. The processing device is configured to either notify a driver or restrict the function of controlling the vehicle, or both notify the driver and restrict the function of controlling the vehicle on the basis of the flag signal.

An imaging method according to an embodiment of the present disclosure includes: performing an imaging operation; generating first power supply voltage data corresponding to a first power supply voltage; and generating a flag signal for the first power supply voltage by comparing the first power supply voltage data and first reference data. The first power supply voltage is supplied when the imaging operation is performed.

In the imaging device, imaging system, and imaging method according to the respective embodiments of the present disclosure, the imaging operation is performed and the first power supply voltage data corresponding to the first power supply voltage is generated. The first power supply voltage data and the first reference data are then compared to generate the flag signal for the first power supply voltage.

In the imaging device, imaging system, and imaging method according to the respective embodiments of the present disclosure, the first power supply voltage data corresponding to the first power supply voltage is generated, and the first power supply voltage data and the first reference data are compared to generate the flag signal. This allows a problem to be detected. It is to be noted that the effects described here are not necessarily limited, but any of effects described in the present disclosure may be included.

BRIEF DESCRIPTION OF DRAWING

FIG. 1 is a block diagram illustrating a configuration example of an imaging device according to an embodiment of the present disclosure.

FIG. 2 is a circuit diagram illustrating a configuration example of a pixel array illustrated in FIG. 1.

FIG. 3 is an explanatory diagram illustrating a configuration example of the pixel array illustrated in FIG. 1.

FIG. 4 is a circuit diagram illustrating a configuration example of a readout unit illustrated in FIG. 1.

FIG. 5 is a circuit diagram illustrating a configuration example of a voltage sensor illustrated in FIG. 1.

FIG. 6 is a block diagram illustrating a configuration example of a voltage determination unit illustrated in FIG. 1.

FIG. 7 is another explanatory diagram illustrating an operation example of a calculation section illustrated in FIG. 6.

FIG. 8A is another explanatory diagram illustrating an operation example of the calculation section illustrated in FIG. 6.

FIG. 8B is an explanatory diagram illustrating another operation example of the calculation section illustrated in FIG. 6.

FIG. 9 is an explanatory diagram illustrating an operation example of a determination section illustrated in FIG. 6.

FIG. 10 is an explanatory diagram illustrating a configuration example of a circuit that outputs an error flag signal illustrated in FIG. 1.

FIG. 11 is an explanatory diagram illustrating an example of an error flag signal illustrated in FIG. 10.

FIG. 12 is an explanatory diagram illustrating an example of a circuit layout of the imaging device illustrated in FIG. 1.

FIG. 13 is an explanatory diagram illustrating a configuration example of the imaging device illustrated in FIG. 1.

FIG. 14 is an explanatory diagram illustrating an example of another circuit layout of the imaging device illustrated in FIG. 1.

FIG. 15 is a timing chart illustrating an operation example of the imaging device illustrated in FIG. 1.

FIG. 16 is a timing waveform diagram illustrating an operation example of the imaging device illustrated in FIG. 1.

FIG. 17A is another timing waveform diagram illustrating an operation example of the imaging device illustrated in FIG. 1.

FIG. 17B is another timing waveform diagram illustrating an operation example of the imaging device illustrated in FIG. 1.

FIG. 18A is an explanatory diagram illustrating an operation state of the imaging device illustrated in FIG. 1.

FIG. 18B is an explanatory diagram illustrating another operation state of the imaging device illustrated in FIG. 1.

FIG. 18C is an explanatory diagram illustrating another operation state of the imaging device illustrated in FIG. 1.

FIG. 19 is an explanatory diagram illustrating an example of image composition in the imaging device illustrated in FIG. 1.

FIG. 20 is a timing waveform diagram illustrating an example of a voltage detection operation in the imaging device illustrated in FIG. 1.

FIG. 21A is an explanatory diagram illustrating an operation example of the voltage sensor in the voltage detection operation illustrated in FIG. 20.

FIG. 21B is another explanatory diagram illustrating an operation example of the voltage sensor in the voltage detection operation illustrated in FIG. 20.

FIG. 22 is a flowchart illustrating an example of a calibration process.

FIG. 23 is a block diagram illustrating a configuration example of an imaging device according to a modification example.

FIG. 24 is a circuit diagram illustrating a configuration example of a dummy pixel illustrated in FIG. 23.

FIG. 25 is a circuit diagram illustrating a configuration example of a readout unit illustrated in FIG. 23.

FIG. 26 is a block diagram illustrating a configuration example of an imaging device according to another modification example.

FIG. 27 is a block diagram illustrating a configuration example of an imaging device according to another modification example.

FIG. 28 is a block diagram illustrating a configuration example of a voltage sensor according to another modification example.

FIG. 29 is a timing waveform diagram illustrating an example of a voltage detection operation according to another modification example.

FIG. 30A is an explanatory diagram illustrating an operation example of the voltage sensor in the voltage detection operation illustrated in FIG. 29.

FIG. 30B is another explanatory diagram illustrating an operation example of the voltage sensor in the voltage detection operation illustrated in FIG. 29.

FIG. 31 is a block diagram illustrating a configuration example of an imaging device according to another modification example.

FIG. 32 is a circuit diagram illustrating a configuration example of an imaging pixel illustrated in FIG. 31.

FIG. 33 is an explanatory diagram illustrating a configuration example of a pixel array illustrated in FIG. 31.

FIG. 34 is a timing waveform diagram illustrating an operation example of the imaging device illustrated in FIG. 31.

FIG. 35 is another timing waveform diagram illustrating an operation example of the imaging device illustrated in FIG. 31.

FIG. 36 is a block diagram illustrating a configuration example of an imaging device according to another modification example.

FIG. 37 is an explanatory diagram illustrating an implementation example of an imaging device according to another modification example.

FIG. 38 is an explanatory diagram illustrating a usage example of the imaging device.

FIG. 39 is a block diagram depicting an example of schematic configuration of a vehicle control system.

FIG. 40 is a diagram of assistance in explaining an example of installation positions of an outside-vehicle information detecting section and an imaging section.

MODES FOR CARRYING OUT THE INVENTION

The following describes embodiment of the present disclosure in detail with reference to the drawings. It is to be noted that description is given in the following order.

1. Embodiment
2. Usage Example of Imaging Device
3. Example of Application to Mobile Body 1. Embodiment Configuration Example FIG. 1 illustrates a configuration example of an imaging device (imaging device 1) according to an embodiment. The imaging device 1 includes a pixel array 9, a scanning unit 10, a readout unit 20, an imaging controller 30, a signal processor 40, and a storage unit 8.

The imaging device 1 is supplied with three power supply voltages VDD (power supply voltages VDDH, VDDM, and VDDL) as described below, and the imaging device 1 operates on the basis of these power supply voltages VDD. The power supply voltage VDDH is a power supply voltage that is chiefly supplied to an analog circuit in the imaging device 1, and is, for example, 3.3 V. The power supply voltage VDDM is a power supply voltage that is chiefly supplied to an input/output buffer of the imaging device 1, and is, for example, 1.8 V. The power supply voltage VDDL is a power supply voltage that is chiefly supplied to a logical circuit in the imaging device 1, and is, for example, 1.1 V.

The pixel array 9 includes a plurality of imaging pixels P1 arranged in a matrix. The imaging pixels P1 each include a photodiode, and generate a pixel voltage VP for the imaging pixel P1.

FIG. 2 illustrates a configuration example of the imaging pixel P1. The pixel array 9 includes a plurality of control lines TGLL, a plurality of control lines FDGL, a plurality of control lines RSTL, a plurality of control lines FCGL, a plurality of control lines TGSL, a plurality of control lines SELL, and a plurality of signal lines SGL. The control lines TGLL each extend in the horizontal direction (lateral direction in FIG. 1), and a signal STGL is applied to the control line TGLL by the scanning unit 10. The control lines FDGL each extend in the horizontal direction, and a signal SFDG is applied to the control line FDGL by the scanning unit 10. The control lines RSTL each extend in the horizontal direction, and a signal SRST is applied to the control line RSTL by the scanning unit 10. The control lines FCGL each extend in the horizontal direction, and a signal SFCG is applied to the control line FCGL by the scanning unit 10. The control lines TGSL each extend in the horizontal direction, and a signal STGS is applied to the control line TGSL by the scanning unit 10. The control lines SELL each extend in the horizontal direction, and a signal SSEL is applied to the control line SELL by the scanning unit 10. The signal lines SGL each extend in the vertical direction (longitudinal direction in FIG. 1), and are each coupled to the readout unit 20.

The imaging pixel P1 includes a photodiode PD1, a transistor TGL, a photodiode PD2, a transistor TGS, a capacity element FC, transistors FCG, RST, and FDG, a floating diffusion FD, and transistors AMP and SEL. Each of the transistors TGL, TGS, FCG, RST, FDG, AMP, and SEL is an N-type MOS (Metal Oxide Semiconductor) transistor in this example.

The photodiode PD1 is a photoelectric conversion element that generates and accumulates electric charges in the amount corresponding to the amount of received light. A light reception region where the photodiode PD1 is able to receive light is wider than a light reception region where the photodiode PD2 is able to receive light. The photodiode PD1 has the anode grounded, and the cathode coupled to the source of the transistor TGL.

The transistor TGL has the gate coupled to the control line TGLL, the source coupled to the cathode of the photodiode PD1, and the drain coupled to the floating diffusion FD.

The photodiode PD2 is a photoelectric conversion element that generates and accumulates electric charges in the amount corresponding to the amount of received light. A light reception region where the photodiode PD2 is able to receive light is narrower than a light reception region where the photodiode PD1 is able to receive light. The photodiode PD2 has the anode grounded, and the cathode coupled to the source of the transistor TGS.

The transistor TGS has the gate coupled to the control line TGSL, the source coupled to the cathode of the photodiode PD2, and the drain coupled to one end of the capacity element FC and the source of the transistor FCG.

The capacity element FC has the one end coupled to the drain of the transistor TGS and the source of the transistor FCG, and the other end supplied with the power supply voltage VDDH.

The transistor FCG has the gate coupled to the control line FCGL, the source coupled to the one end of the capacity element FC and the drain of the transistor TGS, and the drain coupled to the source of the transistor RST and the drain of the transistor FDG.

The transistor RST has the gate coupled to the control line RSTL, the drain supplied with the power supply voltage VDDH, and the source coupled to the drains of the transistors FCG and FDG.

The transistor FDG has the gate coupled to the control line FDGL, the drain coupled to the source of the transistor RST and the drain of the transistor FCG, and the source coupled to the floating diffusion FD.

The floating diffusion FD accumulates electric charges supplied from the photodiodes PD1 and PD2, and includes, for example, a diffusion layer formed on a surface of a semiconductor substrate. FIG. 2 illustrates the floating diffusion FD by using a symbol of a capacity element.

The transistor AMP has the gate coupled to the floating diffusion FD, the drain supplied with the power supply voltage VDDH, and the source coupled to the drain of the transistor SEL.

The transistor SEL has the gate coupled to the control line SELL, the drain coupled to the source of the transistor AMP, and the source coupled to the signal line SGL.

This configuration electrically couples the imaging pixel P1 to the signal line SGL by turning on the transistor SEL on the basis of the signal SSEL applied to the control line SELL in the imaging pixel P1. This couples the transistor AMP to a current source 23 (described below) of the readout unit 20, and the transistor AMP operates as a so-called source follower. The imaging pixel P1 then outputs, as a signal SIG, the pixel voltage VP corresponding to the voltage of the floating diffusion FD to the signal line SGL. Specifically, the imaging pixel P1 sequentially outputs eight pixel voltages VP (VP1 to VP8) in eight periods (conversion periods T1 to T8) within a so-called horizontal period H as described below.

FIG. 3 illustrates an example of the arrangement of the photodiodes PD1 and PD2 in the pixel array 9. In FIG. 3, "R" represents a red color filter, "G" represents a green color filter, and "B" represents a blue color filter. In each imaging pixel P1, the photodiode PD2 is formed on the upper right of the photodiode PD1. Color filters of the same color are formed on the two photodiodes PD1 and PD2 in each imaging pixel P1. In this example, the photodiode PD1 has an octagonal shape, and the photodiode PD2 has a quadrangular shape. As illustrated in this diagram, a light reception region where the photodiode PD1 is able to receive light is wider than a light reception region where the photodiode PD2 is able to receive light.

The scanning unit 10 (FIG. 1) sequentially drives the imaging pixels P1 in the pixel array 9 in units of pixel lines L on the basis of an instruction from the imaging controller 30. This scanning unit 10 operates on the basis of the power supply voltage VDDH and power supply voltage VDDL of the three supplied power supply voltages VDD. The scanning unit 10 includes an address decoder 11, a logic section 12, and a driver section 13.

The address decoder 11 selects the pixel line L in the pixel array 9 on the basis of an address signal supplied from the imaging controller 30. The pixel line L corresponds to the address indicated by that address signal. The logic section 12 generates signals STGL1, SFDG1, SRST1, SFCG1, STGS1, and SSEL1 corresponding to the respective pixel lines L on the basis of an instruction from the address decoder 11. The driver section 13 respectively generates the signals STGL, SFDG, SRST, SFCG, STGS, and SSEL corresponding to the respective pixel lines L on the basis of the signals STGL1, SFDG1, SRST1, SFCG1, STGS1, and SSEL1 corresponding to the respective pixel lines L.

The readout unit 20 performs AD conversion on the basis of the signal SIG supplied from the pixel array 9 via the signal line SGL, thereby generating an image signal DATAO. The readout unit 20 operates on the basis of the power supply voltage VDDH and power supply voltage VDDL of the three supplied power supply voltages VDD.

FIG. 4 illustrates a configuration example of the readout unit 20. It is to be noted that FIG. 4 also illustrates the imaging controller 30 and the signal processor 40 in addition to the readout unit 20. The readout unit 20 includes a plurality of AD (Analog to Digital) conversion sections ADC (AD conversion sections ADC[0], ADC[1], ADC[2], . . . ), a plurality of switch sections SW (switch sections SW[0], SW[1], SW[2], . . . ), and a bus wiring line BUS.

The AD conversion sections ADC each perform AD conversion on the basis of the signal SIG supplied from the pixel array 9 to convert the voltage of the signal SIG into a digital code CODE. The plurality of AD conversion sections ADC is provided in association with the plurality of signal lines SGL. Specifically, the 0th AD conversion section ADC[0] is provided in association with a 0th signal line SGL[0], the first AD conversion section ADC[1] is provided in association with a first signal line SGL[1], and the second AD conversion section ADC[2] is provided in association with a second signal line SGL[2].

In addition, the AD conversion section ADC also has a function of converting the voltage of a signal SIGV supplied from a voltage sensor 33 (described below) of the imaging controller 30 to the digital code CODE by performing AD conversion in a vertical blanking period (blanking period T20 described below) on the basis of the signal SIGV.

The AD conversion sections ADC each include capacity elements 21 and 22, transistors 28 and 29, the current source 23, a comparator 24, a counter 25, and a latch 26. The capacity element 21 has one end supplied with a reference signal REF and the other end coupled to the positive input terminal of the comparator 24. This reference signal REF is generated by a reference signal generation unit 31 (described below) of the imaging controller 30, and has a so-called ramp waveform in which a voltage level gradually decreases with the lapse of time in the eight periods (conversion periods T1 to T8) for performing AD conversion as described below. The capacity element 22 has one end coupled to the signal line SGL and the other end coupled to the negative input terminal of the comparator 24. The transistors 28 and 29 are N-type MOS transistors. The transistor 28 has the gate supplied with the signal SIGV, the drain supplied with the power supply voltage VDDH, and the source coupled to the drain of the transistor 29. The transistor 28 has the back gate coupled to the source in this example. The transistor 29 has the gate supplied with a control signal SSELV, the drain coupled to the source of the transistor 28, and the source coupled to one end of the capacity element 22. The current source 23 allows a current having a predetermined current value to flow from the signal line SGL to the ground. The comparator 24 compares the input voltage at the positive input terminal and the input voltage at the negative input terminal, and outputs a result of the comparison as a signal CMP. The comparator 24 operates on the basis of the power supply voltage VDDH. The comparator 24 has the positive input terminal supplied with the reference signal REF via the capacity element 21, and the negative input terminal supplied with the signal SIG via the capacity element 22. This comparator 24 also has a function of making a zero adjustment that causes the positive input terminal and the negative input terminal to be electrically coupled in a predetermined period described below. The counter 25 performs a counting operation of counting the pulses of a clock signal CLK supplied from the imaging controller 30 on the basis of the signal CMP and control signal CC supplied from the comparator 24. The latch 26 retains a count value CNT as the digital code CODE having a plurality of bits. The count value CNT is obtained by the counter 25. The counter 25 and the latch 26 each operate on the basis of the power supply voltage VDDL.

The switch sections SW each supply the bus wiring line BUS with the digital code CODE outputted from the AD conversion section ADC on the basis of a control signal SSW supplied from the imaging controller 30. The plurality of switch sections SW is provided in association with the plurality of AD conversion sections ADC. Specifically, the 0th switch section SW[0] is provided in association with the 0th AD conversion section ADC[0], the first switch section SW[1] is provided in association with the first AD conversion section ADC[1], and the second switch section SW[2] is provided in association with the second AD conversion section ADC[2].

The switch sections SW each include the same number of transistors as the number of bits of the digital code CODE in this example. These transistors are controlled to be turned on and off on the basis of the respective bits of the control signals SSW (control signals SSW[0], SSW[1], SSW[2], . . . ) supplied from the imaging controller 30. Specifically, for example, turning on the respective transistors on the basis of the control signal SSW[0] causes the 0th switch section SW[0] to supply the digital code CODE outputted from the 0th AD conversion section ADC[0] to the bus wiring line BUS. Similarly, for example, turning on the respective transistors on the basis of the control signal SSW[1] causes the first switch section SW[1] to supply the digital code CODE outputted from the first AD conversion section ADC[1] to the bus wiring line BUS. The same applies to the other switch sections SW.

The bus wiring line BUS includes a plurality of wiring lines, and transmits the digital codes CODE outputted from the AD conversion sections ADC. The readout unit 20 uses this bus wiring line BUS to sequentially transfer the plurality of digital codes CODE supplied from the AD conversion sections ADC to the signal processor 40 as the image signals DATAO (data transfer operation).

The imaging controller 30 (FIG. 1) supplies control signals to the scanning unit 10, the readout unit 20, and the signal processor 40, and controls the operations of these circuits, thereby controlling the operation of the imaging device 1. Specifically, the imaging controller 30 supplies, for example, the scanning unit 10 with an address signal, thereby performing control to cause the scanning unit 10 to sequentially drive the imaging pixels P1 in the pixel array 9 in units of the pixel lines L. In addition, the imaging controller 30 supplies the readout unit 20 with the reference signal REF, the clock signal CLK, the control signal CC, and the control signals SSW (control signals SSW[0], SSW[1], SSW[2], . . . ), thereby performing control to cause the readout unit 20 to generate the image signal DATAO on the basis of the signals SIG and SIGV. In addition, the imaging controller 30 supplies a control signal to the signal processor 40 to control the operation of the signal processor 40. The imaging controller 30 operates on the basis of the power supply voltage VDDH and power supply voltage VDDL of the three supplied power supply voltages VDD. A logical circuit in the imaging controller 30 operates on the basis of the power supply voltage VDDL. The imaging controller 30 includes the reference signal generation unit 31, a reference voltage generation unit 32, and the voltage sensor 33.

The reference signal generation unit 31 generates the reference signal REF. The reference signal REF has a so-called ramp waveform in which a voltage level gradually decreases with the lapse of time in eight periods (conversion periods T1 to T8) for performing AD conversion. The reference signal generation unit 31 then supplies the generated reference signal REF to each of the plurality of AD conversion sections ADC of the readout unit 20. The reference signal generation unit 31 operates on the basis of the power supply voltage VDDH.

The reference voltage generation unit 32 is a so-called band gap voltage reference circuit, and generates a voltage Vbgr that is a reference voltage. The reference voltage generation unit 32 then supplies this voltage Vbgr to each of various circuits in the imaging device 1. The reference voltage generation unit 32 operates on the basis of the power supply voltage VDDH.

The voltage sensor 33 generates the signal SIGV. The signal SIGV includes a voltage corresponding to the power supply voltage VDDH, a voltage corresponding to the power supply voltage VDDM, a voltage corresponding to the power supply voltage VDDL, and a voltage corresponding to the voltage Vbgr.

FIG. 5 illustrates a configuration example of the voltage sensor 33. It is to be noted that FIG. 5 also illustrates the AD conversion section ADC[0] of the readout unit 20 in addition to the voltage sensor 33. The voltage sensor 33 includes resistor circuit sections RH, RR, RM, and RL, switches SWH, SWR, SRM, and SWL, a selector ASEL, and an amplifier AMPV.

Each of the resistor circuit sections RH, RR, RM, and RL includes a plurality of (four in this example) resistance elements coupled in series. The resistor circuit section RH has one end supplied with the power supply voltage VDDH, and the other end grounded. The resistor circuit section RH then outputs the voltage obtained by multiplying the power supply voltage VDDH by "¾", and the voltage obtained by multiplying the power supply voltage VDDH by "½" in this example. The resistor circuit section RR has one end supplied with the voltage Vbgr, and the other end grounded. The resistor circuit section RR then outputs the voltage obtained by multiplying the voltage Vbgr by "¾", and the voltage obtained by multiplying the voltage Vbgr by "½" in this example. The resistor circuit section RM has one end supplied with the power supply voltage VDDM, and the other end grounded. The resistor circuit section RM then outputs the voltage obtained by multiplying the power supply voltage VDDM by "¾", and the voltage obtained by multiplying the power supply voltage VDDM by "½" in this example. The resistor circuit section RL has one end supplied with the power supply voltage VDDL, and the other end grounded. The resistor circuit section RL then outputs the voltage obtained by multiplying the power supply voltage VDDL by "¾", and the voltage obtained by multiplying the power supply voltage VDDL by "½" in this example.

On the basis of a control signal SELSW generated by the imaging controller 30, the switch SWH selects one of the voltage obtained by multiplying the power supply voltage VDDH by "¾" and the voltage obtained by multiplying the power supply voltage VDDH by "½", and outputs the selected voltage. On the basis of a control signal SELSW generated by the imaging controller 30, the switch SWR selects one of the voltage obtained by multiplying the voltage Vbgr by "¾" and the voltage obtained by multiplying the voltage Vbgr by "½", and outputs the selected voltage. On the basis of a control signal SELSW generated by the imaging controller 30, the switch SWM selects one of the voltage obtained by multiplying the power supply voltage VDDM by "¾" and the voltage obtained by multiplying the power supply voltage VDDM by "½", and outputs the selected voltage. On the basis of a control signal SELSW generated by the imaging controller 30, the switch SWL selects one of the voltage obtained by multiplying the power supply voltage VDDL by "¾" and the voltage obtained by multiplying the power supply voltage VDDL by "½", and outputs the selected voltage.

On the basis of a control signal SASEL generated by the imaging controller 30, the selector ASEL selects one of the voltages supplied from the switches SWH, SWR, SWM, and SWL, and outputs the selected voltage.

The amplifier AMPV amplifies the voltage supplied from the selector ASEL, and outputs the amplified voltage as the signal SIGV. The amplifier AMPV operates on the basis of the power supply voltage VDDH.

Such a configuration causes the voltage sensor 33 to generate the signal SIGV including a voltage corresponding to the power supply voltage VDDH, a voltage corresponding to the power supply voltage VDDM, a voltage corresponding to the power supply voltage VDDL, and a voltage corresponding to the voltage Vbgr. The voltage sensor 33 then supplies the generated signal SIGV to each of the plurality of AD conversion sections ADC of the readout unit 20.

The signal processor 40 performs signal processing on the image signal DATA0. The signal processor 40 operates on the basis of the power supply voltage VDDL of the three supplied power supply voltages VDD. The signal processor 40 includes an image processing unit 41 and a voltage determination unit 42.

The image processing unit 41 performs predetermined image processing on an image indicated by the image signal DATA0. The predetermined image processing includes, for example, an image composition process. In the image composition process, the image processing unit 41 generates four images PIC (images PIC1, PIC2, PIC3, and PIC4) on the basis of the eight digital codes CODE (digital codes CODE1 to CODER) supplied from the readout unit 20 and obtained in the eight periods (conversion periods T1 to T8) for performing AD conversion. The image processing unit 41 then combines the four images PIC to generate one captured image PICA. The image processing unit 41 then outputs this captured image PICA as an image signal DATA.

The voltage determination unit 42 generates respective voltage codes VCODE (voltage codes VCODEH, VCODEM, VCODEL, and VCODOR) indicating the voltage values of the power supply voltages VDDH, VDDM, and VDDL, and the voltage Vbgr, and confirms whether or not the respective voltage values of the power supply voltages VDDH, VDDM, and VDDL, and voltage Vbgr fall within predetermined voltage ranges, thereby generating an error flag signal XERR.

FIG. 6 illustrates a configuration example of the voltage determination unit 42. It is to be noted that FIG. 6 also illustrates the storage unit 8 in addition to the voltage determination unit 42. The voltage determination unit 42 includes a calculation section 43 and a determination section 44.

The calculation section 43 generates the four respective voltage codes VCODE (voltage codes VCODEH, VCODEM, VCODEL, and VCODOR) indicating the voltage values of the power supply voltages VDDH, VDDM, and VDDL, and voltage Vbgr on the basis of the digital code CODE included in the image signal DATA0. The digital code CODE included in the image signal DATA0 is obtained in the vertical blanking period on the basis of the signal SIGV. Specifically, the calculation section 43 performs a calculation process on the basis of a plurality of digital values VALV for the power supply voltages VDDH obtained from the plurality of AD conversion sections ADC, thereby generating a voltage code VCODE1 having a predetermined code system. In this code system, the voltage code VCODE1 is expressed, for example, as the value obtained by multiplying the voltage value by "100". Specifically, in a case where the voltage value of the power supply voltage VDDH is "3.3 V", the value indicated by the voltage code VCODE1 is "3300". When generating the voltage code VCODE1, the calculation section 43 generates the voltage code VCODE1 on the basis of a calibration parameter PCAL (described below) stored in the storage unit 8. The calculation section 43 then obtains the average value of the values indicated by the plurality of voltage codes VCODE1 to generate the one voltage code VCODE. The calculation section 43 outputs the voltage code VCODE generated in this way as the voltage code VCODEH corresponding to the power supply voltage VDDH. Similarly, the calculation section 43 generates the voltage code VCODEM corresponding to the power supply voltage VDDM, generates the voltage code VCODEL corresponding to the power supply voltage VDDL, and generates the voltage code VCODER corresponding to the voltage Vbgr. The following describes a process for the power supply voltage VDDH in detail as an example, but the same applies to processes for the power supply voltages VDDM and VDDL, and voltage Vbgr. It is to be noted that it is desirable that the average value obtained by the calculation section 43 be an average value serving as an arithmetic mean, but a geometric mean, a weighted mean, a harmonic mean, or the like may also be applied.

FIG. 7 schematically illustrates an example of the calculation process by the calculation section 43. Each voltage of the signal SIGV generated by the voltage sensor 33 may deviate from a desired voltage because of a so-called manufacturing variation, the impedance of the power supply wiring line in the imaging device 1, or the like. In this case, as illustrated in FIG. 7, the voltage code VCODE1 also deviates from a desired code. For example, the inspection device then supplies the imaging device 1 with the power supply voltage VDDH set at a predetermined voltage VDDH1 (e.g., 3.1 V) in an inspection process before the shipment of the imaging device 1, and causes a nonvolatile memory 8A (described below) of the storage unit 8 to store, in advance, the voltage code VCODE generated at this time by the imaging device 1 and an ideal voltage code corresponding to the voltage VDDH1. Similarly, the inspection device supplies the imaging device 1 with the power supply voltage VDDH set at a predetermined voltage VDDH2 (e.g., 3.5 V), and causes the nonvolatile memory 8A (described below) of the storage unit 8 to store, in advance, the voltage code VCODE generated at this time by the imaging device 1 and an ideal voltage code corresponding to the voltage VDDH2. The calculation section 43 then obtains the calibration parameter PCAL on the basis of these kinds of information stored in the storage unit 8, and performs a calculation process by using this calibration parameter PCAL from this time onward, thereby generating the voltage code VCODE1. This allows the calculation section 43 to obtain the voltage code VCODE1 by using a more desirably conversion characteristic as illustrated by the thick line in FIG. 7. The calculation section 43 performs such a calculation process on the basis of the digital codes CODE obtained from the plurality of AD conversion sections ADC, thereby generating the plurality of voltage codes VCODE1.

The calculation section 43 then obtains the average value of the values indicated by the plurality of voltage codes VCODE1 to generate the one voltage code VCODE. The plurality of AD conversion sections ADC performs AD conversion in the blanking period on the basis of the one signal SIGV, and the values indicated by the plurality of voltage codes VCODE1 are thus expected to be substantially the same. However, for example, in a case where a certain AD conversion section ADC (AD conversion section ADCA) of the plurality of AD conversion sections ADC is broken, the value indicated by the voltage code VCODE1 (voltage code VCODE1A) generated on the basis of the digital codes CODE generated by the AD conversion sections ADC is sometimes greatly different from the value indicated by another voltage code VCODE1. In addition, for example, the value indicated by a certain voltage code VCODE1 (voltage code VCODE1A) may also be sometimes greatly different from the value indicated by another voltage code VCODE1 because of characteristic variations caused by so-called manufacturing variations in the plurality of AD conversion sections ADC. Accordingly, for example, in a case where the value of a certain voltage code VCODE1 (voltage code VCODE1A) greatly deviates from the values of the plurality of voltage codes VCODE1 other than the voltage code VCODE1A, the calculation section 43 performs, for example, interpolation calculation by using the voltage codes VCODE1 for the AD conversion sections ADC adjacent to the AD conversion section ADCA for the voltage code VCODE1A as illustrated in FIG. 8A, thereby correcting the voltage code VCODE1A. The calculation section 43 then obtains the average value of the values indicated by all the voltage codes VCODE1 including the corrected voltage code VCODE1A to generate the one voltage code VCODE. The calculation section 43 then outputs the voltage code VCODE generated in this way as the voltage code VCODEH corresponding to the power supply voltage VDDH.

It is to be noted that this is not limitative. In a case where the value of a certain voltage code VCODE1 (voltage code VCODE1A) greatly deviates from the values of the plurality of voltage codes VCODE1 other than the value of the voltage code VCODE1A, the calculation section 43 may obtain the average value of the values indicated by the plurality of voltage codes VCODE1 other than the voltage code VCODE1A of all the voltage codes VCODE1 as illustrated in FIG. 8B, thereby generating the one voltage code VCODE.

In this way, the calculation section 43 generates the voltage code VCODEH corresponding to the power supply voltage VDDH, generates the voltage code VCODEM corresponding to the power supply voltage VDDM, generates the voltage code VCODEL corresponding to the power supply voltage VDDL, and generates the voltage code VCODER corresponding to the voltage Vbgr.

The determination section 44 (FIG. 6) confirms whether or not the respective voltage values of the power supply voltages VDDH, VDDM, and VDDL, and voltage Vbgr fall within predetermined voltage ranges, respectively, on the basis of the voltage codes VCODEH, VCODEM, VCODEL, and VCODER obtained by the calculation section 43, thereby generating the error flag signal XERR. The determination section 44 includes comparators 45 and 46, and an OR circuit 47.

The comparator 45 compares the value indicated by the voltage code VCODE and a threshold THmax. The comparator 45 has the positive input terminal supplied with the voltage code VCODE, and the negative input terminal supplied with the threshold THmax. This configuration causes the comparator 45 to output "1" in a case where the value indicated by the voltage code VCODE is greater than the threshold THmax, and output "0" in a case where the value indicated by the voltage code VCODE is less than or equal to the threshold THmax.

The comparator 46 compares the value indicated by the voltage code VCODE and a threshold THmin. The comparator 46 has the positive input terminal supplied with the threshold THmin, and the negative input terminal supplied with the voltage code VCODE. This configuration causes the comparator 46 to output "1" in a case where the value indicated by the voltage code VCODE is less than the threshold THmin, and output "0" in a case where the value indicated by the voltage code VCODE is greater than or equal to the threshold THmin.

The OR circuit 47 obtains the logical OR (OR) of an output signal of the comparator 45 and an output signal of the comparator 46, and outputs a result thereof as a signal S47.

This configuration causes the determination section 44 to set the signal S47 at "1" in a case where the value indicated by the voltage code VCODE is less than the threshold THmin and in a case where the value indicated by the voltage code VCODE is greater than the threshold THmax, and set the signal S47 at "0" in a case where the value indicated by the voltage code VCODE is greater than or equal to the threshold THmin and less than or equal to the threshold THmax.

In this way, the determination section 44 confirms whether or not the values (voltage values) indicated by the four voltage codes VCODE fall within predetermined ranges set for the four respective voltage codes VCODE. Specifically, the determination section 44 confirms whether or not the value (voltage value) indicated by the voltage code VCODEH for the power supply voltage VDDH falls within a predetermined range for the power supply voltage VDDH. The determination section 44 confirms whether or not the value (voltage value) indicated by the voltage code VCODEM for the power supply voltage VDDM falls within a predetermined range for the power supply voltage VDDM. The determination section 44 confirms whether or not the value (voltage value) indicated by the voltage code VCODEL for the power supply voltage VDDL falls within a predetermined range for the power supply voltage VDDL. The determination section 44 confirms whether or not the value (voltage value) indicated by the voltage code VCODER for the voltage Vbgr falls within a predetermined range for the voltage Vbgr.

FIG. 9 illustrates an example of a process by the determination section 44 for the power supply voltage VDDH. The determination section 44 determines it as normal that the power supply voltage VDDH is greater than or equal to a voltage Vmin (e.g., 3.1 V) corresponding to the threshold THmin and less than or equal to a voltage Vmax (e.g., 3.5 V) corresponding to the threshold THmax, and determines that there is a problem in a case where the power supply voltage VDDH is lower than the voltage Vmin or the power supply voltage VDDH is higher than Vmax. The same applies to the power supply voltages VDDM and VDDL, and the voltage Vbgr. The imaging device 1 then sets the error flag signal XERR at the low level (active) in a case where the determination section 44 determines that one or more of the power supply voltages VDDH, VDDM, and VDDL, and voltage Vbgr have problems.

The storage unit 8 (FIG. 1) stores various kinds of setting information used in the imaging device 1. The storage unit 8 includes the nonvolatile memory 8A and registers 8B, 8C, and 8D as illustrated in FIG. 6. The nonvolatile memory 8A stores various kinds of setting information used in the imaging device 1. The register 8B stores information used for the calculation section 43 to perform a process. The register 8C stores the four thresholds THmax for the power supply voltages VDDH, VDDM, and VDDL, and voltage Vbgr. The register 8D stores the four thresholds THmin for the power supply voltages VDDH, VDDM, and VDDL, and voltage Vbgr. The pieces of information stored by the registers 8B, 8C, and 8D are read out from the nonvolatile memory 8A, for example, when the imaging device 1 is powered on.

FIG. 10 illustrates a configuration example of a circuit that outputs the error flag signal XERR in the imaging device 1. The imaging device 1 is supplied with the three power supply voltages VDD (power supply voltages VDDH, VDDM, and VDDL) and three ground voltages VSS (ground voltages VSSH, VSSM, and VSSL). The power supply voltage VDDH is, for example, 3.3 V, the power supply voltage VDDM is, for example, 1.8 V, and the power supply voltage VDDL is, for example, 1.1 V. All of the ground voltages VSSH, VSSM, and VSSL are 0 V.

The signal processor 40 includes a buffer BF. The buffer BF generates a signal XERR1. The signal processor 40 is supplied with the power supply voltage VDDL and the ground voltage VSSL, and the buffer BF thus operates on the basis of the power supply voltage VDDL and the ground voltage VSSL. The signal XERR1 generated by the buffer BF is a logical signal that transitions between the power supply voltage VDDL and the ground voltage VSSL. The signal XERR1 is a signal of the so-called negative logic that is set at the high level (power supply voltage VDDL) in a case where there is no problem confirmed in the voltage determination unit 42 of the signal processor 40, and set at the low level (ground voltage VSSL) in a case where a problem is confirmed.

The imaging device 1 includes an output buffer BFOUT. The output buffer BFOUT generates the error flag signal XERR on the basis of the signal XERR1, and outputs this error flag signal XERR via an output terminal TOUT. The output buffer BFOUT operates on the basis of the power supply voltage VDDM and the ground voltage VSSM. The error flag signal XERR is a logical signal that transitions between the power supply voltage VDDM and the ground voltage VSSM. As illustrated in FIGS. 10 and 11, the error flag signal XERR is a signal of the so-called negative logic that is set at the high level (power supply voltage VDDM) in a case where there is no problem confirmed in the voltage determination unit 42 of the signal processor 40, and set at the low level (ground voltage VSSM) in a case where a problem is confirmed.

Next, the implementation of the imaging device 1 is described. In the imaging device 1, a block illustrated in FIG. 1 may be formed, for example, on one semiconductor substrate or a plurality of semiconductor substrates.

FIG. 12 illustrates an example of a circuit layout in a case in which the imaging device 1 is formed on one semiconductor substrate 200. The pixel array 9 is formed on the semiconductor substrate 200. Then, in FIG. 12, the scanning unit 10 is formed on the left of the pixel array 9, and the readout unit 20 and a peripheral circuit portion 201 are formed above the pixel array 9 in this order. The peripheral circuit portion 201 corresponds to a circuit other than the reference voltage generation unit 32 and the voltage sensor 33 of the plurality of circuits included in the imaging controller 30, and the signal processor 40. The voltage determination unit 42 is formed in the right region inside the region where this peripheral circuit portion 201 is formed. The reference voltage generation unit 32 is formed on the left of the readout unit 20, and the voltage sensor 33 is formed on the left of the peripheral circuit portion 201. In addition, there is a terminal unit 202 at the left end of the semiconductor substrate 200. The terminal unit 202 is provided with a plurality of pad electrodes side by side. Similarly, there is provided a terminal unit 203 at the right end of the semiconductor substrate 200. The terminal unit 203 is provided with a plurality of pad electrodes side by side.

A power supply terminal TVDDH, a ground terminal TVSSH, a power supply terminal TVDDM, a ground terminal TVSSM, a power supply terminal TVDDL, a ground terminal TVSSL, and a terminal TVbgr are disposed, for example, at positions in the terminal unit 202 close to the reference voltage generation unit 32 and the voltage sensor 33. The power supply terminal TVDDH is supplied with the power supply voltage VDDH. The ground terminal TVSSH is supplied with the ground voltage VSSH. The power supply terminal TVDDM is supplied with the power supply voltage VDDM. The ground terminal TVSSM is supplied with the ground voltage VSSM. The power supply terminal TVDDL is supplied with the power supply voltage VDDL. The ground terminal TVSSL is supplied with the ground voltage VSSL. The voltage Vbgr is outputted from the terminal TVbgr. This allows, for example, the wiring lines between the power supply terminals TVDDH, TVDDM, and TVDDL and ground terminals TVSSH, TVSSM, and TVSSL, and the voltage sensor 33 to suppress a drop in voltages in the imaging device 1, and it is thus possible to increase the voltage detection accuracy.

In addition, the output terminal TOUT is disposed, for example, at a position in the terminal unit 203 close to the voltage determination unit 42. The error flag signal XERR is outputted from the output terminal TOUT. This makes it possible to shorten the signal path between the output terminal TOUT and the voltage determination unit 42.

FIG. 13 illustrates an example in which two semiconductor substrates 301 and 302 are coupled in a case where the imaging device 1 is formed on the two semiconductor substrates 301 and 302. In this example, the semiconductor substrates 301 and 302 are stacked and coupled to each other through a plurality of vias 303. For example, it is possible to form the pixel array 9 on the semiconductor substrate 301. In addition, it is possible to from the scanning unit 10, the readout unit 20, the imaging controller 30, the signal processor 40, and the storage unit 8 on the semiconductor substrate 302. For example, the plurality of control lines TGLL, FDGL, RSTL, FCGL, TGSL, and SELL in the semiconductor substrate 301 is coupled to the scanning unit 10 in the semiconductor substrate 302 through a plurality of vias 303A. In addition, for example, the plurality of signal lines SGL in the semiconductor substrate 301 is coupled to the readout unit 20 in the semiconductor substrate 302 through a plurality of vias 303B. It is to be noted that the layout of the respective circuits is not limited thereto. For example, the scanning unit 10 may be formed on the semiconductor substrate 301.

FIG. 14 illustrates an example of a circuit layout on the semiconductor substrate 302. A peripheral circuit portion 311 is formed around the middle of the semiconductor substrate 302. This peripheral circuit portion 311 corresponds to a circuit other than the reference voltage generation unit 32 and the voltage sensor 33 of the plurality of circuits included in the imaging controller 30, and the signal processor 40. The voltage determination unit 42 is formed in the upper right region inside the region where this peripheral circuit portion 311 is formed. Then, in FIG. 14, the scanning unit 10 is formed on the left of this peripheral circuit portion 311, and the readout unit 20 is formed above the peripheral circuit portion 311. In addition, the reference voltage generation unit 32 and the voltage sensor 33 are formed on the upper left of the peripheral circuit portion 311. In addition, there is a terminal unit 312 at the left end of the semiconductor substrate 302. The terminal unit 312 is provided with a plurality of pad electrodes side by side. Similarly, there is provided a terminal unit 313 at the right end of the semiconductor substrate 302. The terminal unit 313 is provided with a plurality of pad electrodes side by side.

The power supply terminals TVDDH, TVDDM, and TVDDL, the ground terminals TVSSH, TVSSM, and TVSSL, and the terminal TVbgr are disposed, for example, at positions in the terminal unit 312 close to the reference voltage generation unit 32 and the voltage sensor 33. This allows, for example, the wiring lines between the power supply terminals TVDDH, TVDDM, and TVDDL and ground terminals TVSSH, TVSSM, and TVSSL, and the voltage sensor 33 to suppress a drop in voltages in the imaging device 1, and it is thus possible to increase the voltage detection accuracy.

In addition, the output terminal TOUT is disposed, for example, at a position in the terminal unit 313 close to the voltage determination unit 42. This makes it possible to shorten the signal path between the output terminal TOUT and the voltage determination unit 42.

Here, the scanning unit 10 and the pixel array 9 correspond to a specific example of an "imaging unit" in the present disclosure. The readout unit 20 and the calculation section 43 correspond to a specific example of a "data generator" in the present disclosure. The readout unit 20 corresponds to a specific example of a "conversion unit" in the present disclosure. The calculation section 43 corresponds to a specific example of a "calculation section" in the present disclosure. The determination section 44 corresponds to a specific example of a "flag generation section" in the present disclosure. The error flag signal XERR corresponds to a specific example of a "flag signal" in the present disclosure. The voltage sensor 33 corresponds to a specific example of a "voltage detection unit" in the present disclosure. Any one of the power supply voltages VDDH, VDDM, and VDDL corresponds to a specific example of a "first power supply voltage" in the present disclosure. Any one of the voltage codes VCODEH, VCODEM, and VCODEL corresponds to a specific example of "first power supply voltage data" in the present disclosure. The threshold THmax or the threshold THmin corresponds to a specific example of "first reference data" in the present disclosure.

[Operations and Workings]

Subsequently, the operations and workings of the imaging device 1 according to the present embodiment are described.

(Overview of Overall Operation)

First, an overview of the overall operation of the imaging device 1 is described with reference to FIGS. 1 and 4. The scanning unit 10 subsequentially the imaging pixels P1 in the pixel array 9 in units of the pixel lines L. The imaging pixel P1 sequentially outputs the eight pixel voltages VP1 to VP8 in the eight conversion periods T1 to T8. The respective AD conversion sections ADC of the readout unit 20 perform AD conversion on the basis of these eight pixel voltages VP1 to VP8, and output the eight digital codes CODE (digital codes CODE1 to CODE8). The image processing unit 41 of the signal processor 40 generates the four images PIC (images PIC1 to PIC4) on the basis of the eight digital codes CODE1 to CODE8 included in the image signal DATAO. The signal processor 40 then combines these four images PIC to generate the one captured image PICA, and outputs this captured image PICA as the image signal DATA. In addition, the AD conversion section ADC converts the voltage of the signal SIGV supplied from the voltage sensor 33 of the imaging controller 30 to the digital code CODE by performing AD conversion in the vertical blanking period on the basis of the signal SIGV. The voltage determination unit 42 of the signal processor 40 generates the voltage code VCODEH corresponding to the power supply voltage VDDH, the voltage code VCODEM corresponding to the power supply voltage VDDM, the voltage code VCODEL corresponding to the power supply voltage VDDL, and the voltage code VCODER corresponding to the voltage Vbgr on the basis of the digital code CODE included in the image signal DATAO. The digital code CODE is obtained on the basis of the signal SIGV in the vertical blanking period. In addition, the voltage determination unit 42 confirms whether or not the values (voltage values) indicated by the four voltage codes VCODE (voltage codes VCODEH, VCODEM, VCODEL, and VCODER) fall within predetermined ranges set for the four respective voltage codes VCODE. The imaging device 1 then sets the error flag signal XERR at the low level (active) in a case where it is determined that one or more of the power supply voltages VDDH, VDDM, and VDDL, and voltage Vbgr have problems.

(Detailed Operation)

In the imaging device 1, each imaging pixel P1 in the pixel array 9 accumulates electric charges in accordance with the amount of received light, and outputs the pixel voltage VP as the signal SIG. The following describes this operation in detail.

FIG. 15 illustrates an example of an operation of scanning the plurality of imaging pixels P1 in the pixel array 9.

The imaging device 1 performs accumulation start driving D1 on the plurality of imaging pixels P1 in the pixel array 9 in order from top in the vertical direction in the period from a timing t0 to a timing t1. Specifically, the scanning unit 10 sets on the transistors TGL, RST, FDG, TGS, and FCG, for example, in order from top in the vertical direction in units of the pixel lines L in a predetermined period in the horizontal period H, and then turns off these transistors. This causes the plurality of respective imaging pixels P1 to accumulate electric charges in an accumulation period T10 before readout driving D2 is performed.

The imaging device 1 then performs the readout driving D2 on the plurality of imaging pixels P1 in order from top in the vertical direction in the period from a timing t10 to a timing t11. This causes the plurality of respective imaging pixels P1 to sequentially output the eight pixel voltages VP1 to VP8. The readout unit 20 performs AD conversion on the basis of these eight respective pixel voltages VP1 to VP8, and output the eight respective digital codes CODE (digital codes CODE1 to CODE8).

The signal processor 40 then generates the four images PIC (images PIC1, PIC2, PIC3, and PIC4) on the basis of the eight digital codes CODE1 to CODE8 supplied from the readout unit 20, and combines these four images PIC to generate the one captured image PICA.

The imaging device 1 repeats the accumulation start driving D1 and readout driving D2 like these. Specifically, as illustrated in FIG. 15, the imaging device 1 performs the accumulation start driving D1 in the period from a timing t2 to a timing t3, and performs the readout driving D2 in the period from a timing t12 to a timing t13. In addition, the imaging device 1 performs the accumulation start driving D1 in the period from a timing t4 to a timing t5, and performs the readout driving D2 in the period from a timing t14 to a timing t15.

(Regarding Readout Driving D2)

Next, the readout driving D2 is described in detail. The following focuses on an imaging pixel P1A of the plurality of imaging pixels P1, and describes an operation related to this imaging pixel P1A in detail.

FIGS. 16, 17A, and 17B each illustrate an operation example of the imaging device 1. In FIG. 16, (A) indicates the waveform of a horizontal synchronization signal XHS, (B) indicates the waveform of the signal SSEL to be supplied to the imaging pixel P1A, (C) indicates the waveform of the signal SRST to be supplied to the imaging pixel P1A, (D) indicates the waveform of the signal SFDG to be supplied to the imaging pixel P1A, (E) indicates the waveform of the signal STGL to be supplied to the imaging pixel P1A, (F) indicates the waveform of the signal SFCG to be supplied to the imaging pixel P1A, (G) indicates the waveform of the signal STGS to be supplied to the imaging pixel P1A, (H) indicates the waveform of the reference signal REF, (I) indicates the waveform of the signal SIG to be outputted from the imaging pixel P1A, and (J) indicates an operation of the counter 25 in the AD conversion section ADC coupled to the imaging pixel P1A. FIG. 17A illustrates the first half of the operation illustrated in FIGS. 16, and 17B illustrates the second half of the operation illustrated in FIG. 16. In (H) and (I) of FIG. 16, (H) and (I) of FIG. 17A, and (H) and (I) of FIG. 17B, the waveforms of the respective signals are plotted on the same voltage axis. The reference signals REF in (H) of FIG. 16, (H) of FIG. 17A, and (H) of FIG. 17B each indicate the waveform at the positive input terminal of the comparator 24, and the signals SIG in (I) of FIG. 16, (I) of FIG. 17A, and (I) of FIG. 17B each indicate the waveform at the negative input terminal of the comparator 24. In addition, in (J) of FIG. 16, (J) of FIG. 17A, and (J) of FIG. 17B, oblique lines indicate that the counter 25 is performing the counting operation.

FIGS. 18A, 18B, and 18C each illustrate the state of the imaging pixel P1A. In FIGS. 18A, 18B, and 18C, the transistors TGL, RST, FDG, TGS, FCG, and SEL are illustrated by using the switches corresponding to the operation states of the transistors.

In the readout driving D2, the imaging controller 30 sets the control signal SSELV (FIG. 4) at the low level. This causes the transistor 29 to be turned off in each of the plurality of AD conversion sections ADC in the readout unit 20. This causes the AD conversion section ADC to perform AD conversion on the basis of the signal SIG supplied via the signal line SGL.

In the imaging device 1, the scanning unit 10 first selects the pixel line L including the imaging pixel P1A by using the signal SSEL in a certain horizontal period H, and electrically couples the imaging pixel P1A to the signal line SGL corresponding to the imaging pixel P1A. The scanning unit 10 then controls the operations of the imaging pixel P1A by using the signals SRST, SFDG, STGL, SFCG, and STGS, and the imaging pixel P1A sequentially outputs the eight pixel voltages VP1 to VP8 in the eight conversion periods T1 to T8. The respective AD conversion sections ADC of the readout unit 20 then perform AD conversion on the basis of these eight pixel voltages VP1 to VP8, and output the eight respective digital codes CODE. The following describes this operation in detail.

First, when the horizontal period H starts at the timing t1, the scanning unit 10 changes the voltage of the signal SSEL from the low level to the high level at the timing t2 ((B) of FIG. 17A). This causes the transistor SEL to be turned on in the imaging pixel P1A, and the imaging pixel P1A is electrically coupled to the signal line SGL.

In the period up to the timing t11, the scanning unit 10 sets both of the signals SRST and SFDG at the high level ((C) and (D) of FIG. 17A). This causes the transistors FDG and RST to be both turned on in the imaging pixel P1A, and the voltage of the floating diffusion FD is set at the power supply voltage VDD to reset the floating diffusion FD.

(Operation from Timing t11 to Timing t21)

Next, at the timing t11, the scanning unit 10 changes the voltage of the signal SFDG from the high level to the low level ((D) of FIG. 17A). This causes the transistor FDG to be turned off in the imaging pixel P1A. Next, at the timing t12, the scanning unit 10 changes the voltage of the signal SRST from the high level to the low level ((C) of FIG. 17A). This causes the transistor RST to be turned off in the imaging pixel P1A. Next, at the timing t13, the scanning unit 10 changes the voltage of the signal SFDG from the low level to the high level ((D) of FIG. 17A). This causes the transistor FDG to be turned on in the imaging pixel P1A. In addition, in the period from the timing t13 to the timing t14, the comparator 24 performs a zero adjustment that causes the positive input terminal and the negative input terminal to be electrically coupled.

Next, at the timing t14, the comparator 24 finishes the zero adjustment, and electrically uncouples the positive input terminal and the negative input terminal. At this timing t14, the reference signal generation unit 31 then changes the voltage of the reference signal REF to a voltage V1 ((H) of FIG. 17A).

This causes the transistors FDG and SEL to be turned on in the imaging pixel P1A as illustrated in FIG. 18A, and all the other transistors are turned off. The transistor FDG is on, and the floating diffusion FD and the transistor FDG are thus included in a combined capacitor. This combined capacitor functions as a conversion capacitor that converts an electric charge into a voltage in the imaging pixel P1A. In the imaging pixel P1A, the transistor FDG is on in this way. The conversion capacitor in the imaging pixel P1A therefore has a large capacity value, resulting in low efficiency of converting electric charges to voltages. This conversion capacitor retains electric charges at the time of resetting the floating diffusion FD in the period before the timing t12. The imaging pixel P1A outputs the pixel voltage VP (pixel voltage VP1) corresponding to the voltage of the floating diffusion FD at this time.

Next, in the period (conversion period T1) from the timing t15 to a timing t17, the AD conversion section ADC performs AD conversion on the basis of this pixel voltage VP1. Specifically, at the timing t15, the imaging controller 30 starts to generate the clock signal CLK. Concurrently with this, the reference signal generation unit 31 starts to decrease the voltage of the reference signal REF from the voltage V1 by a predetermined degree of change ((H) of FIG. 17A). Accordingly, the counter 25 of the AD conversion section ADC starts a counting operation ((J) of FIG. 17A).

At a timing t16, the voltage of the reference signal REF then falls below the voltage (pixel voltage VP1) of the signal SIG ((H) and (I) of FIG. 17A). Accordingly, the comparator 24 of the AD conversion section ADC changes the voltage of the signal CMP. As a result, the counter 25 stops the counting operation ((J) of FIG. 17A). The count value CNT of the counter 25 stopping the counting operation corresponds to the pixel voltage VP1. The AD conversion section ADC performs AD conversion in this way on the basis of the pixel voltage VP1, and the latch 26 of the AD conversion section ADC outputs the count value CNT of the counter 25 as the digital code CODE1 ((J) of FIG. 17A).

At the timing t17, the imaging controller 30 then stops generating the clock signal CLK at the end of the conversion period T1, the reference signal generation unit 31 stops changing the voltage of the reference signal REF ((H) of FIG. 17A), and the counter 25 resets the count value CNT.

(Operation from Timing t21 to Timing t31) Next, at the timing t21, the scanning unit 10 changes the voltage of the signal SFDG from the high level to the low level ((D) of FIG. 17A). This causes the transistor FDG to be turned off in the imaging pixel P1A. In addition, in the period from the timing t21 to the timing t22, the comparator 24 performs a zero adjustment that causes the positive input terminal and the negative input terminal to be electrically coupled.

Next, at the timing t22, the comparator 24 finishes the zero adjustment, and electrically uncouples the positive input terminal and the negative input terminal. At this timing t22, the reference signal generation unit 31 then changes the voltage of the reference signal REF to the voltage V1 ((H) of FIG. 17A).

This causes the transistor SEL to be turned on in the imaging pixel P1A as illustrated in FIG. 18B, and all the other transistors are turned off. In the imaging pixel P1A, the transistor FDG is off in this way. The conversion capacitor in the imaging pixel P1A therefore has a small capacity value, resulting in high efficiency of converting electric charges to voltages. This conversion capacitor retains electric charges at the time of resetting the floating diffusion FD in the period before the timing t12. The imaging pixel P1A outputs the pixel voltage VP (pixel voltage VP2) corresponding to the voltage of the floating diffusion FD at this time.

Next, in the period (conversion period T2) from the timing t23 to a timing t25, the AD conversion section ADC performs AD conversion on the basis of this pixel voltage VP2. This operation is similar to the operation in the conversion period T1. The AD conversion section ADC performs AD conversion on the basis of the pixel voltage VP2, and the latch 26 of the AD conversion section ADC outputs the count value CNT of the counter 25 as a digital code CODE2 ((J) of FIG. 17A).

(Operation from Timing t31 to Timing t41)

Next, at a timing t31, the scanning unit 10 changes the voltage of the signal STGL from the low level to the high level ((E) of FIG. 17A). This causes the transistor TGL to be turned on in the imaging pixel P1A. This causes the electric charges generated in the photodiode PD1 to be transferred to the floating diffusion FD. In addition, at this timing t31, the reference signal generation unit 31 changes the voltage of the reference signal REF to the voltage V1 ((H) of FIG. 17A).

Next, at a timing t32, the scanning unit 10 changes the voltage of the signal STGL from the high level to the low level ((E) of FIG. 17A). This causes the transistor TGL to be turned off in the imaging pixel P1A.

This causes the transistor FDG to be turned off in the imaging pixel P1A as illustrated in FIG. 18B. The conversion capacitor in the imaging pixel P1A therefore has a small capacity value, resulting in high efficiency of converting electric charges to voltages. This conversion capacitor retains the electric charges transferred from the photodiode PD1 from the timing t31 to the timing t32. The imaging pixel P1A outputs the pixel voltage VP (pixel voltage VP3) corresponding to the voltage of the floating diffusion FD at this time.

Next, in the period (conversion period T3) from the timing t33 to a timing t35, the AD conversion section ADC performs AD conversion on the basis of this pixel voltage VP3. This operation is similar to the operation in the conversion period T1. The AD conversion section ADC performs AD conversion on the basis of the pixel voltage VP3, and the latch 26 of the AD conversion section ADC outputs the count value CNT of the counter 25 as a digital code CODE3 ((J) of FIG. 17A). This digital code CODE3 corresponds to the digital code CODE2 that is also obtained when the conversion efficiency is high (conversion period T2).

(Operation from Timing t41 to Timing t51)

Next, at a timing t41, the scanning unit 10 changes the voltage of the signal SFDG from the low level to the high level, and changes the voltage of the signal STGL from the low level to the high level ((D) and (E) of FIG. 17A). This causes the transistors FDG and TGL to be both turned on in the imaging pixel P1A. In addition, at this timing t41, the reference signal generation unit 31 changes the voltage of the reference signal REF to the voltage V1 ((H) of FIG. 17A). Next, at a timing t42, the scanning unit 10 changes the voltage of the signal STGL from the high level to the low level ((E) of FIG. 17A). This causes the transistor TGL to be turned off in the imaging pixel PIA.

This causes the transistor FDG to be turned on in the imaging pixel P1A as illustrated in FIG. 18A, and the floating diffusion FD and the transistor FDG are thus included in a combined capacitor (conversion capacitor). The conversion capacitor in the imaging pixel P1A therefore has a large capacity value, resulting in low efficiency of converting electric charges to voltages. This conversion capacitor retains the electric charges transferred from the photodiode PD1 from the timing t31 to the timing t32 and from the timing t41 to the timing t42. The imaging pixel P1A outputs the pixel voltage VP (pixel voltage VP4) corresponding to the voltage of the floating diffusion FD at this time.

Next, in the period (conversion period T4) from the timing t43 to a timing t45, the AD conversion section ADC performs AD conversion on the basis of this pixel voltage VP4. This operation is similar to the operation in the conversion period T1. The AD conversion section ADC performs AD conversion on the basis of the pixel voltage VP4, and the latch 26 of the AD conversion section ADC outputs the count value CNT of the counter 25 as a digital code CODE4 ((J) of FIG. 17A). This digital code CODE4 corresponds to the digital code CODE1 that is also obtained when the conversion efficiency is low (conversion period T1).

(Operation from Timing t51 to Timing t61)

Next, at a timing t51, the scanning unit 10 changes the voltage of the signal SRST from the low level to the high level ((C) of FIG. 17B). This causes the transistor RST to be turned on in the imaging pixel P1A. The transistor FDG is on. This causes the voltage of the floating diffusion FD to be set at the power supply voltage VDD, and the floating diffusion FD is reset. Next, at a timing t52, the scanning unit 10 changes the voltage of the signal SRST from the high level to the low level ((C) of FIG. 17B). This causes the transistor RST to be turned off in the imaging pixel P1A. In addition, at this timing t52, the reference signal generation unit 31 changes the voltage of the reference signal REF to the voltage V1 ((H) of FIG. 17B).

Next, at a timing t53, the scanning unit 10 changes the voltage of the signal SFCG from the low level to the high level ((F) of FIG. 17B). This causes the transistor FCG to be turned on in the imaging pixel P1A. In addition, in the period from the timing t53 to a timing t54, the comparator 24 performs a zero adjustment that causes the positive input terminal and the negative input terminal to be electrically coupled.

Next, at the timing t54, the comparator 24 finishes the zero adjustment, and electrically uncouples the positive input terminal and the negative input terminal. In addition, at this timing t54, the reference signal generation unit 31 changes the voltage of the reference signal REF to the voltage V1 ((H) of FIG. 17A).

This causes the transistors FDG, FCG, and SEL to be turned on in the imaging pixel P1A as illustrated in FIG. 18C, and all the other transistors are turned off. The transistors FDG and FCG are both on. The floating diffusion FD, the transistors FDG and FCG, and the capacity element FC are thus included in a combined capacitor (conversion capacitor). This conversion capacitor retains the electric charges generated in the photodiode PD2 before the timing t53 and supplied to and accumulated in the capacity element FC via the transistor TGS. The imaging pixel P1A outputs the pixel voltage VP (pixel voltage VP5) corresponding to the voltage of the floating diffusion FD at this time.

Next, in the period (conversion period T5) from a timing t55 to a timing t57, the AD conversion section ADC performs AD conversion on the basis of this pixel voltage VP5. This operation is similar to the operation in the conversion period T1. The AD conversion section ADC performs AD conversion on the basis of the pixel voltage VP5, and the latch 26 of the AD conversion section ADC outputs the count value CNT of the counter 25 as a digital code CODE5 ((J) of FIG. 17B).

(Operation from Timing t61 to Timing t71)

Next, at a timing t61, the scanning unit 10 changes the voltage of the signal STGS from the low level to the high level ((G) of FIG. 17B). This causes the transistor TGS to be turned on in the imaging pixel P1A. This causes the electric charges generated in the photodiode PD2 to be transferred to the floating diffusion FD and the capacity element FC. In addition, at this timing t61, the reference signal generation unit 31 changes the voltage of the reference signal REF to the voltage V1 ((H) of FIG. 17B).

Next, at a timing t62, the scanning unit 10 changes the voltage of the signal STGS from the high level to the low level ((G) of FIG. 17B). This causes the transistor TGS to be turned off in the imaging pixel P1A.

This causes the transistors FDG and FCG to be both turned on in the imaging pixel P1A as illustrated in FIG. 18C, and the floating diffusion FD, the transistors FDG and FCG, and the capacity element FC are thus included in a combined capacitor (conversion capacitor). This conversion capacitor retains the electric charges transferred from the photodiode PD2 from the timing t61 to the timing t62 in addition to the electric charges generated in the photodiode PD2 before the timing t53 and supplied to and accumulated in the capacity element FC via the transistor TGS. The imaging pixel P1A outputs the pixel voltage VP (pixel voltage VP6) corresponding to the voltage of the floating diffusion FD at this time.

Next, in the period (conversion period T6) from a timing t63 to a timing t65, the AD conversion section ADC performs AD conversion on the basis of this pixel voltage VP6. This operation is similar to the operation in the conversion period T1. The AD conversion section ADC performs AD conversion on the basis of the pixel voltage VP6, and the latch 26 of the AD conversion section ADC outputs the count value CNT of the counter 25 as a digital code CODE6 ((J) of FIG. 17B). This digital code CODE6 corresponds to the digital code CODE5 obtained when the floating diffusion FD, the transistors FDG and FCG, and the capacity element FC are included in a combined capacitor.

(Operation from Timing t71 to Timing t81)

Next, in the period from a timing t71 to a timing t72, the comparator 24 performs a zero adjustment that causes the positive input terminal and the negative input terminal to be electrically coupled.

Next, at the timing t72, the comparator 24 finishes the zero adjustment, and electrically uncouples the positive input terminal and the negative input terminal. In addition, at this timing t72, the reference signal generation unit 31 changes the voltage of the reference signal REF to the voltage V1 ((H) of FIG. 17B).

This causes the transistors FDG and FCG to be both turned on in the imaging pixel P1A as illustrated in FIG. 18C, and the floating diffusion FD, the transistors FDG and FCG, and the capacity element FC are thus included in a combined capacitor (conversion capacitor). This conversion capacitor retains the electric charges transferred from the photodiode PD2 from the timing t61 to the timing t62 in addition to the electric charges generated in the photodiode PD2 before the timing t53 and supplied to and accumulated in the capacity element FC via the transistor TGS. The imaging pixel P1A outputs the pixel voltage VP (pixel voltage VP7) corresponding to the voltage of the floating diffusion FD at this time.

Next, in the period (conversion period T7) from a timing t73 to a timing t75, the AD conversion section ADC performs AD conversion on the basis of this pixel voltage VP7. This operation is similar to the operation in the conversion period T1. The AD conversion section ADC performs AD conversion on the basis of the pixel voltage VP7, and the latch 26 of the AD conversion section ADC outputs the count value CNT of the counter 25 as a digital code CODE7 ((J) of FIG. 17B).

(Operation from Timing t81 to Timing t7)

Next, at a timing t81, the scanning unit 10 changes the voltage of the signal SRST from the low level to the high level ((C) of FIG. 17B). This causes the transistor RST to be turned on in the imaging pixel P1A. The transistors FDG and FCG are on. The voltage of the floating diffusion FD and the voltage of the capacity element FC are thus set at the power supply voltage VDD, and the floating diffusion FD and the capacity element FC are reset.

Next, at a timing t82, the scanning unit 10 changes the voltage of the signal SFCG from the high level to the low level ((F) of FIG. 17B). This causes the transistor FCG to be turned off in the imaging pixel P1A.

Next, at a timing t83, the scanning unit 10 changes the voltage of the signal SRST from the high level to the low level ((C) of FIG. 17B). This causes the transistor RST to be turned off in the imaging pixel P1A.

Next, at a timing t84, the scanning unit 10 changes the voltage of the signal SFCG from the low level to the high level ((F) of FIG. 17B). This causes the transistor FCG to be turned on in the imaging pixel P1A. In addition, at this timing t84, the reference signal generation unit 31 changes the voltage of the reference signal REF to the voltage V1 ((H) of FIG. 17B).

This causes the transistors FDG and FCG to be both turned on in the imaging pixel P1A as illustrated in FIG. 18C, and the floating diffusion FD, the transistors FDG and FCG, and the capacity element FC are thus included in a combined capacitor (conversion capacitor). This conversion capacitor retains electric charges at the time of resetting the floating diffusion FD and the capacity element FC from the timing t81 to the timing t82. The imaging pixel P1A outputs the pixel voltage VP (pixel voltage VP8) corresponding to the voltage of the floating diffusion FD at this time.

Next, in the period (conversion period T8) from a timing t85 to a timing t87, the AD conversion section ADC performs AD conversion on the basis of this pixel voltage VP8. This operation is similar to the operation in the conversion period T1. The AD conversion section ADC performs AD conversion on the basis of the pixel voltage VP8, and the latch 26 of the AD conversion section ADC outputs the count value CNT of the counter 25 as the digital code CODE8 ((J) of FIG. 17B). This digital code CODE8 corresponds to the digital code CODE7 obtained when the floating diffusion FD, the transistors FDG and FCG, and the capacity element FC are included in a combined capacitor.

Next, at a timing t7, the scanning unit 10 changes the voltage of the signal SFDG from the high level to the low level, and changes the voltage of the signal SFCG from the high level to the low level ((D) and (F) of FIG. 17B). This causes the transistors FDG and FCG to be turned off in the imaging pixel P1A.

At a timing t8, the scanning unit 10 then changes the voltage of the signal SSEL from the high level to the low level ((B) of FIG. 17B). This causes the transistor SEL to be turned off in the imaging pixel P1A, and the imaging pixel P1A is electrically uncoupled from the signal line SGL.

Next, an image composition process by the image processing unit 41 of the signal processor 40 is described. The image processing unit 41 generates the four images PIC (images PIC1 to PIC4) on the basis of the digital codes CODE supplied from the readout unit 20. The image processing unit 41 then combines the four images PIC to generate the one captured image PICA.

FIG. 19 schematically illustrates the image composition process. The waveforms illustrated in (A) to (G) of FIG. 19 are similar to the waveforms illustrated in (A) to (G) of FIG. 16. As described with reference to FIGS. 16, 17A, and 17B, the readout unit 20 generates the digital code CODE1 on the basis of the operation in the period from the timing t11 to the timing t21, generates the digital code CODE2 on the basis of the operation in the period from the timing t21 to the timing t31, generates the digital code CODE3 on the basis of the operation in the period from the timing t31 to the timing t41, generates the digital code CODE4 on the basis of the operation in the period from the timing t41 to the timing t51, generates the digital code CODE5 on the basis of the operation in the period from the timing t51 to the timing t61, generates the digital code CODE6 on the basis of the operation in the period from the timing t61 to the t71, generates the digital code CODE7 on the basis of the operation in the period from the timing t71 to the timing t81, and generates the digital code CODE8 on the basis of the operation in the period from the timing t81 to the timing t7.

The image processing unit 41 generates a pixel value VAL1 on the basis of the digital code CODE2 and the digital code CODE3. Specifically, the image processing unit 41 subtracts the digital code CODE2 from the digital code CODE3 (CODE3−CODE2) to calculate the pixel value VAL1. That is, the imaging device 1 uses the principle of so-called correlated double sampling (CDS; Correlated double sampling) to calculate the pixel value VAL1 by using the digital code CODE2 corresponding to P-phase (Pre-Charge phase) data and the digital code CODE3 corresponding to D-phase (Data phase) data. In the imaging device 1, such correlated double sampling is performed, and it is thus possible to remove the noise component included in the pixel value VAL1. As a result, it is possible to increase the image quality of a captured image.

Similarly, the image processing unit 41 generates a pixel value VAL2 on the basis of the digital code CODE1 and the digital code CODE4. Specifically, the image processing unit 41 subtracts the digital code CODE1 from the digital code CODE4 (CODE4−CODE1) to calculate the pixel value VAL2. That is, the imaging device 1 uses the principle of correlated double sampling to calculate the pixel value VAL2 by using the digital code CODE1 corresponding to the P-phase data and the digital code CODE4 corresponding to the D-phase data.

Similarly, the image processing unit 41 generates a pixel value VAL3 on the basis of the digital code CODE5 and the digital code CODE6. Specifically, the image processing unit 41 subtracts the digital code CODE5 from the digital code CODE6 (CODE6−CODE5) to calculate the pixel value VAL3. That is, the imaging device 1 uses the principle of correlated double sampling to calculate the pixel value VAL3 by using the digital code CODE5 corresponding to the P-phase data and the digital code CODE6 corresponding to the D-phase data.

The image processing unit 41 then generates a pixel value VAL4 on the basis of the digital code CODE7 and the digital code CODE8. Specifically, the image processing unit 41 subtracts the digital code CODE8 from the digital code CODE7 (CODE7−CODE8) to calculate the pixel value VAL4. That is, the imaging device 1 uses the principle of so-called double data sampling (DDS; Double Data Sampling) to calculate the pixel value VAL4 by using the digital code CODE7 before resetting the floating diffusion FD and the capacity element FC and the digital code CODE8 after resetting the floating diffusion FD and the capacity element FC.

The image processing unit 41 then generates the image PIC1 on the basis of the pixel values VAL1 in all of the imaging pixels P1 in the pixel array 9, generates the image PIC2 on the basis of the pixel values VAL2 in all of the imaging pixels P1 in the pixel array 9, generates the image PIC3 on the basis of the pixel values VAL3 in all of the imaging pixels P1 in the pixel array 9, and generates the image PIC4 on the basis of the pixel values VAL4 in all of the imaging pixels P1 in the pixel array 9. The image processing unit 41 then combines these images PIC1 to PIC4 to generate the captured image PICA.

(Regarding Voltage Detection Operation)

In FIG. 15, for example, the blanking period T20 from the timing t11 to the timing t12 is a so-called vertical blanking period, and the imaging device 1 does not perform the readout driving D2. That is, in this period, the signal line SGL does not transmit the pixel voltage VP for the imaging pixel P1. The imaging device 1 uses this blanking period T20 to perform a voltage detection operation. The following describes this voltage detection operation in detail.

The AD conversion section ADC of the readout unit 20 performs AD conversion in a detection period M of the same length as that of the horizontal period H (FIG. 14) in the blanking period T20 on the basis of the signal SIGV. In the detection period M, the reference signal generation unit 31 and the readout unit 20 each perform an operation similar to that in the horizontal period H (FIG. 16). In this detection period M, the imaging controller 30 sets the control signal SSELV (FIG. 4) at the high level. This causes the transistor 29 to be turned on in each of the plurality of AD conversion sections ADC in the readout unit 20, and the signal corresponding to the signal SIGV generated by the voltage sensor 33 is supplied to the negative input terminal of the comparator 24 via the transistor 29 and the capacity element 22. In this way, the AD conversion section ADC performs AD conversion on the basis of the signal SIGV. In this example, the imaging device 1 performs a voltage detection operation in the period corresponding to the period from the timing t21 to the timing t41 in the horizontal period H (FIG. 16). The following describes an operation of detecting the power supply voltage VDDH in detail as an example. It is to be noted that the same applies to operations of detecting the power supply voltages VDDM and VDDL, and the voltage Vbgr.

FIG. 20 illustrates an example of the voltage detection operation in the imaging device 1. FIG. 20 corresponds to FIG. 17A illustrating the operation in the first half of the horizontal period H. In FIG. 20, (A) indicates the waveform of the reference signal REF, (B) indicates the waveform of the signal SIGV, and (C) indicates the operation of the counter 25 in the AD conversion section ADC. A timing t111 corresponds to the timing t11 in FIG. 17A, a timing t121 corresponds to the timing t12 in FIG. 17A, a timing t131 corresponds to the timing t13 in FIG. 17A, a timing t141 corresponds to the timing t41 in FIG. 17A, and a timing t151 corresponds to the timing t51 in FIG. 17A.

FIGS. 21A and 21B each illustrate an operation example of the voltage sensor 33 in the voltage detection operation. FIGS. 21A and 21B each illustrate the selector ASEL by using a switch indicating a coupling state. In this example, the selector ASEL selects a voltage supplied from the switch SWH on the basis of the control signal SASEL. It is to be noted that the selector ASEL switch selection targets in a time division manner on the basis of the control signal SASEL, thereby causing the imaging device 1 to perform operations of detecting the power supply voltages VDDH, VDDM, and VDDL, and voltage Vbgr in a time division manner.

(Operation from Timing t121 to Timing t131)

In the period from the timing t121 to the timing t131, the switch SWH of the voltage sensor 33 selects the voltage obtained by multiplying the power supply voltage VDDH by "¾", on the basis of the control signal SELSW as illustrated in FIG. 21A. The amplifier AMPV amplifies the voltage supplied from the switch SWH via the selector ASEL, and outputs the amplified voltage as the signal SIGV. This supplies the negative input terminal of the comparator 24 of the AD conversion section ADC with a voltage VDDH34 corresponding to the voltage obtained by multiplying the power supply voltage VDDH by "¾" ((B) of FIG. 20).

In the period from a timing t121 to a timing t122, the comparator 24 performs a zero adjustment that causes the positive input terminal and the negative input terminal to be electrically coupled.

Next, at the timing t122, the comparator 24 finishes the zero adjustment, and electrically uncouples the positive input terminal and the negative input terminal. At this timing t122, the reference signal generation unit 31 then changes the voltage of the reference signal REF to the voltage V1 ((A) of FIG. 20).

In the period (conversion period TA) from a timing t123 to a timing t125, the AD conversion section ADC then performs AD conversion on the basis of this voltage VDDH34. This operation is similar to the operation in the conversion period T2 of the horizontal period H (FIG. 17A). The AD conversion section ADC performs AD conversion on the basis of the voltage VDDH34, and the latch 26 of the AD conversion section ADC outputs the count value CNT of the counter 25 as a digital code CODEA ((C) of FIG. 20).

(Operation from Timing t131 to Timing t141)

In the period from the timing t131 to the timing t141, the switch SWH of the voltage sensor 33 selects the voltage obtained by multiplying the power supply voltage VDDH by "½", on the basis of the control signal SELSW as illustrated in FIG. 21B. The amplifier AMPV amplifies the voltage supplied from the switch SWH via the selector ASEL, and outputs the amplified voltage as the signal SIGV. This supplies the negative input terminal of the comparator 24 of the AD conversion section ADC with a voltage VDDH12 corresponding to the voltage obtained by multiplying the power supply voltage VDDH by "1/2" ((B) of FIG. 20).

In the period (conversion period TB) from a timing t132 to a timing t134, the AD conversion section ADC then performs AD conversion on the basis of this voltage VDDH12. This operation is similar to the operation in the conversion period T3 of the horizontal period H (FIG. 17A). The AD conversion section ADC performs AD conversion on the basis of the voltage VDDH12, and the latch 26 of the AD conversion section ADC outputs the count value CNT of the counter 25 as a digital code CODEB ((C) of FIG. 20).

Next, a process by the voltage determination unit 42 of the signal processor is described.

The calculation section 43 of the voltage determination unit 42 first calculates the digital value VALV on the basis of the digital codes CODEA and CODEB supplied from the readout unit 20. Specifically, the voltage determination unit 42 subtracts the digital code CODEA from the digital code CODEB (CODEB−CODEA) to calculate the digital value VALV. That is, the imaging device 1 uses the principle of so-called correlated double sampling to calculate the digital value VALV by using the digital code CODEA corresponding to the P-phase (Pre-Charge phase) data and the digital code CODEB corresponding to the D-phase (Data phase) data. The imaging device 1 performs such correlated double sampling, and it is thus possible to remove the noise component included in the digital value VALV. In this way, the voltage determination unit 42 calculates the plurality of digital values VALV on the basis of the digital codes CODEA and CODEB obtained from the plurality of AD conversion sections ADC.

Next, the calculation section 43 performs a calculation process by using the calibration parameter PCAL stored in the storage unit 8 on the basis of the digital value VALV, thereby generating the voltage code VCODE1 having a predetermined code system. In this way, the calculation section 43 generates the plurality of respective voltage codes VCODE1 on the basis of the plurality of digital values VALV obtained from the plurality of AD conversion sections ADC.

The calculation section 43 then obtains the average value of the values indicated by the plurality of voltage codes VCODE1 to generate the one voltage code VCODE. For example, in a case where the value of a certain voltage code VCODE1 (voltage code VCODE1A) greatly deviates from the values of the plurality of voltage codes VCODE1 other than the voltage code VCODE1A, for example, interpolation calculation is performed by using the voltage codes VCODE1 for the AD conversion sections ADC adjacent to the AD conversion section ADCA for the voltage code VCODE1A as illustrated in FIG. 8A, thereby correcting the voltage code VCODE1A. The calculation section 43 then obtains the average value of the values indicated by all the voltage codes VCODE1 including the corrected voltage code VCODE1A to generate the one voltage code VCODE. The calculation section 43 then outputs the voltage code VCODE generated in this way as the voltage code VCODEH corresponding to the power supply voltage VDDH.

The determination section 44 of the voltage determination unit 42 then confirms whether or not the value (voltage value) indicated by the voltage code VCODEH obtained in this way falls within a predetermined range. In a case where the value (voltage value) does not fall within the predetermined range, the imaging device 1 makes the error flag signal XERR active (low level).

(Regarding Calibration)

Each voltage of the signal SIGV generated by the voltage sensor 33 may deviate from a desired voltage because of a so-called manufacturing variation, the impedance of the power supply wiring line in the imaging device 1, or the like. In this case, as illustrated in FIG. 7, the voltage code VCODE1 also varies. Accordingly, the imaging device 1 is subjected, for example, to calibration in the inspection process before shipment. This makes it possible to increase the voltage detection accuracy of the imaging device 1. The following describes a calibration process in the inspection process in detail.

FIG. 22 illustrates an example of the calibration process in the inspection process. FIG. 22 illustrates a calibration process of the power supply voltage VDDH. The same applies to the power supply voltages VDDM and VDDL, and the voltage Vbgr.

The inspection device first sets the voltage of the power supply voltage VDDH at the voltage VDDH1 (e.g., 3.1 V), and causes the storage unit 8 to store the voltage code VCODEH generated by the imaging device 1, and an ideal voltage code corresponding to the voltage VDDH1 (step S101).

Next, the inspection device sets the voltage of the power supply voltage VDDH at the voltage VDDH2 (e.g., 3.5 V), and causes the storage unit 8 to store the voltage code VCODEH generated by the imaging device 1, and an ideal voltage code corresponding to the voltage VDDH2 (step S102).

Next, the calculation section 43 of the voltage determination unit 42 of the imaging device 1 generates the calibration parameter PCAL on the basis of the pieces of information stored in the storage unit 8 in steps S101 and S102 (step S103).

Accordingly, the calculation section 43 obtains the voltage code VCODE1 from this time onward by using the calibration parameter PCAL generated in step S103, and this allows the calculation section 43 to obtain the voltage code VCODE1 by using a more desirable conversion characteristic, for example, as illustrated by the thick line in FIG. 7. The calculation section 43 then obtains the average value of the values indicated by the plurality of voltage codes VCODE1 for the plurality of AD conversion sections ADC to generate the voltage code VCODE.

Next, the inspection device sets the voltage of the power supply voltage VDDH at the voltage VDDH1 (e.g., 3.1 V), acquires the voltage code VCODEH generated by the imaging device 1, and confirms that the voltage difference between the voltage value indicated by this voltage code VCODEH and the voltage value of this voltage VDDH1 falls within a permissible range (step S104).

Next, the inspection device sets the voltage of the power supply voltage VDDH at the voltage VDDH2 (e.g., 3.5 V), acquires the voltage code VCODEH generated by the imaging device 1, and confirms that the voltage difference between the voltage value indicated by this voltage code VCODEH and the voltage value of this voltage VDDH2 falls within a permissible range (step S105).

This completes the flow.

As described above, the imaging device 1 detects the three supplied power supply voltages VDD (power supply voltages VDDH, VDDM, and VDDL), confirms whether or not these power supply voltages VDD each fall within a predetermined range, and generates the error flag signal XERR on the basis of a result of the confirmation. This allows the imaging device 1 to notify, in a case where the power supply voltages VDD each get out of the predetermined range, an external device of the problem. As a result, this device is able to grasp, for example, in a case where the imaging operation of the imaging device 1 in itself has a problem, that the problem is caused by the power supply voltage VDD. In addition, in a case where the imaging operation of the imaging device 1 in itself has no problem, this device is able to adjust the voltage value of the power supply voltage VDD or stop the operation of the imaging device 1 on the basis of this error flag signal XERR, for example. This makes it possible to prevent the imaging device 1 from malfunctioning due to the power supply voltage VDD.

In addition, the imaging device 1 detects the voltage Vbgr generated by the reference voltage generation unit 32, confirms whether or not this voltage Vbgr falls within a predetermined range, and generates the error flag signal XERR on the basis of a result of the confirmation. This allows the imaging device 1 to notify, in a case where the voltage Vbgr gets out of the predetermined range, an external device of the problem. As a result, this device is able to stop the operation of the imaging device 1, for example, on the basis of this error flag signal XERR, and this makes it possible to prevent the imaging device 1 from malfunctioning due to the power supply voltage VDD.

In addition, the imaging device 1 performs the voltage detection operation in the blanking period T20 (vertical blanking period), and it is thus possible to perform voltage detection operation the while performing the imaging operation. Accordingly, for example, in a case where there is a problem in supplying the power supply voltage VDD, the imaging device 1 is able to detect the problem in a timely manner and issue a notification.

In addition, in the imaging device 1, the AD conversion section ADC performs AD conversion on the basis of the signal SIGV generated by the voltage sensor 33, thereby generating the digital code CODE. The voltage determination unit 42 generates the voltage code VCODE on the basis of this digital code CODE. The voltage determination unit 42 then determines on the basis of this voltage code VCODE whether or not the power supply voltages VDDH, VDDM, and VDDL, and the voltage Vbgr each fall within a predetermined range. This allows the imaging device 1 to make a determination as a digital value. Accordingly, for example, it is possible to increase the determination accuracy and reduce the circuit scale.

In addition, in the imaging device 1, the AD conversion section ADC that performs AD conversion on the basis of the pixel voltage VP performs AD conversion on the basis of the signal SIGV generated by the voltage sensor 33. This eliminates the necessity to provide a dedicated AD conversion section for performing the voltage detection operation, and it is thus possible to simplify the circuit configuration.

In addition, in the imaging device 1, the voltage determination unit 42 obtains the average value of the values indicated by the plurality of voltage codes VCODE1 on the basis of the plurality of voltage codes VCODE1 for the plurality of AD conversion sections ADC, thereby obtaining the one voltage code VCODE. This makes it possible to suppress, for example, the influence of characteristic variations caused by so-called manufacturing variations in the plurality of AD conversion sections ADC on the voltage codes VCODE in the imaging device 1. As a result, it is possible to increase the voltage detection accuracy of the imaging device 1.

In addition, for example, in a case where the value of a certain voltage code VCODE1 (voltage code VCODE1A) greatly deviates from the values of the plurality of voltage codes VCODE1 other than the voltage code VCODE1A, the imaging device 1 performs, for example, interpolation calculation by using the voltage codes VCODE1 for the AD conversion sections ADC adjacent to the AD conversion section ADCA for the voltage code VCODE1A as illustrated in FIG. 8A, thereby correcting the voltage code VCODE1A. This makes it possible to increase the voltage detection accuracy of the imaging device 1, for example, even in a case where one of the plurality of AD conversion sections ADC is broken.

In addition, in the imaging device 1, the readout unit 20 operates on the basis of the power supply voltage VDDH and the power supply voltage VDDL, and the voltage determination unit 42 operates on the basis of the power supply voltage VDDL. Accordingly, in a case where the imaging device 1 detects, for example, the voltage of the power supply voltage VDDM, these circuits do not operate on the basis of the power supply voltage VDDM. This makes it possible to more accurately detect a problem with the power supply voltage VDDM.

In addition, the imaging device 1 uses a signal of the so-called negative logic as the signal XERR1. Accordingly, for example, even in a case where there is a problem like the power supply voltage VDDL is not supplied to the signal processor 40 that generates the signal XERR1, the signal XERR1 is turned to the low level (ground voltage VSSL) in the imaging device 1, thereby making it possible to turning the error flag signal XERR to the low level. This makes it possible to issue a notification of the problem.

[Effects]

As described above, in the present embodiment, the three supplied power supply voltages VDDH, VDDM, and VDDL and voltage Vbgr are detected, it is confirmed whether or not these voltages each fall within a predetermined range, and an error flag signal is generated on the basis of a result of the confirmation. Accordingly, in a case where these voltages each get out of the predetermined range, it is possible to notify an external device of the problem.

In the present embodiment, the voltage detection operation is performed in the blanking period, and it is thus possible to perform the voltage detection operation while performing the imaging operation. Accordingly, for example, when there is a problem in supplying the power supply voltage, it is possible to detect the problem in a timely manner and issue a notification.

In the present embodiment, the AD conversion section performs AD conversion on the basis of the signal SIGV generated by the voltage sensor, thereby generating the digital code. The voltage determination unit generates the voltage code on the basis of this digital code. It is determined on the basis of this voltage code whether or not the power supply voltages VDDH, VDDM, and VDDL, and the voltage Vbgr each fall within a predetermined range. Accordingly, it is possible to make a determination as a digital value. This makes it possible to increase the determination accuracy, for example, and reduce the circuit scale.

In the present embodiment, the AD conversion section that performs AD conversion on the basis of the pixel voltage performs AD conversion on the basis of the signal SIGV generated by the voltage sensor, and it is thus possible to simplify the circuit configuration In the present embodiment, the voltage determination unit obtains the average value of the values indicated by the plurality of voltage codes on the basis of the plurality of voltage codes for the plurality of AD conversion sections, thereby obtaining the one voltage code. This makes it possible to increase the voltage detection accuracy.

In the present embodiment, in a case where the value of a certain voltage code greatly deviates from the values of a plurality of voltage codes other than the voltage code, the voltage codes for the AD conversion sections adjacent to the AD conversion section for the voltage code are used, for example, to perform interpolation calculation, thereby correcting the voltage code. This makes it possible to increase the voltage detection accuracy.

In the present embodiment, the readout unit operates on the basis of the power supply voltage VDDH and the power supply voltage VDDL, and the voltage determination unit operates on the basis of the power supply voltage VDDL. Accordingly, for example, in a case where the voltage of the power supply voltage VDDM is detected, it is possible to more accurately detect a problem with the power supply voltage VDDM.

Modification Example 1

In the above-described embodiment, as illustrated in FIGS. 4 and 5, the voltage sensor 33 directly supplies the signal SIGV to the AD conversion section ADC of the readout unit 20, but this is not limitative. Instead of this, for example, the signal SIGV may be supplied to the AD conversion section of the readout unit via the pixel array. The following describes the present modification example in detail with reference to some examples.

FIG. 23 illustrates a configuration example of an imaging device 1A according to the present modification example. The imaging device 1A includes a pixel array 9A, a readout unit 20A, and an imaging controller 30A.

The pixel array 9A is provided with an imaging pixel region RG1 and a dummy pixel region RG2. The plurality of imaging pixels P1 is disposed in the imaging pixel region RG1, and a plurality of dummy pixels P2 for one row is disposed in the dummy pixel region RG2. In this example, the dummy pixel region RG2 is disposed above the imaging pixel region RG1 in the vertical direction (longitudinal direction in FIG. 23).

FIG. 24 illustrates a configuration example of the dummy pixel P2 in the dummy pixel region RG2. The pixel array 9A includes a control line SIGVL and the control line SELL in the dummy pixel region RG2. The control line SIGVL extends in the horizontal direction (lateral direction in FIG. 24), and the control line SIGVL is supplied with the signal SIGV from the voltage sensor 33 of the imaging controller 30A. The control lines SELL each extend in the horizontal direction, and the signal SSEL is applied to the control line SELL by the scanning unit 10.

The dummy pixel P2 includes the transistors AMP and SEL. The transistor AMP has the gate coupled to the control line SIGVL, the drain supplied with the power supply voltage VDDH, and the source coupled to the drain of the transistor SEL. The transistor SEL has the gate coupled to the control line SELL, the drain coupled to the source of the transistor AMP, and the source coupled to the signal line SGL. This configuration causes the transistor AMP to output the signal SIG corresponding to the voltage of the signal SIGV to the signal line SGL via the transistor SEL by turning on the transistor SEL in the dummy pixel P2.

FIG. 25 illustrates a configuration example of the readout unit 20A. The readout unit 20A includes a plurality of AD conversion sections ADC2 (AD conversion section ADC2 [0], ADC2[1], ADC2[2], . . . ). The AD conversion section ADC2 is the AD conversion section ADC (FIG. 4) according to the above-described embodiment from which the transistors 28 and 29 are removed. This transistor 28 corresponds to the transistor AMP in the dummy pixel P2 (FIG. 24), and the transistor 29 corresponds to the transistor SEL in the dummy pixel P2.

The imaging controller 30A (FIG. 23) supplies control signals to the scanning unit 10, the readout unit 20A, and the signal processor 40, and controls the operations of these circuits, thereby controlling the operation of the imaging device 1A. The voltage sensor 33 of the imaging controller 30A supplies the generated signal SIGV to the control line SIGVL in the dummy pixel region RG2 of the pixel array 9A, thereby supplying the signal SIGV to the plurality of dummy pixels P2.

This configuration allows the imaging device 1A to perform the voltage detection operation by operating the dummy pixel P2 with the blanking period T20 as with the imaging device 1 according to the above-described embodiment.

FIG. 26 illustrates a configuration example of another imaging device 1B according to the present modification example. The imaging device 1B includes a pixel array 9B, the readout unit 20A, an imaging controller 30B, and a signal processor 40B.

The pixel array 9B is provided with the imaging pixel region RG1 and a dummy pixel region RG3. The plurality of dummy pixels P2 for one column is disposed in the dummy pixel region RG3. In this example, the dummy pixel region RG3 is disposed on the left of the imaging pixel region RG1 in the horizontal direction (lateral direction in FIG. 26).

The imaging controller 30B supplies control signals to the scanning unit 10, the readout unit 20A, and the signal processor 40B, and controls the operations of these circuits, thereby controlling the operation of the imaging device 1B. The voltage sensor 33 of the imaging controller 30B supplies the generated signal SIGV to the plurality of dummy pixels P2 in the dummy pixel region RG3 of the pixel array 9B.

The signal processor 40B includes a voltage determination unit 42B. The voltage determination unit 42B generates the voltage code VCODE on the basis of the digital code CODE included in the image signal DATAO. The digital code CODE is obtained on the basis of the signal SIGV.

This configuration allows the imaging device 1B to perform the voltage detection operation in a period other than the blanking period T20 while performing the imaging operation. Accordingly, for example, when there is a problem in supplying the power supply voltage VDD, it is possible to detect the problem in a more timely manner and issue a notification.

Modification Example 2

In the above-described embodiment, the voltage determination unit 42 of the signal processor 40 confirms whether or not the power supply voltages VDDH, VDDM, and VDDL, and the voltage Vbgr each fall within a predetermined range, but this is not limitative. Instead of this, for example, as in an imaging system 100C illustrated in FIG. 27, an external processing device different from the imaging device may confirm whether or not the power supply voltages VDDH, VDDM, and VDDL, and the voltage Vbgr each fall within a predetermined range. This imaging system 100C includes an imaging device 1C and a processing device 110C. Here, the imaging system 100C corresponds to a specific example of an "imaging device" in the present disclosure.

The imaging device 1C includes a signal processor 40C. The signal processor 40C includes a digital code output unit 49C. The digital code output unit 49C outputs the digital code CODE included in the image signal DATAO. The digital code CODE is obtained in the vertical blanking period on the basis of the signal SIGV.

The processing device 110C includes a voltage determination unit 111C and a storage unit 112C. The voltage determination unit 111C generates the respective voltage codes VCODE (voltage codes VCODEH, VCODEM, VCODEL, and VCODOR) indicating the voltage values of the power supply voltages VDDH, VDDM, and VDDL, and the voltage Vbgr on the basis of the digital codes CODE supplied from the digital code output unit 49C of the imaging device 1C, and confirms whether or not the respective voltage values of the power supply voltages VDDH, VDDM, and VDDL, and voltage Vbgr fall within predetermined voltage ranges, thereby generating the error flag signal XERR. The voltage determination unit 111C includes, for example, a component similar to that of the voltage determination unit 42 (FIG. 6) according to the above-described embodiment. The storage unit 112C stores various kinds of setting information used in the voltage determination unit 111C, and includes, for example, a nonvolatile memory and a register as with the storage unit 8 according to the above-described embodiment.

It is to be noted that the processing device 110C includes the voltage determination unit 111C in this example, but this is not limitative. Instead of this, for example, a portion (e.g., calculation section 43) of the circuits included in the voltage determination unit 42 (FIG. 6) may be provided to the signal processor of the imaging device, and the other circuits (e.g., determination section 44) may be provided to the processing device different from the imaging device.

Modification Example 3

In the above-described embodiment, the power supply voltages VDDH, VDDM, and VDDL, and the voltage Vbgr are each subjected to the voltage detection operation, but this is not limitative. For example, one or more of these may be omitted, or another voltage may be further detected. The following describes this example in which another voltage is further detected in detail.

FIG. 28 illustrates a configuration example of an imaging controller 30D in an imaging device 1D according to the present modification example. This imaging controller 30D includes a negative voltage generation unit 34D and a voltage sensor 33D. The negative voltage generation unit 34D generates a voltage VCP that is a negative voltage. The voltage sensor 33D includes a resistor circuit section RN, a switch SWN, and a selector ASEL2.

The resistor circuit section RN includes a plurality of (four in this example) resistance elements coupled in series. The resistor circuit section RN has one end supplied with the voltage VCP that is a negative voltage, and the other end grounded. The resistor circuit section RN then outputs the voltage obtained by multiplying the voltage VCP by "¾", and the voltage obtained by multiplying the voltage VCP by "½" in this example.

On the basis of a control signal SELSW generated by the imaging controller 30D, the switch SWH selects one of the voltage obtained by multiplying the voltage VCP by "¾" and the voltage obtained by multiplying the voltage VCP by "½", and outputs the selected voltage.

On the basis of a control signal SASEL2 generated by the imaging controller 30D, the selector ASEL2 selects one of the voltages supplied from the switches SWH, SWR, SWM, SWL, and SWN, and outputs the selected voltage.

FIG. 29 illustrates an example of the voltage detection operation in the imaging device 1D. FIGS. 30A and 30B each illustrate an operation example of the voltage sensor 33D in the voltage detection operation. In this example, the selector ASEL2 selects a voltage supplied from the switch SWN on the basis of the control signal SASEL2.

In the period from the timing t121 to the timing t131, the switch SWN of the voltage sensor 33D selects the voltage obtained by multiplying the voltage VCP by "½", on the basis of the control signal SELSW2 as illustrated in FIG. 30A. The amplifier AMPV amplifies the voltage supplied from the switch SWN via the selector ASEL2, and outputs the amplified voltage as the signal SIGV. This supplies the negative input terminal of the comparator 24 of the AD conversion section ADC with a voltage VCP12 corresponding to the voltage obtained by multiplying the voltage VCP by "½" ((B) of FIG. 20). In the period (conversion period TA) from the timing t123 to the timing t125, the AD conversion section ADC then performs AD conversion on the basis of this voltage VCP12.

In the period from the timing t131 to the timing t141, the switch SWN of the voltage sensor 33D selects the voltage obtained by multiplying the voltage VCP by "¾", on the basis of the control signal SELSW2 as illustrated in FIG. 30B. The amplifier AMPV amplifies the voltage supplied from the switch SWN via the selector ASEL2, and outputs the amplified voltage as the signal SIGV. This supplies the negative input terminal of the comparator 24 of the AD conversion section ADC with a voltage VCP34 corresponding to the voltage obtained by multiplying the voltage VCP by "¾" ((B) of FIG. 20). In the period (conversion period TB) from the timing t132 to the timing t134, the AD conversion section ADC then performs AD conversion on the basis of this voltage VCP34.

Modification Example 4

In the above-described embodiment, each of the plurality of imaging pixels P1 is provided with the two photodiodes PD1 and PD2, but this is not limitative. The following describes an imaging device 2 according to the present modification example in detail. FIG. 31 illustrates a configuration example of the imaging device 2. The imaging device 2 includes a pixel array 59, a scanning unit 50, the readout unit 20, an imaging controller 60, and a signal processor 70.

The pixel array 59 includes a plurality of imaging pixels P11 arranged in a matrix.

FIG. 32 illustrates a configuration example of the imaging pixel P11. The pixel array 59 includes the plurality of control lines TGLL, the plurality of control lines RSTL, the plurality of control lines SELL, and the plurality of signal lines SGL. The control lines TGLL each extend in the horizontal direction (lateral direction in FIG. 31), and a signal STG is applied to the control line TGLL by the scanning unit 50. The control lines RSTL each extend in the horizontal direction, and the signal SRST is applied to the control line RSTL by the scanning unit 50. The control lines SELL each extend in the horizontal direction, and the signal SSEL is applied to the control line SELL by the scanning unit 50. The signal lines SGL each extend in the vertical direction (longitudinal direction in FIG. 31), and are each coupled to the readout unit 20.

The imaging pixel P11 includes a photodiode PD, a transistor TG, the transistor RST, the floating diffusion FD, and the transistors AMP and SEL. Each of the transistors TG, RST, and SEL is an N-type MOS transistor in this example. The photodiode PD is a photoelectric conversion element that generates and accumulates electric charges in the amount corresponding to the amount of received light. The photodiode PD has the anode grounded, and the cathode coupled to the source of the transistor TG. The transistor TG has the gate coupled to the control line TGLL, the source coupled to the cathode of the photodiode PD, and the drain coupled to the floating diffusion FD. The transistor RST has the gate coupled to the control line RSTL, the drain supplied with the power supply voltage VDD, and the source coupled to the floating diffusion FD.

This configuration electrically couples the imaging pixel P11 to the signal line SGL by turning on the transistor SEL on the basis of the signal SSEL applied to the control line SELL in the imaging pixel P11. The imaging pixel P11 then outputs, as the signal SIG, the pixel voltage VP corresponding to the voltage of the floating diffusion FD to the signal line SGL. Specifically, the imaging pixel P11 sequentially outputs the two pixel voltages VP (VP11 and VP12) in two periods (P-phase period TP and D-phase period TD) within the so-called horizontal period H as described below.

FIG. 33 illustrates an example of the arrangement of the photodiodes PD. In FIG. 33, "R" represents a red color filter, "G" represents a green color filter, and "B" represents a blue color filter. The photodiodes PD are arranged in a matrix.

The scanning unit 50 (FIG. 31) sequentially drives the imaging pixels P11 in the pixel array 59 in units of the pixel lines L on the basis of an instruction from the imaging controller 60. The scanning unit 50 includes the address decoder 11, a logic section 52, and a driver section 53. The logic section 52 generates signals STG1, SRST1, and SSEL1 corresponding to the respective pixel lines L on the basis of an instruction from the address decoder 11. The driver section 53 respectively generates the signals STG, SRST, and SSEL corresponding to the respective pixel lines L on the basis of the signals STG1, SRST1, and SSEL1 corresponding to the respective pixel lines L.

The imaging controller 60 (FIG. 31) supplies control signals to the scanning unit 50, the readout unit 20, and the signal processor 70, and controls the operations of these circuits, thereby controlling the operation of the imaging device 2. The imaging controller 60 includes a reference signal generation unit 61. The reference signal generation unit 61 generates the reference signal REF. The reference signal REF has a so-called ramp waveform in which a voltage level gradually decreases with the lapse of time in the two periods (P-phase periods TP and D-phase period TD) for performing AD conversion.

The signal processor 70 includes an image processing unit 71. The image processing unit 71 performs predetermined image processing on an image indicated by the image signal DATA0.

The imaging device 2 performs the accumulation start driving D1 and the readout driving D2 as in the case of the imaging device 1 (FIG. 15).

FIG. 34 illustrates an operation example of the imaging device 2. (A) indicates the waveform of the horizontal synchronization signal XHS, (B) indicates the waveform of a signal SRST(0) in a control line RSTL(0) for the 0th pixel line L, (C) indicates the waveform of a signal STG(0) in a control line TGLL(0) for the 0th pixel line L, (D) indicates the waveform of a signal SSEL(0) in a control line SELL(0) for the 0th pixel line L, (E) indicates the waveform of a signal SRST(1) in a control line RSTL(1) for the first pixel line L, (F) indicates the waveform of a signal STG(1) in a control line TGLL(1) for the first pixel line L, (G) indicates the waveform of a signal SSEL(1) in a control line SELL(1) for the first pixel line L, (H) indicates the waveform of a signal SRST(2) in a control line RSTL(2) for the second pixel line L, (I) indicates the waveform of a signal STG(2) in a control line TGLL(2) for the second pixel line L, and (J) indicates the waveform of a signal SSEL(2) in a control line SELL(2) for the second pixel line L.

In the accumulation start driving D1, the scanning unit 50 sets on the transistors TG and RST, for example, in order from top in the vertical direction in units of the pixel lines L in a predetermined period in the horizontal period H, and then turns off these transistors. This causes the plurality of respective imaging pixels P11 to accumulate electric charges in the accumulation period T10 before readout driving D2 is performed.

Then, in the readout driving D2, the scanning unit 50 controls the operations of the transistors TG, RST, and SEL, for example, in order from top in the vertical direction in units of the pixel lines L. This causes the plurality of respective imaging pixels P11 to sequentially output the two pixel voltages VP (VP11 and VP12). The readout unit 20 performs AD conversion on the basis of each of these two pixel voltages VP11 and VP12, and outputs the digital code CODE.

FIG. 35 illustrates an operation example of the readout driving D2 in an imaging pixel P11A of interest. (A) indicates the waveform of the horizontal synchronization signal XHS, (B) indicates the waveform of the signal SRST, (C) indicates the waveform of the signal STG, (D) indicates the waveform of the signal SSEL, (E) indicates the waveform of the reference signal REF, (F) indicates the waveform of the signal SIG, (G) indicates the waveform of the signal CMP outputted from the comparator 24 of the AD conversion section ADC, (H) indicates the waveform of the clock signal CLK, and (I) indicates the count value CNT in the counter 25 of the AD conversion section ADC. Here, the reference signal REF in (E) of FIG. 35 indicates the waveform at the positive input terminal of the comparator 24, and the signal SIG in (F) of FIG. 35 indicates the waveform at the negative input terminal of the comparator 24.

In the imaging device 2, in a certain horizontal period (H), first, the scanning unit 50 performs a reset operation on the imaging pixel P11A, and the AD conversion section ADC performs AD conversion on the basis of the pixel voltage VP11 outputted from the imaging pixel P11A in the following P-phase period TP. The scanning unit 50 then performs an electric charge transfer operation on the imaging pixel P11A, and the AD conversion section ADC performs AD conversion on the basis of the pixel voltage VP12 outputted from the imaging pixel P11A in the D-phase period TD. The following describes this operation in detail.

First, when the horizontal period H starts at a timing t91, the scanning unit 50 changes the voltage of the signal SSEL from the low level to the high level at a timing t92 ((D) of FIG. 35). This causes the transistor SEL to be turned on in the imaging pixel P11A, and the imaging pixel P11A is electrically coupled to the signal line SGL.

Next, at a timing t93, the scanning unit 50 changes the voltage of the signal SRST from the low level to the high level ((B) of FIG. 35). This causes the transistor RST to be turned on in the imaging pixel P11A, and the voltage of the floating diffusion FD is set at the power supply voltage VDD (reset operation).

Next, at a timing t94, the scanning unit 50 changes the voltage of the signal SRST from the high level to the low level ((B) of FIG. 35). This causes the transistor RST to be turned off in the imaging pixel P11A. In the period from the timing t94 to a timing t95, the comparator 24 then performs a zero adjustment that causes the positive input terminal and the negative input terminal to be electrically coupled.

Next, at the timing t95, the comparator 24 finishes the zero adjustment, and electrically uncouples the positive input terminal and the negative input terminal. At this timing t95, the reference signal generation unit 61 then changes the voltage of the reference signal REF to the voltage V1 ((E) of FIG. 35).

This causes the transistor SEL to be turned on, and causes the transistors TG and RST to be each turned off in the imaging pixel P11A. The floating diffusion FD retains the electric charges at the time of resetting the floating diffusion FD in the period from the timing t93 to the timing t94. The imaging pixel P11A outputs the pixel voltage VP (pixel voltage VP11) corresponding to the voltage of the floating diffusion FD at this time.

Next, in the period (P-phase period TP) from a timing t96 to a timing t98, the readout unit 20 performs AD conversion on the basis of this pixel voltage VP11. Specifically, at the timing t96, the imaging controller 60 first starts to generate the clock signal CLK ((H) of FIG. 35). Concurrently with this, the reference signal generation unit 61 starts to decrease the voltage of the reference signal REF from the voltage V1 by a predetermined degree of change ((E) of FIG. 35). Accordingly, the counter 25 of the AD conversion section ADC starts a counting operation to sequentially change the count value CNT ((I) of FIG. 35).

Then, at a timing t97, the voltage of the reference signal REF falls below the pixel voltage VP11 ((E) and (F) of FIG. 35). Accordingly, the comparator 24 of the AD conversion section ADC changes the voltage of the signal CMP from the high level to the low level ((G) of FIG. 35). As a result, the counter 25 stops the counting operation ((I) of FIG. 35).

Next, at the timing t98, the imaging controller 60 stops generating the clock signal CLK at the end of the P-phase period TP ((H) of FIG. 35). Concurrently with this, the reference signal generation unit 61 stops changing the voltage of the reference signal REF, and changes the voltage of the reference signal REF to the voltage V1 at the following timing t99 ((E) of FIG. 35). Accordingly, the voltage of the reference signal REF exceeds the pixel voltage VP11 ((E) and (F) of FIG. 35), and the comparator 24 of the AD conversion section ADC thus changes the voltage of the signal CMP from the low level to the high level ((G) of FIG. 35).

Next, at a timing t100, the counter 25 of the AD conversion section ADC inverses the polarity of the count value CNT on the basis of the control signal CC ((I) of FIG. 35).

Next, at a timing t101, the scanning unit 50 changes the voltage of the signal STG from the low level to the high level ((C) of FIG. 35). This causes the transistor TG to be turned on in the imaging pixel P11A. As a result, the electric charges generated in the photodiode PD are transferred to the floating diffusion FD (electric charge transfer operation). Accordingly, the voltage of the signal SIG is decreased ((F) of FIG. 35).

At a timing t102, the scanning unit 50 then changes the voltage of the signal STG from the high level to the low level ((C) of FIG. 35). This causes the transistor TG to be turned off in the imaging pixel P11A.

This causes the transistor SEL to be turned on, and causes the transistors TG and RST to be each turned off in the imaging pixel P11A. The floating diffusion FD retains the electric charges transferred from the photodiode PD in the period from the timing t101 to the timing t102. The imaging pixel P11A outputs the pixel voltage VP (pixel voltage VP12) corresponding to the voltage of the floating diffusion FD at this time.

Next, in the period (D-phase period TD) from a timing t103 to a timing t105, the readout unit 20 performs AD conversion on the basis of the pixel voltage VP12. Specifically, at the timing t103, the imaging controller 60 first starts to generate the clock signal CLK ((H) of FIG. 35). Concurrently with this, the reference signal generation unit 61 starts to decrease the voltage of the reference signal REF from the voltage V1 by a predetermined degree of change ((E) of FIG. 35). Accordingly, the counter 25 of the AD conversion section ADC starts a counting operation to sequentially change the count value CNT ((I) of FIG. 35).

Then, at a timing t104, the voltage of the reference signal REF falls below the pixel voltage VP12 ((E) and (F) of FIG. 35). Accordingly, the comparator 24 of the AD conversion section ADC changes the voltage of the signal CMP from the high level to the low level ((G) of FIG. 35). As a result, the counter 25 stops the counting operation ((I) of FIG. 35). In this way, the AD conversion section ADC obtains the count value CNT corresponding to the difference between the pixel voltages VP11 and VP12. The latch 26 of the AD conversion section ADC then outputs this count value CNT as the digital code CODE.

Next, at the timing t105, the imaging controller 60 stops generating the clock signal CLK at the end of the D-phase period TD ((H) of FIG. 35). Concurrently with this, the reference signal generation unit 61 stops changing the voltage of the reference signal REF, and changes the voltage of the reference signal REF to the voltage V2 at the following timing t106 ((E) of FIG. 35). Accordingly, the voltage of the reference signal REF exceeds the pixel voltage VP12 ((E) and (F) of FIG. 35), and the comparator 24 of the AD conversion section ADC thus changes the voltage of the signal CMP from the low level to the high level ((G) of FIG. 35).

Next, at a timing t107, the scanning unit 50 changes the voltage of the signal SSEL from the high level to the low level ((D) of FIG. 35). This causes the transistor SEL to be turned off in the imaging pixel P11A, and the imaging pixel P11A is electrically uncoupled from the signal line SGL.

Then, at a timing t108, the counter 25 of the AD conversion section ADC sets the count value CNT at "0" on the basis of the control signal CC ((I) of FIG. 35).

In this way, the imaging device 2 performs a counting operation on the basis of the pixel voltage VP11 in the P-phase period TP, inverses the polarity of the count value CTN, and then performs a counting operation on the basis of the pixel voltage VP12 in the D-phase period TD. This allows the imaging device 2 to acquire the digital code CODE corresponding to the voltage difference between the pixel voltages VP11 and VP12. In the imaging device 2, such correlated double sampling is performed, and it is thus possible to remove the noise component included in the pixel voltage VP12. As a result, it is possible to increase the image quality of a captured image.

The imaging device 2 performs the voltage detection operation by using the blanking period T20 as with the imaging device 1 according to the above-described embodiment. Specifically, the AD conversion section ADC of the readout unit 20 performs AD conversion in the detection period M of the same length as that of the horizontal period H (FIG. 35) in the blanking period T20 on the basis of the signal SIGV. In the detection period M, the reference signal generation unit 61 and the readout unit 20 each perform an operation similar to that in the horizontal period H (FIG. 35). In this detection period M, the imaging controller 60 sets the control signal SSELV (FIG. 4) at the high level. This causes the transistor 29 to be turned on in each of the plurality of AD conversion sections ADC in the readout unit 20, and the signal corresponding to the signal SIGV generated by the voltage sensor 33 is supplied to the negative input terminal of the comparator 24 via the transistor 29 and the capacity element 22. The AD conversion section ADC then performs AD conversion in the P-phase period TP on the basis of the voltage VDDH34 of the signal SIGV as in the case (FIG. 20) of the above-described embodiment, and performs AD conversion in the D-phase period TD on the basis of the voltage VDDH12 of the signal SIGV, thereby generating the digital code CODE.

The calculation section 43 of the voltage determination unit 42 then uses this digital code CODE as the digital value VALV to perform a calculation process on the basis of this digital value VALV, thereby generating the voltage code VCODE1 having a predetermined code system. In this way, the calculation section 43 generates the plurality of respective voltage codes VCODE1 on the basis of the plurality of digital values VALV obtained from the plurality of AD conversion sections ADC. The calculation section 43 then obtains the average value of the values indicated by the plurality of these voltage codes VCODE1 to generate the voltage code VCODE.

Modification Example 5

In the above-described embodiment, for example, the plurality of imaging pixels P1 coupled to the same control lines TGLL, FDGL, RSTL, FCGL, TGSL, and SELL is provided side by side in the pixel array 9 in the horizontal direction, but this is not limitative. Instead of this, for example, as in an imaging device 1E illustrated in FIG. 36, the plurality of (four in this example) imaging pixels P1 coupled to the same control lines TGLL, FDGL, RSTL, FCGL, TGSL, and SELL may be provided side by side in the vertical direction. This imaging device 1E includes a pixel array 9E, a scanning unit 10E, readout units 20E1 and 20E2, an imaging controller 30E, and a signal processor 40E. The even-numbered (0th, second, fourth, . . . ) signal lines SGL in the pixel array 9E are coupled to the readout unit 20E1, and the odd-numbered (first, third, fifth, . . . ) signal lines SGL in the pixel array 9E are coupled to the readout unit 20E2. The control lines TGLL, FDGL, RSTL, FCGL, TGSL, and SELL are coupled to the scanning unit 10E. In this example, the four imaging pixels P1 coupled to the same control lines TGLL, FDGL, RSTL, FCGL, TGSL, and SELL are provided side by side in the vertical direction (longitudinal direction in FIG. 36). The scanning unit 10E includes a logic section 12E and a driver section 13E. The readout unit 20E1 performs AD conversion on the basis of the signal SIG supplied from the pixel array 9E via the even-numbered signal line SGL, thereby generating an image signal DATAE1. The readout unit 20E2 performs AD conversion on the basis of the signal SIG supplied from the pixel array 9E via the odd-numbered signal line SGL, thereby generating an image signal DATAE2. The signal processor 40E performs signal processing on images indicated by the image signals DATAE1 and DATAE2.

Modification Example 6

In the above-described embodiment, the respective AD conversion sections ADC are coupled to the plurality of imaging pixels P1 for one column in the pixel array 9, but this is not limitative. Instead of this, for example, as in an imaging device 1F illustrated in FIG. 37, the respective AD conversion sections ADC may be coupled to the plurality of imaging pixels P1 belonging to a predetermined area. This imaging device 1F is formed on two semiconductor substrates 401 and 402. The pixel array 9 is formed on the semiconductor substrate 401. This pixel array 9 is divided into a plurality of (21 in this example) areas AR, and each of the areas AR includes the plurality of (160 in this example) imaging pixels P1. The readout unit 20 is formed on the semiconductor substrate 402. Specifically, in the semiconductor substrate 402, the plurality of respective regions corresponding to the plurality of areas AR on the semiconductor substrate 401 includes the AD conversion sections ADC coupled to the plurality of imaging pixels P1 belonging to those areas AR. The semiconductor substrate 401 and the semiconductor substrate 402 are stacked, and electrically coupled to each other by a coupling unit 403, for example, by using Cu—Cu coupling. It is to be noted that the pixel array 9 is divided into the 21 areas AR in this example, but this is not limitative. Alternatively, for example, the pixel array 9 may be divided into the 20 or less or 22 or more areas AR. In addition, in this example, each area AR is provided with the 160 imaging pixels P1, but this is not limitative. Instead of this, for example, the 159 or less or 161 or more imaging pixels P1 may be provided.

Other Modification Examples

In addition, two or more of these modification examples may be combined.

2. Usage Example of Imaging Device

FIG. 38 illustrates a usage example of the imaging device 1 or the like according to the above-described embodiment. For example, the above-described imaging device 1 or the like is usable in a variety of cases of sensing light such as visible light, infrared light, ultraviolet light, and X-ray as follows.

Devices that shoot images used for viewing such as digital cameras and portable appliances each having a camera function Devices for traffic use such as onboard sensors that shoot images of the front, back, surroundings, inside, and so on of an automobile for safe driving such as automatic stop and for recognition of a driver's state, monitoring cameras that monitor traveling vehicles and roads, and distance measuring sensors that measure vehicle-to-vehicle distance Devices for use in home electrical appliances such as televisions, refrigerators, and air-conditioners to shoot images of a user's gesture and bring the appliances into operation in accordance with the gesture Devices for medical care and health care use such as endoscopes and devices that shoot images of blood vessels by receiving infrared light Devices for security use such as monitoring cameras for crime prevention and cameras for individual authentication Devices for beauty use such as skin measuring devices that shoot images of skin and microscopes that shoot images of scalp Devices for sports use such as action cameras and wearable cameras for sports applications, etc.

Devices for agricultural use such as cameras for monitoring fields and crops

3. Example of Application to Mobile Body

The technology (the present technology) according to the present disclosure is applicable to various products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 39 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 39, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 39, an audio speaker 12061, a display section 12062, and an instrument panel 12063 are illustrated as the output device. The display section 12062 may, for example, include at least one of an on-board display and a head-up display.

FIG. 40 is a diagram depicting an example of the installation position of the imaging section 12031.

In FIG. 40, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 40 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the vehicle control system to which the technology according to the present disclosure may be applied. The technology according to the present disclosure may be applied to the imaging section 12031 among the components described above. This allows the vehicle control system 12000 to detect whether or not the power supply voltage VDD supplied to the imaging section 12031 is normal, and whether or not the voltage Vbgr generated by the imaging section 12031 is normal. Then, in a case where one or more of these voltages are abnormal, for example, the microcomputer 12051 is notified of a detection result thereof, thereby allowing the outside-vehicle information detecting unit 12030 in the vehicle control system 12000 to grasp that the imaging section 12031 has a problem. This outside-vehicle information detecting unit 12030 here corresponds to a specific example of a "processing device" in the present disclosure. For example, this allows the vehicle control system 12000 to perform an appropriate process such as calling a driver's attention, making it possible to increase reliability. In addition, in the vehicle control system 12000, it is possible to restrict a function of controlling a vehicle on the basis of a detection result. Specific examples of the function of controlling a vehicle include a function of collision avoidance or shock mitigation for the vehicle, a function of following driving based on vehicle-to-vehicle distance, a function of vehicle speed maintaining driving, a function of a warning of collision of the vehicle, a function of a warning of deviation of the vehicle from a lane, and the like. In a case where it is determined that the voltage of the imaging section 12031 is abnormal, it is possible to restrict or forbid the function of controlling the vehicle. Specifically, the outside-vehicle information detecting unit 12030 and the vehicle control system 12000 are able to control the brake, the engine output, and the transmission. This allows the vehicle control system 12000 to prevent an accident resulting from erroneous detection based on the abnormal voltage of the imaging section 12031.

In addition, for example, in a case where the vehicle control system 12000 includes the two redundant imaging sections 12031 (imaging sections 12031A and 12031B), the imaging section 12031B of the imaging sections 12031 may be operated in a case where it is determined that the voltage of the imaging section 12031A of the imaging sections 12031 is abnormal, and the imaging section 12031A is suspected of a problem. In addition, for example, in a case where the vehicle control system 12000 includes a distance measuring section (e.g., LIDAR device (Light Detection and Ranging) or TOF (Time Of Flight) image sensor) that detects the distance to a target in addition to the imaging section 12031, the distance measuring section may be operated in a case where it is determined the voltage of the imaging section 12031 is abnormal. In this case, it is possible to detect at least the distance to the target. This makes it possible to prevent an accident caused by erroneous detection based on the abnormal voltage of the imaging section 12031.

Although the above has described the present technology with reference to the embodiment, modification examples, and specific application examples thereof, the present technology is not limited to these embodiment or the like. The present technology may be modified in a variety of ways.

For example, the readout unit 20 outputs the digital codes CODE2 and CODE3, and the image processing unit 41 subtracts the digital code CODE2 from the digital code CODE3 (CODE3−CODE2) in the imaging device 1 as illustrated in FIG. 19, thereby calculating the pixel value VAL1. This is not, however, limitative. Instead of this, the readout unit 20 may output the digital code CODE corresponding to the difference between the digital codes CODE2 and CODE3 by inverting the polarity of the count value CNT after the conversion period T2 as in the case (FIG. 35) of the imaging device 2 according to a modification example 4. The same applies to the digital codes CODE5 and CODE6. The same applies to the digital codes CODE7 and CODER. The same applies to the digital codes CODEA and CODEB.

In addition, for example, the readout unit 20 outputs the digital codes CODE1 and CODE4, and the image processing unit 41 subtracts the digital code CODE1 from the digital code CODE4 (CODE4−CODE1) in the imaging device 1 as illustrated in FIG. 19, thereby calculating the pixel value VAL2. This is not, however, limitative. Instead of this, after the conversion period T1, the AD conversion section ADC of the readout unit 20 may temporarily store the count value CNT at that time therein. Before the conversion period T4, the AD conversion section ADC of the readout unit 20 may set the count value CNT in the counter 25 and invert the polarity of the count value CNT. Even in this case, the image processing unit 41 is able to obtain the digital code CODE corresponding to the difference between the digital codes CODE1 and CODE4 as in the case (FIG. 35) of the imaging device 2 according to the modification example 4.

In addition, for example, the imaging device 1 is not limited to the configuration illustrated in FIG. 1 or the like, but may be modified as appropriate. Similarly, for example, the imaging device 2 is not limited to the configuration illustrated in FIG. 31 or the like, but may be modified as appropriate.

It is to be noted that the effects described in the present specification are merely illustrative, but not limited. In addition, other effects may be included. It is to be noted that the present technology may be configured as below.

(1)

An imaging device including:

an imaging unit configured to perform an imaging operation;

a data generator configured to generate first power supply voltage data corresponding to a first power supply voltage, the first power supply voltage being supplied to the imaging unit; and a flag generation section configured to generate a flag signal for the first power supply voltage by comparing the first power supply voltage data and first reference data.

(2)

The imaging device according to (1), in which the data generator includes a conversion unit configured to perform AD conversion, and the data generator is configured to generate the first power supply voltage data by the conversion unit performing the AD conversion on the basis of the first power supply voltage.

(3)

The imaging device according to (2), further including a voltage detection unit configured to generate a first detection voltage and a second detection voltage, the first detection voltage and the second detection voltage corresponding to the first power supply voltage, in which the data generator is configured to generate the first power supply voltage data on the basis of a difference between a result obtained by the conversion unit performing the AD conversion in a first period on the basis of the first detection voltage and a result obtained by the conversion unit performing the AD conversion in a second period on the basis of the second detection voltage.

(4)

The imaging device according to (2) or (3), in which the data generator further includes a calculation section that generates the first power supply voltage data by converting a result to data having a predetermined code system, the result being obtained by the conversion unit performing the AD conversion on the basis of the first power supply voltage.

(5)

The imaging device according to any of (2) to (4), in which the conversion unit includes a plurality of conversion circuits each configured to perform the AD conversion on the basis of the first power supply voltage, and the data generator is configured to generate the first power supply voltage data on the basis of results obtained by the plurality of conversion circuits performing the AD conversion.

(6)

The imaging device according to (5), in which the data generator is configured to generate the first power supply voltage data on the basis of an average value of the results obtained by the plurality of conversion circuits performing the AD conversion.

(7)

The imaging device according to any of (1) to (6), in which the imaging unit includes an imaging pixel configured to output a pixel voltage, the data generator includes a conversion unit configured to perform AD conversion, and the data generator is configured to generate the first power supply voltage data by the conversion unit performing the AD conversion on the basis of the first power supply voltage, and is configured to generate pixel voltage data by the conversion unit performing the AD conversion on the basis of the pixel voltage.

(8)

The imaging device according to (7), further including a voltage detection unit configured to generate a detection voltage corresponding to the first power supply voltage, and supply the generated detection voltage to the conversion unit, in which the imaging unit further includes a signal line configured to transmit the pixel voltage to the conversion unit.

(9)

The imaging device according to (7), further including a voltage detection unit that generates a detection voltage corresponding to the first power supply voltage, in which the imaging unit further includes a signal line configured to transmit the pixel voltage and the detection voltage to the conversion unit.

(10)

The imaging device according to any of (1) to (9), in which the conversion unit performs the AD conversion in a vertical blanking period on the basis of the first power supply voltage.

(11)

The imaging device according to any of (1) to (10), in which the flag generation section is configured to generate the flag signal by further comparing the first power supply voltage data and second reference data.

(12)

The imaging device according to any of (1) to (11), in which the data generator and the flag generation section each include a circuit that operates with a second power supply voltage.

(13)

The imaging device according to any of (1) to (12), further including a voltage generation unit configured to generate a predetermined voltage, in which the data generator is configured to generate voltage data corresponding to the predetermined voltage, and the flag generation section is configured to generate the flag signal by comparing the voltage data and third reference data.

(14)

The imaging device according to (13), in which the data generator is configured to generate the first power supply voltage data in a third period, and generate the voltage data in a fourth period.

(15)

The imaging device according to any of (1) to (14), in which the data generator is configured to generate second power supply voltage data corresponding to a second power supply voltage, and the flag generation section is configured to generate the flag signal by comparing the second power supply voltage data and fourth reference data.

(16)

An imaging system including:

an imaging device that is mounted on a vehicle, and is configured to generate an image by imaging a region around the vehicle; and a processing device that is mounted on the vehicle, and is configured to execute a process regarding a function of controlling the vehicle on the basis of the image, in which the imaging device includes an imaging unit configured to perform an imaging operation, a data generator configured to generate first power supply voltage data corresponding to a first power supply voltage, the first power supply voltage being supplied to the imaging unit, and a flag generation section configured to generate a flag signal for the first power supply voltage by comparing the first power supply voltage data and first reference data, and the processing device is configured to either notify a driver or restrict the function of controlling the vehicle, or both notify the driver and restrict the function of controlling the vehicle on the basis of the flag signal.

(17)

An imaging method including:

performing an imaging operation;

generating first power supply voltage data corresponding to a first power supply voltage, the first power supply voltage being supplied when the imaging operation is performed; and generating a flag signal for the first power supply voltage by comparing the first power supply voltage data and first reference data.

This application claims the priority on the basis of Japanese Patent Application No. 2018-029771 filed on Feb. 22, 2018 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:
a first substrate including a pixel array; and
a second substrate including:
  a first terminal region including:
    a first pad electrode configured to receive a first voltage, and
    a second pad electrode configured to receive a second voltage different from the first voltage, wherein the first voltage is a ground voltage;
  a voltage sensor region including a voltage sensor coupled to the first pad electrode and the second pad electrode;
  a readout circuit region including an AD converter coupled to the voltage sensor; and
  a second terminal region including a third terminal configured to output an error flag based on an output of the AD converter, wherein
    the voltage sensor region is between the first terminal region and the readout circuit region in a plan view, and
    the second terminal region is on a side opposite to the first terminal region with respect to the readout circuit region in the plan view.

2. The imaging device according to claim 1, wherein the voltage sensor includes a resistor circuit section and a switch.

3. The imaging device according to claim 1, wherein the first pad electrode is adjacent to the second pad electrode.

4. The imaging device according to claim 1, wherein the second substrate includes a reference voltage generation unit adjacent to the voltage sensor region.

5. The imaging device according to claim 1, wherein the second substrate includes a voltage determination unit adjacent to the second terminal region.

6. The imaging device according to claim 1, wherein
the voltage sensor is configured to generate a detection voltage,
the AD converter is configured to generate detection voltage data based on the detection voltage,
the error flag is changeable between a ground level signal and a first signal, and
the error flag is set to the ground level signal based on a determination that the detection voltage data is outside a specific range.

7. The imaging device according to claim 1, wherein the AD converter is configured to generate pixel voltage data based on a pixel voltage output from the pixel array.

8. An imaging device, comprising:
a pixel array including a plurality of pixels, wherein each pixel of the plurality of pixels is configured to generate a pixel voltage;
a voltage sensor configured to generate a first detection voltage;
an AD converter coupled to the voltage sensor, wherein the AD converter is configured to generate first detection voltage data based on the first detection voltage; and
a flag generator configured to generate a first error flag based on the first detection voltage data, wherein
the first error flag is changeable between a ground level signal and a first signal,
the first error flag is set to the ground level signal based on a determination that the first detection voltage data is outside a specific range.

9. The imaging device according to claim 8, wherein
the voltage sensor is further configured to generate the first detection voltage based on a first power supply voltage and a ground voltage, and
the first power supply voltage is supplied to the plurality of pixels.

10. The imaging device according to claim 9, further comprising a first substrate and a second substrate, wherein
the pixel array is on the first substrate,
the AD converter is on the second substrate, and
the second substrate includes:
a first pad electrode configured to receive the first power supply voltage, and
a second pad electrode configured to receive the ground voltage.

11. The imaging device according to claim 10, wherein the first pad electrode is adjacent to the second pad electrode.

12. The imaging device according to claim 8, wherein the voltage sensor comprises a resistor circuit and a switch.

13. The imaging device according to claim 8, wherein
the voltage sensor is further configured to generate a second detection voltage,
the AD converter is further configured to generate second detection voltage data based on the second detection voltage, and
the flag generator is further configured to generate a second error flag based on at least one of
a comparison between the first detection voltage data and first reference voltage data, or
a comparison between the second detection voltage data and second reference voltage data.

14. The imaging device according to claim 8, wherein
the voltage sensor is further configured to generate the first detection voltage based on a first power supply voltage supplied to the plurality of pixels,
each pixel of the plurality of pixels comprises:
a photoelectric conversion element;
a transfer transistor coupled to the photoelectric conversion element; and
an amplifier transistor, wherein
a gate of the amplifier transistor is coupled to the transfer transistor, and
the first power supply voltage is supplied to a terminal of the amplifier transistor, and
the AD converter is further configured to generate pixel voltage data based on the pixel voltage.

* * * * *